United States Patent
Ando

(10) Patent No.: US 10,096,720 B2
(45) Date of Patent: Oct. 9, 2018

(54) TRANSISTOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventor: Yoshinori Ando, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 16 days.

(21) Appl. No.: 15/464,517

(22) Filed: Mar. 21, 2017

(65) Prior Publication Data
US 2017/0278973 A1    Sep. 28, 2017

(30) Foreign Application Priority Data

Mar. 25, 2016    (JP) .................................. 2016-061869

(51) Int. Cl.
*H01L 27/12*    (2006.01)
*H01L 29/786*   (2006.01)
*H01L 29/66*    (2006.01)

(52) U.S. Cl.
CPC ........ *H01L 29/7869* (2013.01); *H01L 27/124* (2013.01); *H01L 27/127* (2013.01); *H01L 27/1222* (2013.01); *H01L 27/1225* (2013.01); *H01L 27/1248* (2013.01); *H01L 29/66969* (2013.01); *H01L 29/78696* (2013.01)

(58) Field of Classification Search
CPC .................................................. H01L 21/8232
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.

(Continued)

*Primary Examiner* — Cheung Lee
(74) *Attorney, Agent, or Firm* — Fish & Richardson P.C.

(57) ABSTRACT

To provide a semiconductor device with high design flexibility. A first transistor and a second transistor having different electrical characteristics from those of the first transistor are provided over the same layer without significantly increasing the number of manufacturing steps. A semiconductor layer where a channel of the first transistor is formed and a semiconductor layer where a channel of the second transistor is formed are formed using semiconductor materials having different electron affinities. When an oxide semiconductor is used for the semiconductor layer, an insulating layer containing excess oxygen is used as an insulating layer below the semiconductor layer. By increasing the thickness of the insulating layer, a large amount of oxygen can be supplied to the semiconductor layer.

19 Claims, 63 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,384,080 B2 | 2/2013 | Taniguchi et al. |
| 8,466,463 B2 | 6/2013 | Akimoto et al. |
| 8,547,771 B2 | 10/2013 | Koyama |
| 8,629,069 B2 | 1/2014 | Akimoto et al. |
| 8,669,550 B2 | 3/2014 | Akimoto et al. |
| 8,692,252 B2 | 4/2014 | Takata et al. |
| 8,790,959 B2 | 7/2014 | Akimoto et al. |
| 8,796,069 B2 | 8/2014 | Akimoto et al. |
| 8,995,174 B2 | 3/2015 | Koyama |
| 9,076,825 B2 | 7/2015 | Yamamoto et al. |
| 9,099,562 B2 | 8/2015 | Akimoto et al. |
| 9,437,744 B2 | 9/2016 | Sasagawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2011/0140109 A1* | 6/2011 | Yamazaki .......... H01L 27/1225 257/57 |
| 2015/0340513 A1 | 11/2015 | Akimoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-124360 A | 6/2011 |
| JP | 2011-138934 A | 7/2011 |
| JP | 2012-257187 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electronc Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and YbFe3O7 Types of Structures for Compounds in the In2O3 and Sc2O3—A2O3—Bo Systems [A; Fe, Ga, or Al; B: Mg Fe, Ni, Cu,or Zn] at Temperatures over 1000° C.", Journal of Solid State Chemistry, 1985, vol. 60, pp. 382-384.

Kimizuka.N et al., "Synthesis and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with instrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvement in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 3, 2008, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

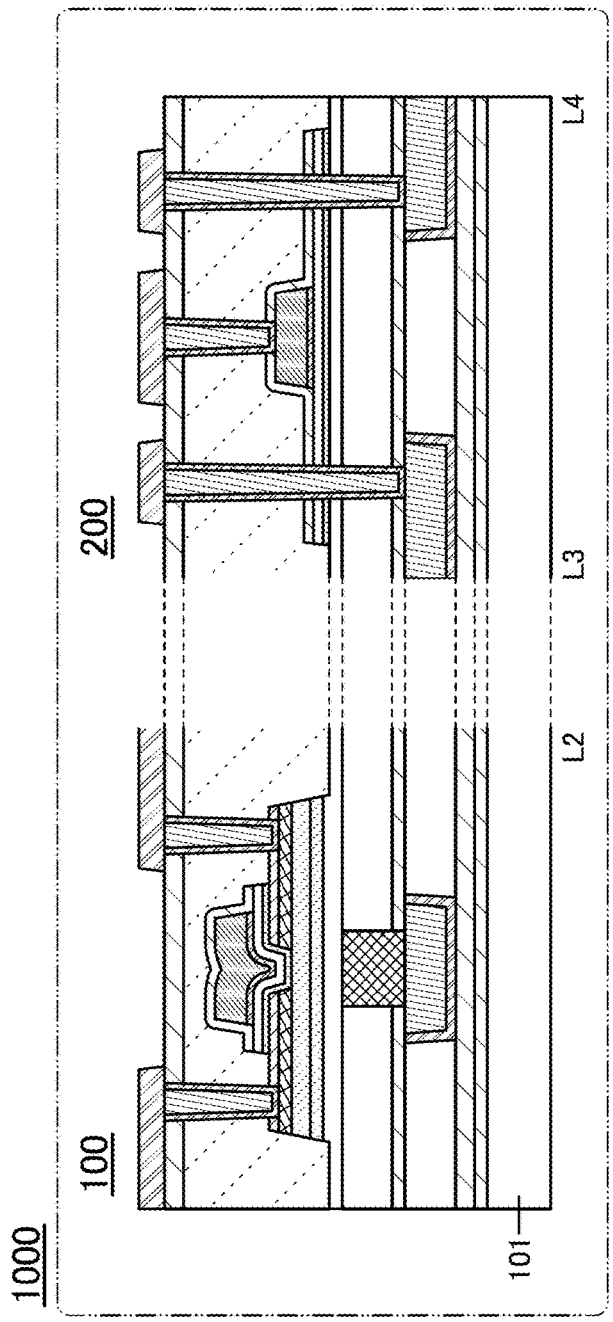
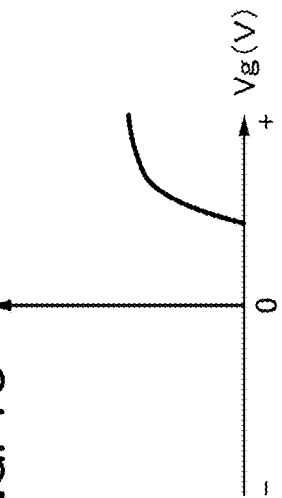
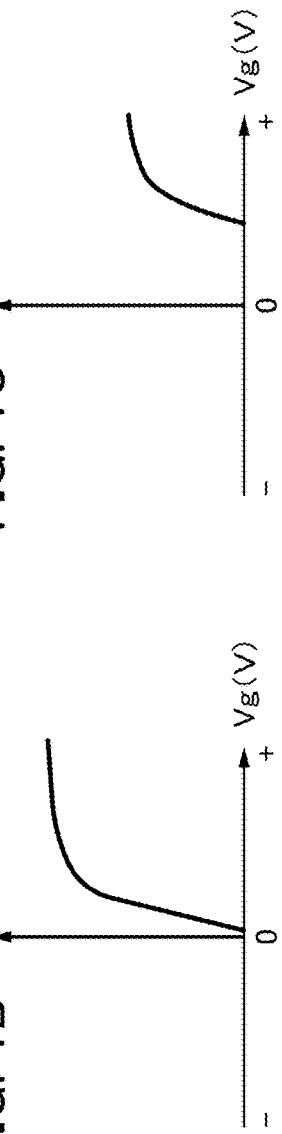

FIG. 21
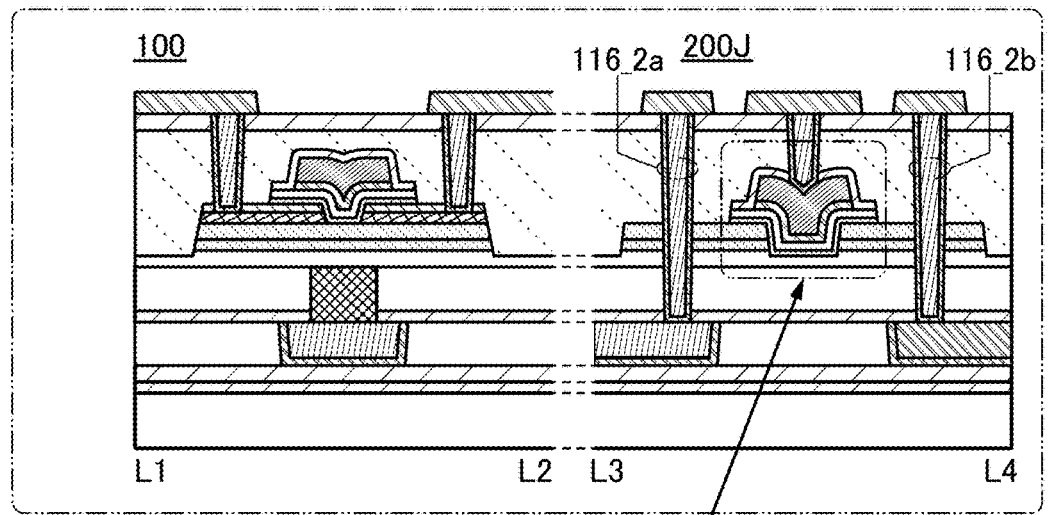
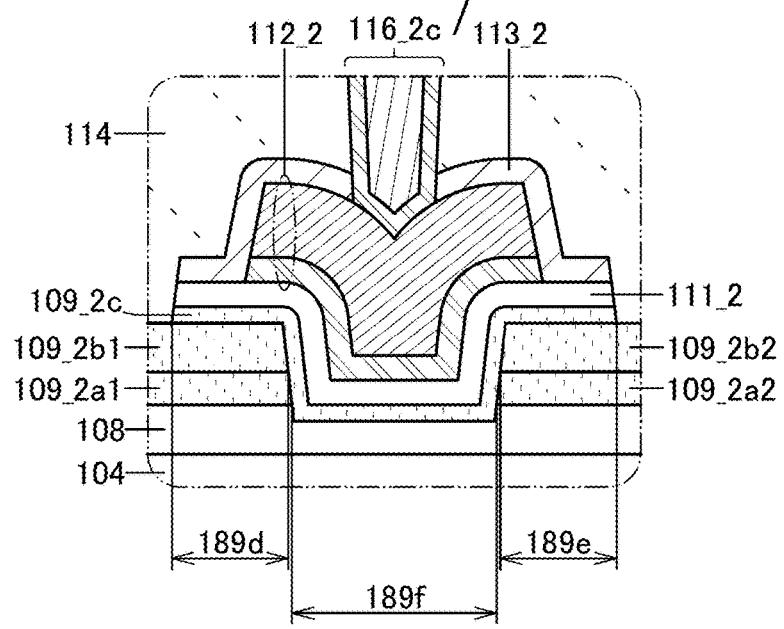

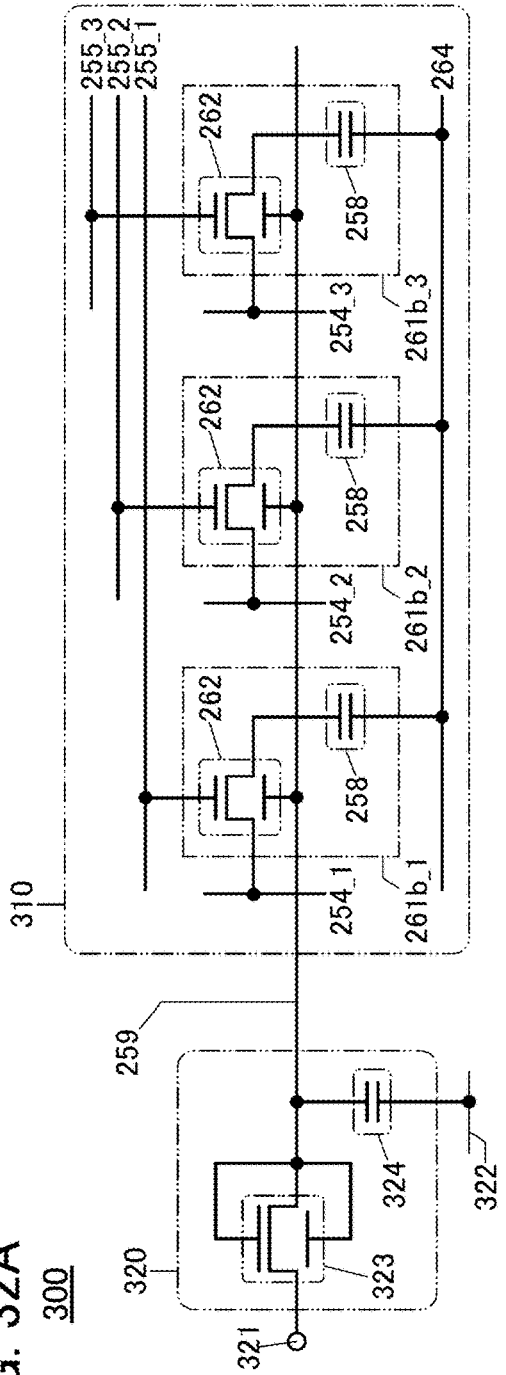
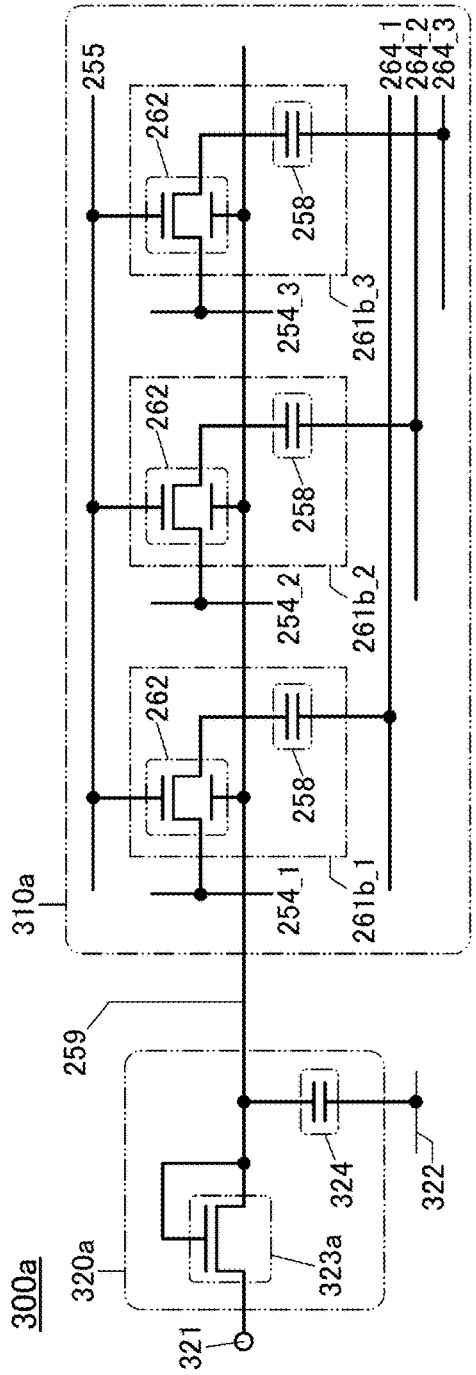
FIG. 32A
FIG. 32B

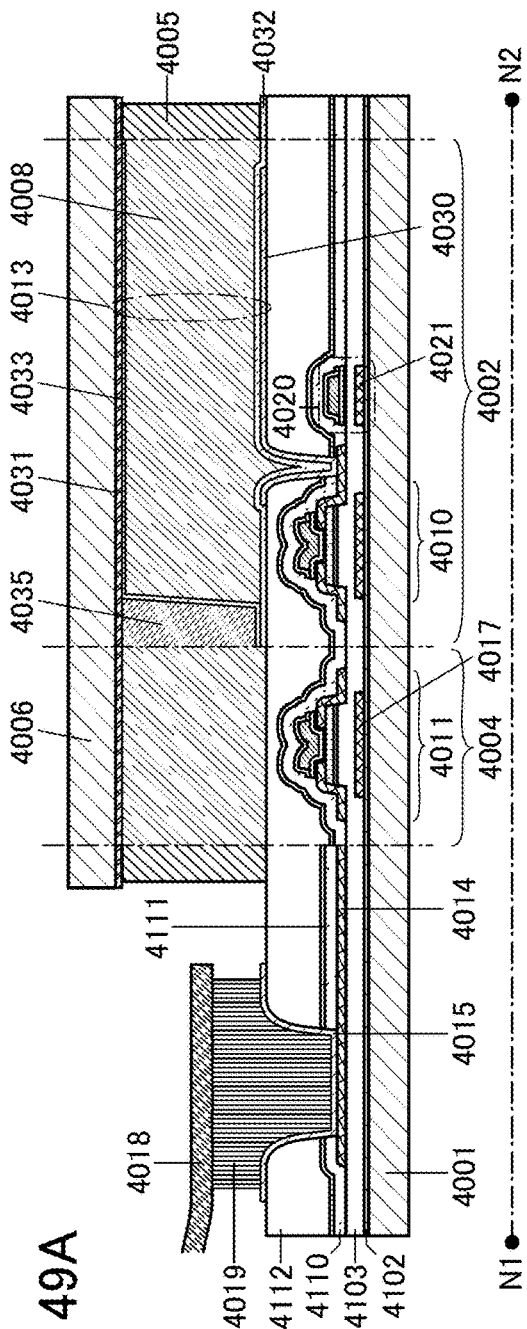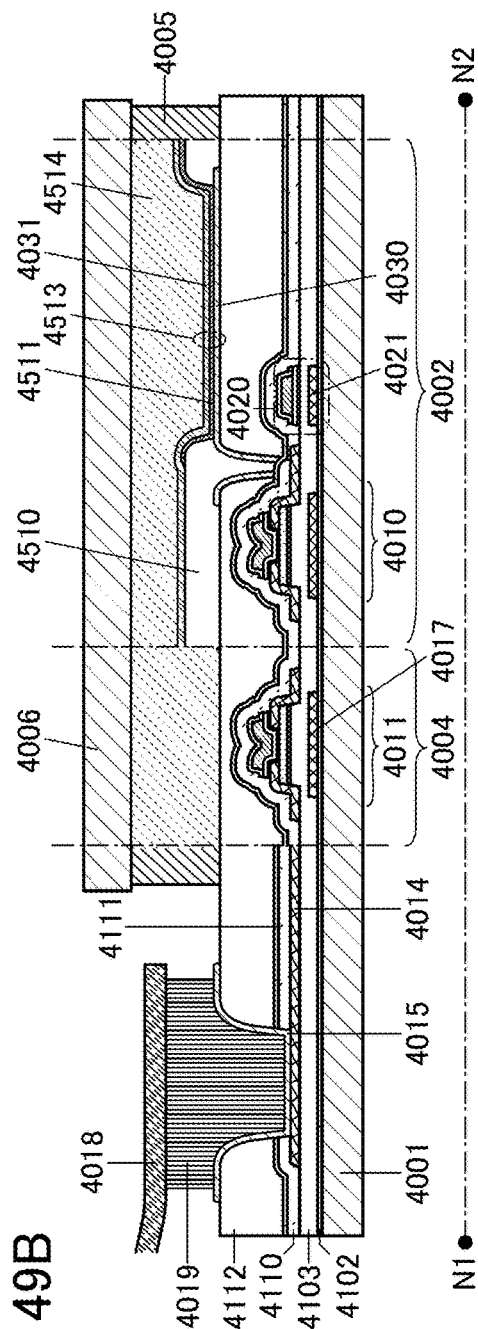
FIG. 49A
FIG. 49B

FIG. 58A
FIG. 58B
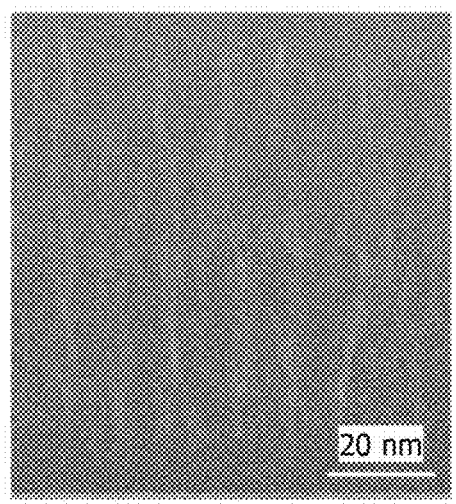
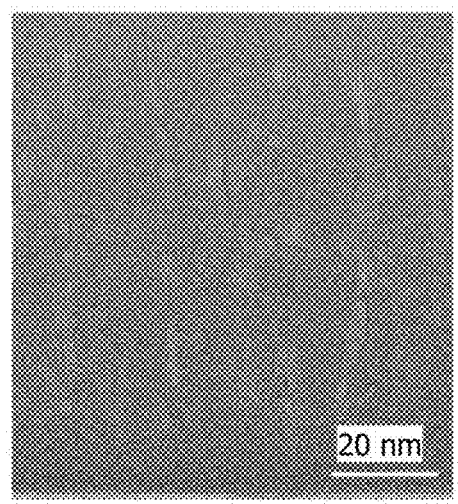

TRANSISTOR, SEMICONDUCTOR DEVICE, AND ELECTRONIC DEVICE

BACKGROUND OF THE INVENTION

1. Field of the Invention

One embodiment of the present invention relates to a semiconductor device and a driving method thereof. Another embodiment of the present invention relates to an electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electro-optical device, a power storage device, a memory device, a semiconductor circuit, an imaging device, an electronic device, and the like may include a semiconductor device.

2. Description of the Related Art

A technique in which a transistor is formed using a semiconductor thin film has attracted attention. Such a transistor is used in a wide range of electronic devices such as an integrated circuit (IC) and an image display device (also simply referred to as a display device). A silicon-based semiconductor material is widely known as a material for a semiconductor thin film that can be used for a transistor. As another material, an oxide semiconductor has attracted attention.

For example, a technique in which a transistor is manufactured using a zinc oxide or an In—Ga—Zn-based oxide as an oxide semiconductor is disclosed (see Patent Documents 1 and 2).

In addition, a technique in which oxide semiconductor layers with different electron affinities (or conduction band minimum states) are stacked to increase the carrier mobility of a transistor is disclosed (see Patent Documents 3 and 4).

In recent years, demand for an integrated circuit in which transistors and the like are integrated with high density has risen with reductions in the size and weight of an electronic device. In addition, the productivity of the semiconductor device including an integrated circuit is required to be improved.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-124360
[Patent Document 4] Japanese Published Patent Application No. 2011-138934

SUMMARY OF THE INVENTION

An object of one embodiment of the present invention is to provide a transistor with favorable electrical characteristics. Another object of one embodiment of the present invention is to provide a transistor that can be miniaturized or highly integrated. Another object of one embodiment of the present invention is to provide a transistor that can be manufactured with high productivity. Another object of one embodiment of the present invention is to provide a transistor capable of high-speed operation. Another object of one embodiment of the present invention is to provide a novel transistor.

Another object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the description of these objects does not disturb the existence of other objects. One embodiment of the present invention does not necessarily achieve all the objects. Other objects are apparent from and can be derived from the description of the specification, the drawings, the claims, and the like.

A first transistor and a second transistor having different electrical characteristics from those of the first transistor are provided over the same layer without drastically increasing the number of manufacturing steps. A semiconductor layer where a channel of the first transistor is formed and a semiconductor layer where a channel of the second transistor is formed are formed using semiconductor materials having different electron affinities. In the case where an oxide semiconductor is used for the semiconductor layer, an insulating layer containing excess oxygen is used as an insulating layer below the semiconductor layer. By increasing the thickness of the insulating layer, a large amount of oxygen can be supplied to the semiconductor layer.

One embodiment of the present invention is a transistor including first to fourth electrodes, first to third semiconductor layers, first and second layers, first to third insulating layers, and a first wiring. The first insulating layer includes a region overlapping with the first wiring. The first electrode includes a region overlapping with the first wiring. The second insulating layer includes a region overlapping with the first electrode and a region overlapping with the first insulating layer. The first semiconductor layer includes a region overlapping with the second insulating layer. The second semiconductor layer includes a region overlapping with the first semiconductor layer. The second semiconductor layer includes first to third regions. The third region is sandwiched between the first region and the second region. The second electrode includes a region overlapping with the first region. In the region overlapping with the first region, the first layer includes a region overlapping with the second electrode. The third electrode includes a region overlapping with the second region. In the region overlapping with the second region, the second layer includes a region overlapping with the third electrode. The third semiconductor layer includes a region overlapping with the first layer, a region overlapping with the second layer, and a region overlapping with the third region. In the region overlapping with the third region, the fourth electrode includes a region overlapping with the third region with the third insulating layer located therebetween.

One embodiment of the present invention is a transistor including a second insulating layer, a fourth insulating layer, a fourth semiconductor layer, and fifth to seventh electrodes. The fourth semiconductor layer includes a region overlapping with the second insulating layer. The fourth insulating layer includes a region overlapping with the fourth semiconductor layer. The fourth semiconductor layer includes fourth to sixth regions. The sixth region is sandwiched between the fourth region and the fifth region. In a region overlapping with the fourth region, the fifth electrode penetrates the fourth semiconductor layer and the fourth insulating layer and includes a region electrically connected to the fourth semiconductor layer. In a region overlapping with the fifth region, the sixth electrode penetrates the fourth semiconductor layer and the fourth insulating layer and includes a region electrically connected to the fourth semiconductor layer. The seventh electrode includes a region overlapping with the sixth region with the fourth insulating layer located therebetween.

The first to fourth semiconductor layers each preferably include an oxide semiconductor. The first and second layers each preferably include an oxide semiconductor. The third insulating layer can function as a gate insulating layer. The fourth insulating layer can function as a gate insulating layer. At least one of the first insulating layer and the second insulating layer preferably contains excess oxygen.

One embodiment of the present invention is a semiconductor device including the transistor. One embodiment of the present invention is an electronic device including the transistor.

One embodiment of the present invention can provide a transistor having favorable electrical characteristics. Another embodiment of the present invention can provide a transistor that can be miniaturized or highly integrated. Another embodiment of the present invention can provide a transistor that can be manufactured with high productivity. Another embodiment of the present invention can provide a transistor capable of high-speed operation. Another embodiment of the present invention can provide a novel transistor.

Another embodiment of the present invention can provide a semiconductor device having favorable electrical characteristics. Another embodiment of the present invention can provide a semiconductor device that can be miniaturized or highly integrated. Another embodiment of the present invention can provide a semiconductor device that can be manufactured with high productivity.

Another embodiment of the present invention can provide a semiconductor device capable of holding data for a long time. Another embodiment of the present invention can provide a semiconductor device capable of high-speed data writing. Another embodiment of the present invention can provide a semiconductor device with high design flexibility. Another embodiment of the present invention can provide a low-power semiconductor device. Another embodiment of the present invention can provide a novel semiconductor device.

Note that the description of these effects does not preclude the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIG. 1A is a cross-sectional view of a semiconductor device and FIGS. 1B and 1C show electrical characteristics of the semiconductor device.

FIG. 21 illustrates a semiconductor device.

FIGS. 32A and 32B are circuit diagrams of memory devices.

FIGS. 49A and 49B illustrate examples of a display device.

FIGS. 58A and 58B show cross-sectional TEM images of an a-like OS.

DETAILED DESCRIPTION OF THE INVENTION

Figure 2:
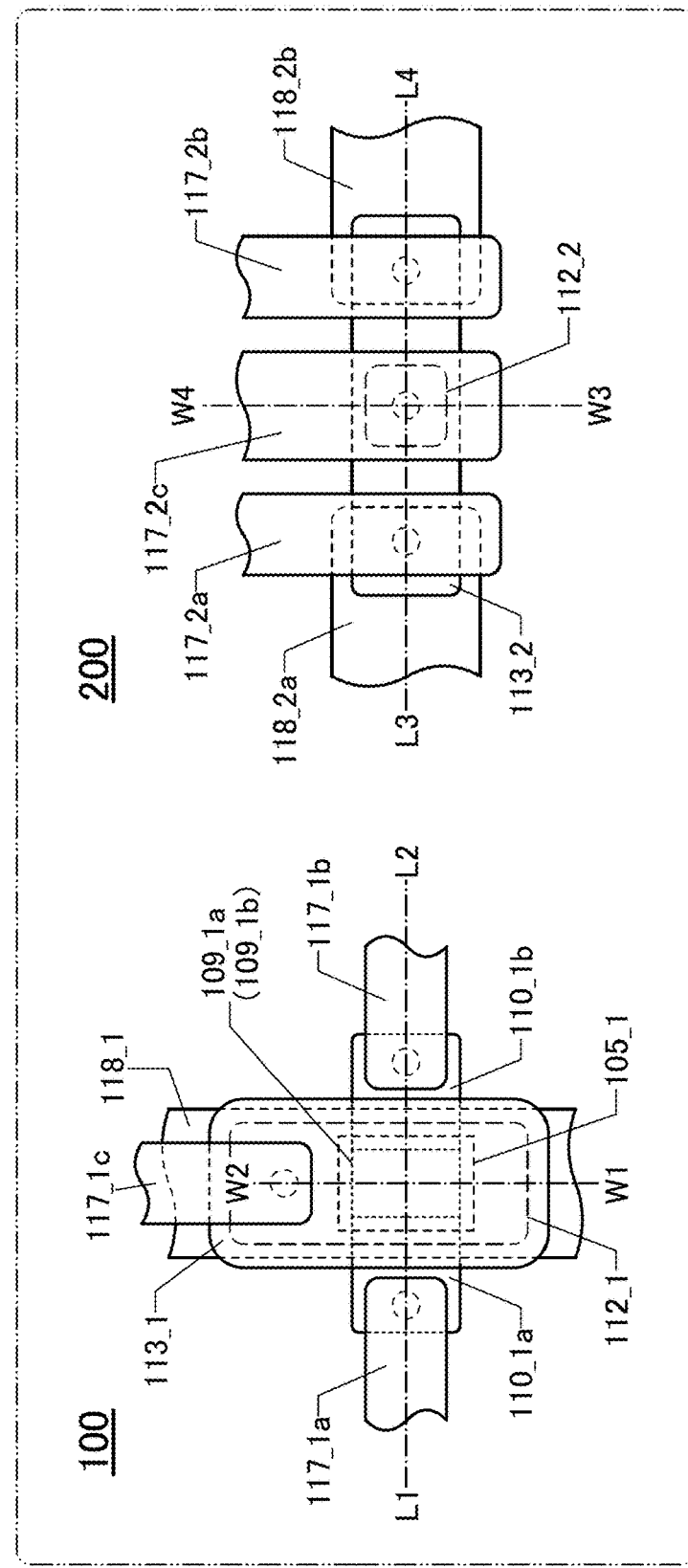
FIG. 2 illustrates a semiconductor device.

Embodiments are described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" provided in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in the top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter also referred to as an "effective channel width") is sometimes different from a channel width shown in a top view of a transistor (hereinafter also referred to as an "apparent channel width"). For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor layer, the proportion of a channel formation region formed in the side surface of the semiconductor layer may be increased. In that case, an effective channel width is greater than an apparent channel width.

In such a case, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Thus, in this specification, an apparent channel width is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water may function as an impurity. Furthermore, in the case of an oxide semiconductor, oxygen vacancies may be formed by entry of impurities. In the case where the semiconductor is silicon, examples of an impurity that changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In the specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed by a photolithography method, the resist mask is removed after the etching step, unless otherwise specified.

In this specification and the like, a high power supply potential $V_{DD}$ (hereinafter also simply referred to as $V_{DD}$ or H potential) is a power supply potential higher than a low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground (GND) potential (also referred to as "GND") can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be used interchangeably depending on the case or the circumstances. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, a transistor described in this specification and the like refers to an n-channel transistor. Thus, unless otherwise specified, the threshold voltage (also referred to as "$V_{th}$") is larger than 0 V.

Note that the $V_{th}$ of a transistor including a back gate in this specification and the like refers to a $V_{th}$ obtained when the potential of the back gate is set equal to that of a source or a gate, unless otherwise specified.

Embodiment 1

Providing transistors having different electrical characteristics over the same layer can increase the degree of freedom in design of a semiconductor device and the integration degree in the semiconductor device. In this embodiment, an example of an embodiment where transistors having different electrical characteristics are provided over the same layer while an increase in the number of manufacturing steps is suppressed is described.

<Structure Example of Semiconductor Device 1000>

FIG. 1A is a cross-sectional view of a semiconductor device 1000. FIG. 2 is a plan view of the semiconductor device 1000. The semiconductor device 1000 includes a transistor 100 and a transistor 200. The transistors 100 and 200 have different structures. FIG. 1A illustrates cross sections of the transistors 100 and 200 over a substrate 101. FIG. 1A corresponds to a cross-sectional view taken along dashed-dotted line L1-L2 and a cross-sectional view taken along dashed-dotted line L3-L4 in FIG. 2.

Figure 3A:
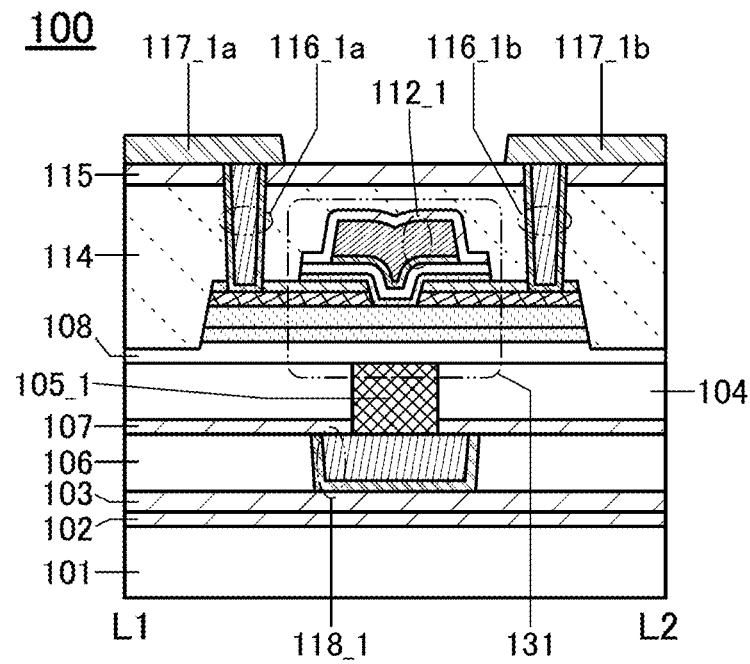
FIGS. 3A and 3B illustrate a transistor.
Figure 3B:
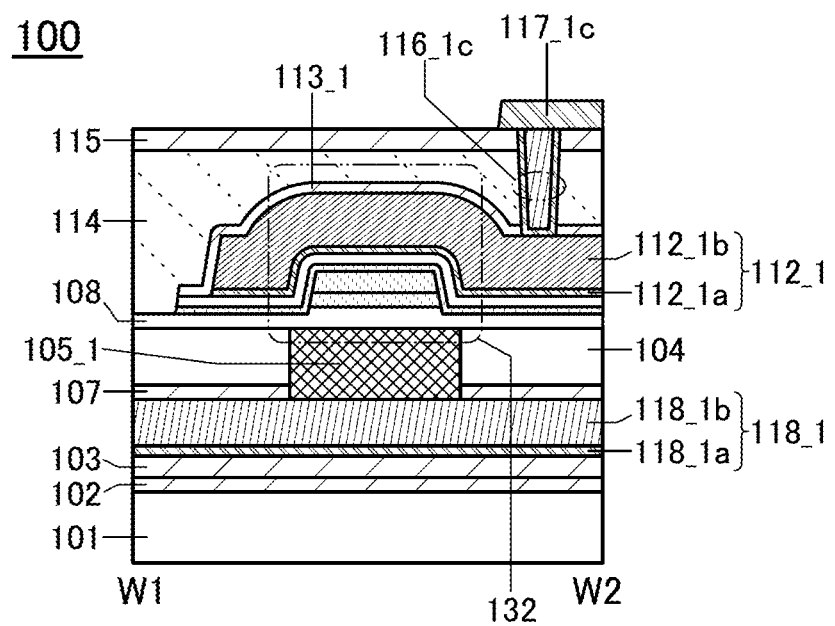
Figure 4A:
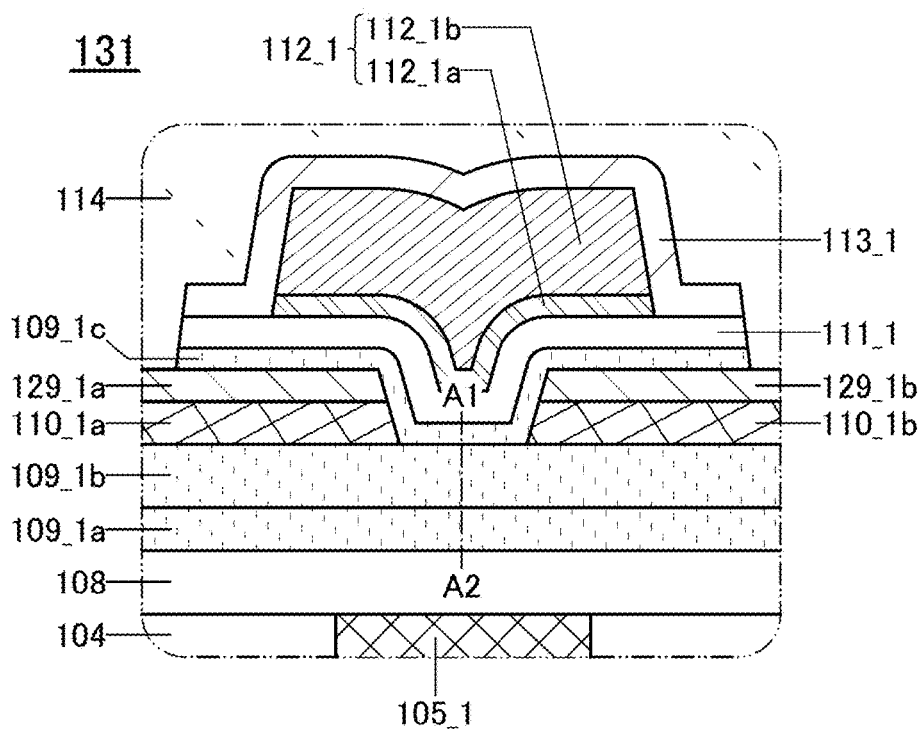
FIGS. 4A and 4B illustrate a transistor.
Figure 4B:
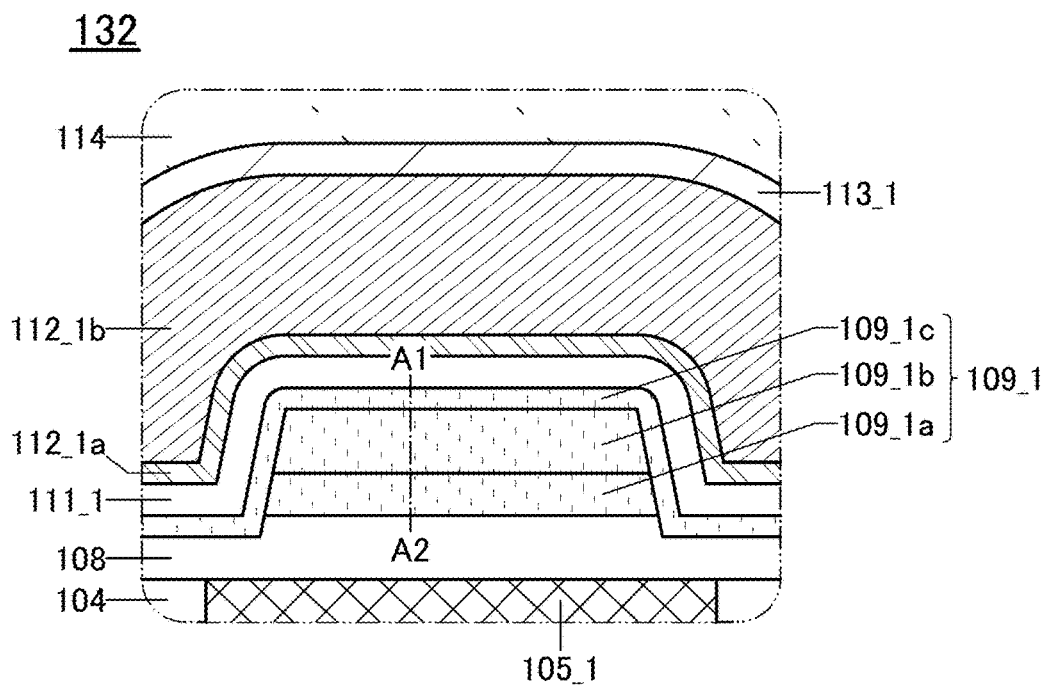

FIG. 3A is a cross-sectional view taken along dashed-dotted line L1-L2 in FIG. 2. FIG. 3A is a cross-sectional view of the transistor 100 in the channel length direction. FIG. 3B is a cross-sectional view taken along dashed-dotted line W1-W2 in FIG. 2. FIG. 3B is a cross-sectional view of the transistor 100 in the channel width direction. FIG. 4A is an enlarged view of a portion 131 in FIG. 3A. FIG. 4B is an enlarged view of a portion 132 in FIG. 3B.

Figure 5A:
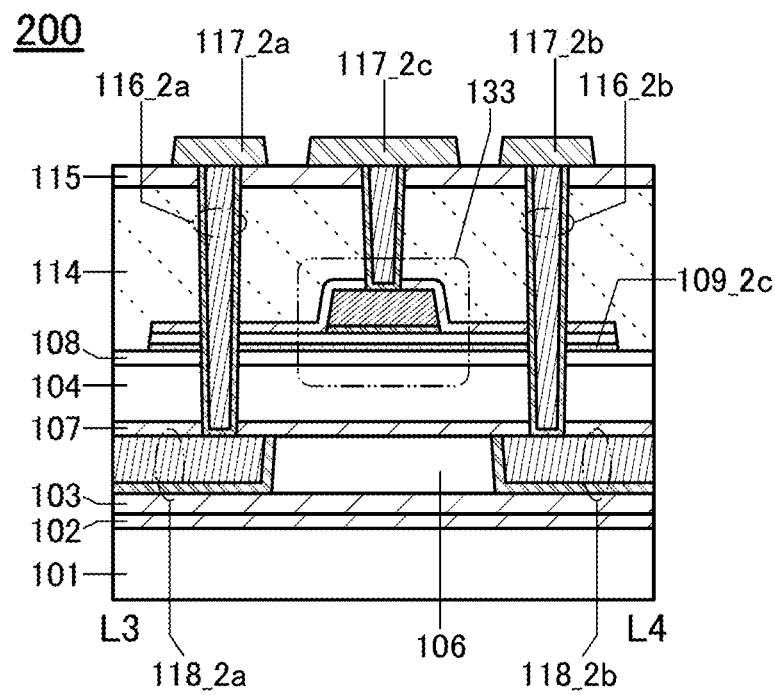
FIGS. 5A and 5B illustrate a transistor.
Figure 5B:
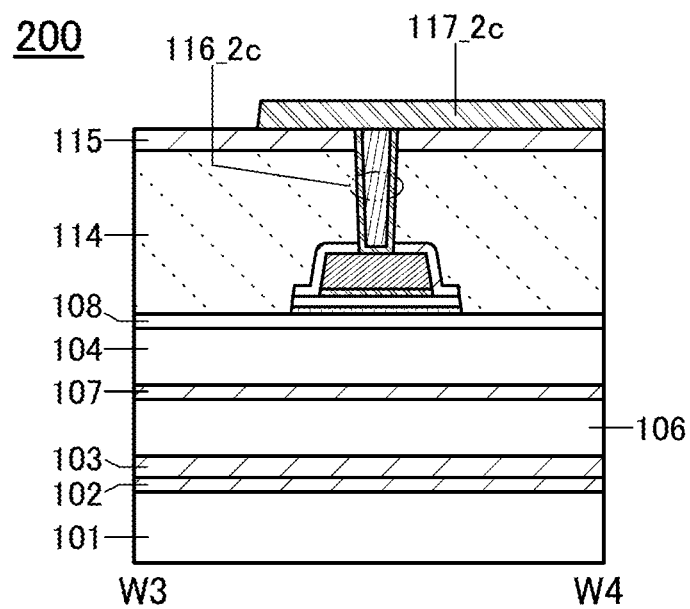
Figure 6:
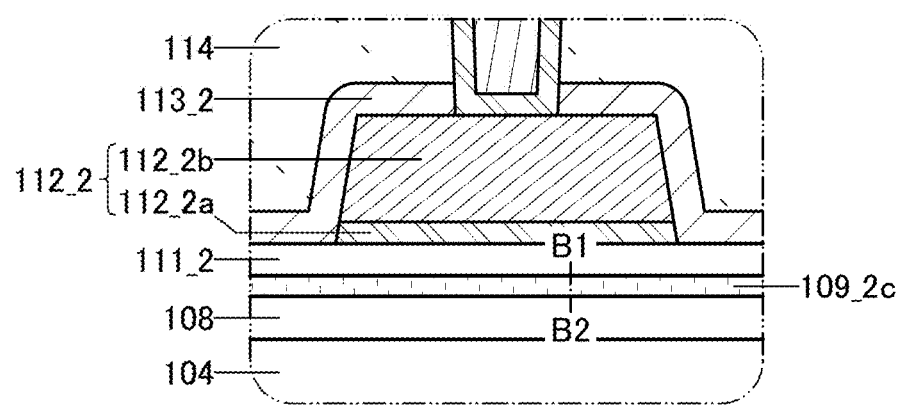
FIG. 6 illustrates a transistor.

FIG. 5A is a cross-sectional view taken along dashed-dotted line L3-L4 in FIG. 2. FIG. 5A is a cross-sectional view of the transistor 200 in the channel length direction. FIG. 5B is a cross-sectional view taken along dashed-dotted line W3-W4 in FIG. 2. FIG. 5B is a cross-sectional view of the transistor 200 in the channel width direction. FIG. 6 is an enlarged view of a portion 133 in FIG. 5A.

FIGS. 1B and 1C each show a $V_g$-$I_d$ curve, which is one of the electrical characteristics of a transistor. In the $V_g$-$I_d$ curves shown in FIGS. 1B and 1C, the horizontal axis represents a potential difference ($V_g$) between a gate and a source in the case where the source is regarded as a reference. The vertical axis represents current flowing to a drain ($I_d$) of the transistor on a logarithmic scale.

The transistor 100 is a transistor including a back gate. FIG. 1B shows the $V_g$-$I_d$ curve of the transistor 100 when the potential of the back gate is set to the same as that of the source or the gate. FIG. 1C shows the $V_g$-$I_d$ curve of the transistor 200. As shown in FIGS. 1B and 1C, the transistors 100 and 200 have different transistor characteristics. The $V_g$-$I_d$ curve of the transistor 200 is shifted in the positive direction compared with the $V_g$-$I_d$ curve of the transistor 100. In other words, the transistor 200 has higher $V_{th}$ than the transistor 100.

The transistors 100 and 200 are described with reference to drawings.

[Transistor 100]

The transistor 100 is a kind of top-gate transistor. The transistor 100 includes an electrode 105_1, an insulating layer 108, a semiconductor layer 109_1a, a semiconductor layer 109_1b, a semiconductor layer 109_1c, an electrode 110_1a, an electrode 110_1b, a layer 129_1a, a layer 129_1b, an insulating layer 111_1, an electrode 112_1, and an insulating layer 113_1 (see FIG. 2, FIGS. 3A and 3B, and FIGS. 4A and 4B).

The transistor 100 is provided over the substrate 101 with insulating layers 102, 103, and 106 provided therebetween. The electrode 105_1 is electrically connected to a wiring 118_1. The electrode 105_1 is embedded in insulating layers 107 and 104. Furthermore, the wiring 118_1 is embedded in the insulating layer 106. The electrode 105_1 and the wiring 118_1 can be formed by a damascene method. Although the wiring 118_1 extends in the channel length direction in this embodiment, the wiring 118_1 may extend in the channel width direction or other directions.

More specifically, the insulating layer 102 is provided over the substrate 101, and the insulating layer 103 is provided over the insulating layer 102. The insulating layer 106 is provided over the insulating layer 103, and the wiring 118_1 is provided in the same layer as the insulating layer 106. In this embodiment, an example in which the wiring 118_1 is a stacked layer of a wiring 118_1a and a wiring 118_1b is described. The insulating layer 107 is provided over the insulating layer 106 and the wiring 118_1, and the insulating layer 104 is provided over the insulating layer 107. The electrode 105_1 is provided in the same layer as the insulating layers 107 and 104.

The insulating layer 108 is provided over the electrode 105_1 and the insulating layer 104. The insulating layer 108 has a projection, the semiconductor layer 109_1a is provided over the projection, and the semiconductor layer 109_1b is provided over the semiconductor layer 109_1a.

Figure 11A:
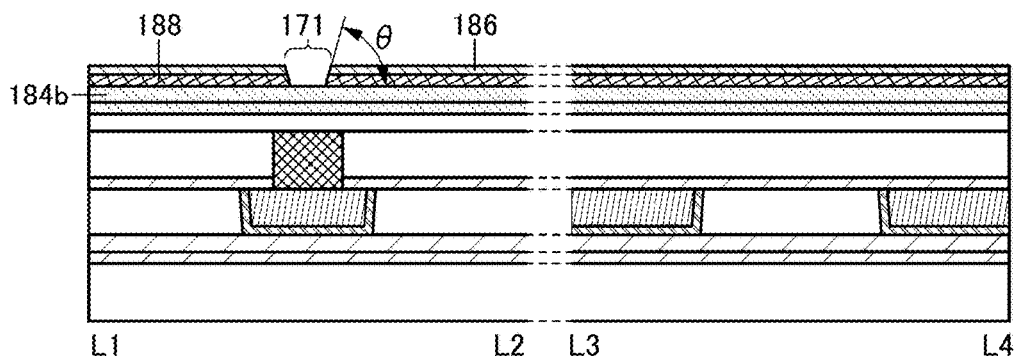
FIGS. 11A to 11D illustrate a method for manufacturing a semiconductor device.
Figure 11B:
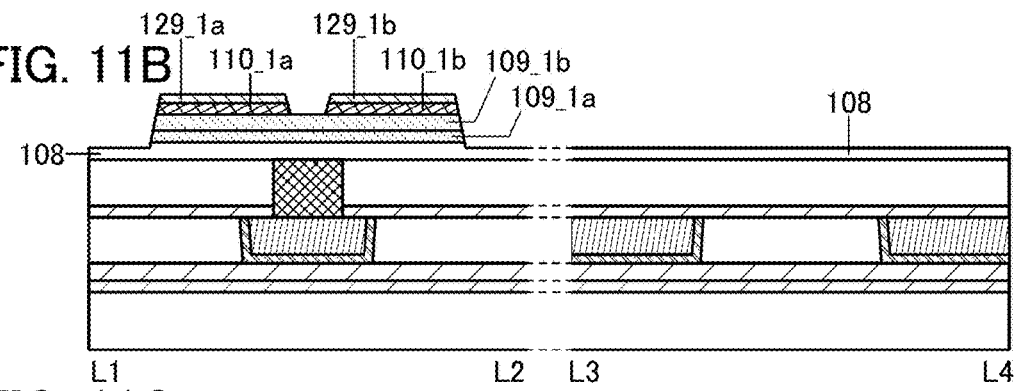
Figure 11C:
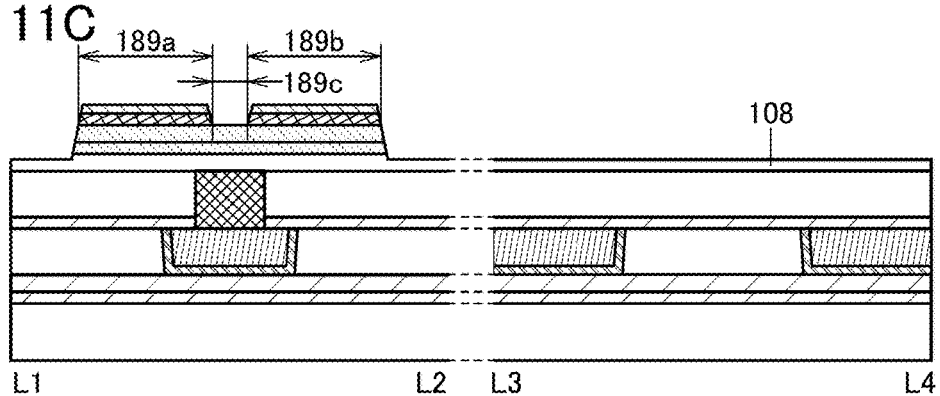

The semiconductor layer 109_1b includes a region 189a overlapping with the electrode 110_1a, a region 189b overlapping with the electrode 110_1b, and a region 189c positioned between the region 189a and the region 189b in the plan view (see FIG. 11C). Note that one of the electrodes 110_1a and 110_1b can function as one of a source electrode and a drain electrode, and the other can function as the other of the source electrode and the drain electrode. Thus, one of the regions 189a and 189b of the semiconductor layer 109_1b can function as the source region and the other can function as the drain region. Furthermore, the region 189c of the semiconductor layer 109_1b can function as a channel formation region.

The layer 129_1a is provided over the electrode 110_1a, and the layer 129_1b is provided over the electrode 110_1b. The semiconductor layer 109_1c is provided over the layer 129_1a, the layer 129_1b, and the semiconductor layer 109_1b. The semiconductor layer 109_1c includes a region in contact with part of the semiconductor layer 109_1b. Furthermore, the semiconductor layer 109_1c includes a region in contact with a side surface of the semiconductor layer 109_1a and a region in contact with a side surface of the semiconductor layer 109_1b (see FIG. 4B).

The insulating layer 111_1 is provided over the semiconductor layer 109_1c, and the electrode 112_1 is provided over the insulating layer 111_1. The insulating layer 111_1 and the electrode 112_1 include a region overlapping with the region 189c. In this embodiment, an example in which the electrode 112_1 is a stacked layer of an electrode 112_1a and an electrode 112_1b is described.

The transistor 100 further includes the insulating layer 113_1 over the electrode 112_1. The electrode 112_1 is covered with the insulating layer 113_1. The insulating layers 111_1 and 113_1 extend beyond an end portion of the electrode 112_1, and have a region where the insulating layers 111_1 and 113_1 are in contact with each other in the extended portion.

In this embodiment, an insulating layer 114 is provided to cover the transistor 100, and an insulating layer 115 is provided over the insulating layer 114.

Figure 13A:
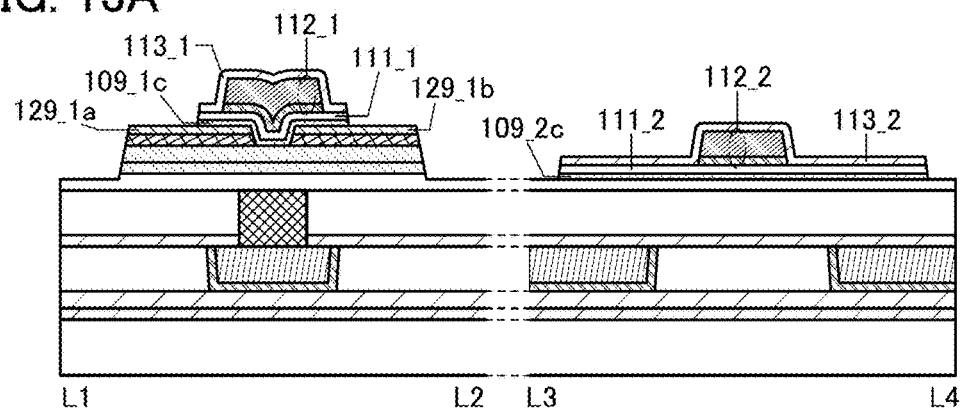
FIGS. 13A to 13C illustrate a method for manufacturing a semiconductor device.
Figure 13B:
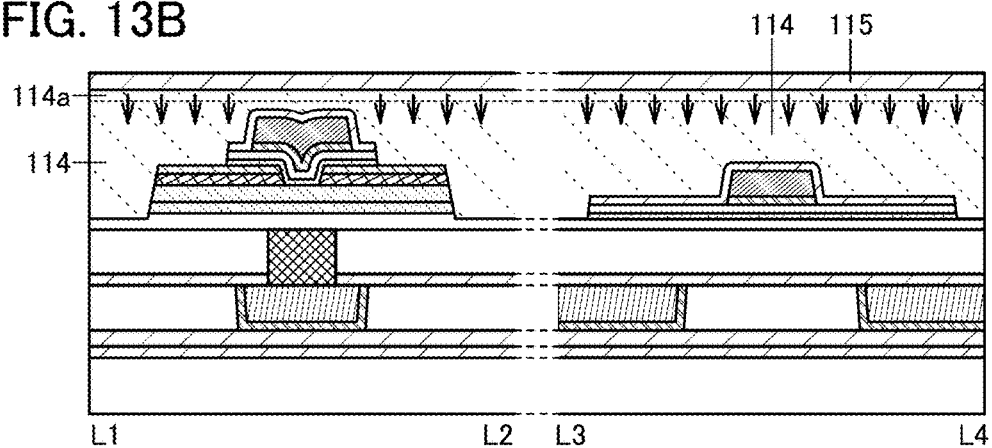
Figure 13C:
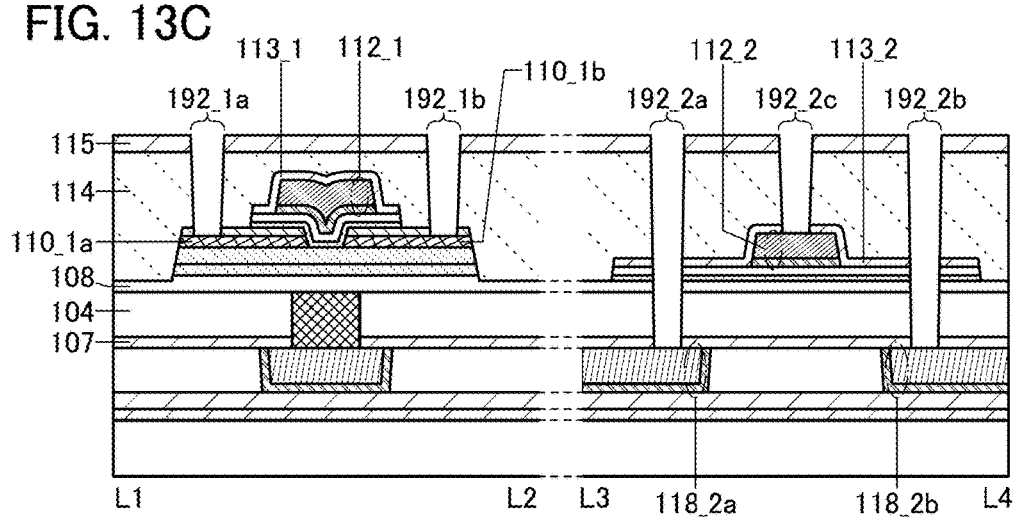

An electrode 116_1a is provided in an opening 192_1a that overlaps with the electrode 110_1a and that penetrates the insulating layer 115, the insulating layer 114, and the layer 129_1a (see FIG. 13C). An electrode 116_1b is provided in an opening 192_1b that overlaps with the electrode 110_1b and that penetrates the insulating layer 115, the insulating layer 114, and the layer 129_1b (see FIG. 13C). An electrode 116_1c is provided in an opening 192_1c that overlaps with the electrode 112_1 and that penetrates the insulating layer 115, the insulating layer 114, and the insulating layer 113_1 (not illustrated).

In this embodiment, an electrode 117_1a, an electrode 117_1b, and an electrode 117_1c are provided over the insulating layer 115. The electrode 117_1a is electrically connected to the electrode 110_1a through the electrode 116_1a. The electrode 117_1b is electrically connected to the electrode 110_1b through the electrode 116_1b. The electrode 117_1c is electrically connected to the electrode 112_1 through the electrode 116_1c.

The electrode 105_1 includes, in the channel length direction, a region overlapping with the electrode 110_1a, a region overlapping with the electrode 110_1b, and a region overlapping with the channel formation region of the semiconductor layer 109_1b.

To reduce the parasitic capacitance between the wiring 118_1 and the electrode 112_1 and to increase the withstand voltage therebetween, for example, the thickness of the insulating layer 104 is preferably increased. Similarly, the thickness (height) of the electrode 105_1 is preferably increased. However, if the insulating layer 104 is too thick, the productivity of the transistor might be lowered. Similarly, if the electrode 105_1 is too thick (too high), the productivity of the transistor might be lowered. The thickness of the insulating layer 104 is preferably greater than or equal to the thickness of the insulating layer 108 and less than or equal to five times the thickness of the insulating layer 108. Similarly, the thickness of the electrode 105_1 is preferably greater than or equal to the thickness of the insulating layer 108 and less than or equal to five times the thickness of the insulating layer 108. The amount of excess oxygen contained in the insulating layer 104 can be increased by increasing the thickness of the insulating layer 104. Excess oxygen is described later.

As illustrated in FIG. 3B and FIG. 4B, in the transistor 100, the semiconductor layer 109_1b is covered with the electrode 112_1 in the channel width direction. As described above, the insulating layer 108 has the projection. The semiconductor layers 109_1a and 109_1b are provided over the projection. By providing the projection, a bottom surface of the electrode 112_1 in a region not overlapping with the projection (a region not overlapping with the semiconductor layer 109_1b) can be closer to the substrate than a bottom surface of the semiconductor layer 109_1b is. Note that the height of the projection is preferably greater than or equal to the thickness of the semiconductor layer 109_1c. Alternatively, the sum of the height of the projection and the thickness of the semiconductor layer 109_1a is preferably greater than or equal to the sum of the thickness of the insulating layer 111_1 and the thickness of the semiconductor layer 109_1c. With the structures, the side surface of the semiconductor layer 109_1b can be covered with the electrode 112_1.

In other words, a structure in which the semiconductor layer 109_1b can be electrically surrounded by an electric field between the electrode 105_1 and the electrode 112_1 can be formed. Such a structure of a transistor in which a semiconductor layer where a channel is formed is electrically surrounded by an electric field between conductive layers (the electrodes 105_1 and 112_1 in the transistor 100) is called a surrounded channel (s-channel) structure. With the transistor 100 having an s-channel structure, a channel can be formed in the whole of the semiconductor layer 109_1b (bulk). In the s-channel structure, the drain current of the transistor can be increased, so that a larger amount of on-state current (current that flows between the source and the drain when the transistor is on) can be obtained. Furthermore, the entire channel formation region of the semiconductor layer 109_1b can be depleted by the electric field between the electrodes 105_1 and 112_1. Accordingly, the off-state current of the transistor can be further reduced. When the channel width is shortened, the effects of the s-channel structure, such as an increase in on-state current and a reduction in off-state current, can be enhanced.

[Gate Electrode and Back Gate Electrode]

One of the electrodes 105_1 and 112_1 can function as a gate electrode and the other can function as a back gate electrode. In general, a gate electrode and a back gate electrode are formed using a conductive layer and positioned so that the channel formation region of the semiconductor layer is located between the gate electrode and the back gate electrode. Thus, the back gate electrode can function in a manner similar to that of the gate electrode. The potential of the back gate electrode may be the same as that of the gate electrode or may be a ground potential or a predetermined potential. When the potential of the back gate electrode is not the same as the potential of the gate electrode and is changed independently of the potential of the gate electrode, the threshold voltage of the transistor can be changed.

The electrodes 105_1 and 112_1 can each function as a gate electrode. Thus, the insulating layers 108 and 111_1 can each function as a gate insulating layer.

In the case where one of the electrodes 105_1 and 112_1 is referred to as a "gate electrode" or a "gate", the other can be referred to as a "back gate electrode" or a "back gate". For example, in the transistor 100, in the case where the electrode 105_1 is referred to as a "gate electrode", the electrode 112_1 is referred to as a "back gate electrode". In the case where the electrode 112_1 is used as a "gate electrode", the transistor 100 can be regarded as a kind of bottom-gate transistor. Alternatively, one of the electrodes 105_1 and 112_1 may be referred to as a "first gate electrode" or a "first gate", and the other may be referred to as a "second gate electrode" or a "second gate". Alternatively, one of the electrodes 105_1 and 112_1 may be referred to as a "back gate electrode" or a "back gate", and the other may be referred to as a "front gate electrode" or a "front gate".

By providing the electrodes 105_1 and 112_1 with the semiconductor layer 109_1b provided therebetween and setting the potentials of the electrodes 105_1 and 112_1 to be the same, a region of the semiconductor layer 109_1b through which carriers flow is enlarged in the film thickness direction; thus, the number of transferred carriers is increased. As a result, the on-state current and the field-effect mobility of the transistor 100 are increased.

Therefore, the transistor 100 has a high on-state current for its area. That is, the area occupied by the transistor 100 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer where the channel is formed (in particular, an electric field blocking function against static electricity and the like). When the back gate electrode is formed larger than the semiconductor layer to cover the semiconductor layer in the plan view, the electric field blocking function can be enhanced.

Since the electrodes 105_1 and 112_1 each have a function of blocking an electric field from the outside, charges of charged particles and the like generated over the electrode 112_1 or under the electrode 105_1 do not influence the channel formation region in the semiconductor layer 109_1b. Thus, degradation by a stress test (e.g., a negative gate bias temperature (−GBT) stress test in which negative charges are applied to a gate) can be reduced. In addition, the electrodes 105_1 and 112_1 can block an electric field generated from the drain electrode so as not to affect the semiconductor layer. Thus, changes in the rising voltage of on-state current due to changes in drain voltage can be suppressed. Note that this effect is significant when a potential is applied to the electrodes 105_1 and 112_1.

The GBT stress test is one kind of acceleration test and can evaluate, in a short time, a change by long-term use (i.e., a change over time) in the characteristics of a transistor. In particular, the amount of change in the threshold voltage of the transistor between before and after the GBT stress test is an important indicator when the reliability of the transistor is examined. If the amount of change in the threshold voltage between before and after the GBT stress test is small, the transistor has higher reliability.

By providing the electrodes 105_1 and 112_1 and setting the potentials of the electrodes 105_1 and 112_1 to be the same, the amount of change in threshold voltage is reduced. Accordingly, variation in electrical characteristics among a plurality of transistors is also reduced.

The transistor including the back gate electrode has a smaller change in threshold voltage by a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Transistor 200]

The transistor 200 is a kind of top-gate transistor. The transistor 200 includes the insulating layer 108, a semiconductor layer 109_2c, an insulating layer 111_2, an electrode 112_2, and an insulating layer 113_2 (see FIG. 2, FIGS. 5A and 5B, and FIG. 6).

The transistor 200 is provided over the substrate 101 with the insulating layers 102, 103, and 106 located therebetween.

More specifically, the insulating layer 102 is provided over the substrate 101, and the insulating layer 103 is provided over the insulating layer 102. The insulating layer 106 is provided over the insulating layer 103, and the wiring 118_2 (a wiring 118_2a and a wiring 118_2b) is provided in the same layer as the insulating layer 106. The insulating layer 107 is provided over the insulating layer 106 and the wiring 118_2, and the insulating layer 104 is provided over the insulating layer 107.

The insulating layer 108 is provided over the insulating layer 104. The semiconductor layer 109_2c is provided over the insulating layer 108.

The insulating layer 111_2 is provided over the semiconductor layer 109_2c, and the electrode 112_2 is provided over the insulating layer 111_2. In this embodiment, an example in which the electrode 112_2 is a stacked layer of an electrode 112_2a and an electrode 112_2b is described. A channel is formed in a region overlapping with the electrode 112_2 of the semiconductor layer 109_2c. Accordingly, the region overlapping with the electrode 112_2 of the semiconductor layer 109_2c can function as a channel formation region.

The transistor 200 includes the insulating layer 113_2 over the electrode 112_2. The electrode 112_2 is covered with the insulating layer 113_2. The insulating layers 111_2 and 113_2 extend beyond an end portion of the electrode 112_2 and have a region where the insulating layers 111_2 and 113_2 are in contact with each other in the extended portion.

In this embodiment, the insulating layer 114 is provided to cover the transistor 200, and the insulating layer 115 is provided over the insulating layer 114.

An electrode 116_2a is provided in an opening 192_2a that overlaps with the wiring 118_2a and that penetrates the insulating layer 115, the insulating layer 114, the insulating layer 113_2, the insulating layer 111_2, the semiconductor layer 109_2c, the insulating layer 108, the insulating layer 104, and the insulating layer 107 (see FIG. 13C). An electrode 116_2b is provided in an opening 192_2b that overlaps with the wiring 118_2b and that penetrates the insulating layer 115, the insulating layer 114, the insulating layer 113_2, the insulating layer 111_2, the semiconductor layer 109_2c, the insulating layer 108, the insulating layer 104, and the insulating layer 107 (see FIG. 13C). An electrode 116_2c is provided in an opening 192_2c that overlaps with the electrode 112_2 and that penetrates the insulating layer 115, the insulating layer 114, and the insulating layer 113_2 (see FIG. 13C).

The electrode 116_2a includes a region in contact with a portion of the semiconductor layer 109_2c. The electrode 116_2b includes a region in contact with a portion of the semiconductor layer 109_2c.

An electrode 117_2 (an electrode 117_2a, an electrode 117_2b, and an electrode 117_2c) is provided over the insulating layer 115. The electrode 117_2a is electrically connected to the wiring 118_2a through the electrode 116_2a. The electrode 117_2b is electrically connected to the wiring 118_2b through the electrode 116_2b. The electrode 117_2c is electrically connected to the electrode 112_2 through the electrode 116_2c.

The electrode 117_2a is electrically connected to the semiconductor layer 109_2c through the electrode 116_2a. The wiring 118_2a is electrically connected to the semiconductor layer 109_2c through the electrode 116_2a. The electrode 117_2b is electrically connected to the semiconductor layer 109_2c through the electrode 116_2b. The wiring 118_2b is electrically connected to the semiconductor layer 109_2c through the electrode 116_2b.

In this specification and the like, the semiconductor layer 109_1a, the semiconductor layer 109_1b, and the semiconductor layer 109_1c may be collectively referred to as a "semiconductor layer 109_1". The semiconductor layer 109_2a1 and the semiconductor layer 109_2a2 may be collectively referred to as a "semiconductor layer 109_2a". The semiconductor layer 109_2b1 and the semiconductor layer 109_2b2 may be collectively referred to as a "semiconductor layer 109_2b". The semiconductor layer 109_2a, the semiconductor layer 109_2b, and the semiconductor layer 109_2c may be collectively referred to as the "semiconductor layer 109_2". The semiconductor layer 109_1a and the semiconductor layer 109_2a may be collectively referred to as a "semiconductor layer 109a". The semiconductor layer 109_1b and the semiconductor layer 109_2b may be collectively referred to as a "semiconductor layer 109b". The semiconductor layer 109_1c and the semiconductor layer 109_2c may be collectively referred to as a "semiconductor layer 109c". The semiconductor layer 109_1 and the semiconductor layer 109_2 may be collectively referred to as a "semiconductor layer 109".

The layer 129_1a and the layer 129_1b may be collectively referred to as a "layer 129". The insulating layer 111_1 and the insulating layer 111_2 may be collectively referred to as an "insulating layer 111". The insulating layer 113_1 and the insulating layer 113_2 may be collectively referred to as an "insulating layer 113".

The electrode 105_2a and the electrode 105_2b may be collectively referred to as the "electrode 105_2". The electrode 105_1 and the electrode 105_2 may be collectively referred to as an "electrode 105". The electrode 110_1a and the electrode 110_1b may be collectively referred to as an "electrode 110". The electrode 112_1 and the electrode 112_2 may be collectively referred to as an "electrode 112". The electrode 116_1a, the electrode 116_1b, and the electrode 116_1c may be collectively referred to as an "electrode 116_1". The electrode 116_2a, the electrode 116_2b, and the electrode 116_2c may be collectively referred to as an "electrode 116_2". The electrode 116_1 and the electrode 116_2 may be collectively referred to as an "electrode 116". The electrode 117_1a, the electrode 117_1b, and the electrode 117_1c may be collectively referred to as an "electrode 117_1". The electrode 117_2a, the electrode 117_2b, and the electrode 117_2c may be collectively referred to as the "electrode 117_2". The electrode 117_1 and the electrode 117_2 may be collectively referred to as an "electrode 117".

The wiring 118_1a and the wiring 118_1b may be collectively referred to as the "wiring 118_1". A wiring 118_2a1 and a wiring 118_2a2 may be collectively referred to as the "wiring 118_2a". A wiring 118_2b1 and a wiring 118_2b2 may be collectively referred to as the "wiring 118_2b". A wiring 118_2c1 and a wiring 118_2c2 may be collectively referred to as a "wiring 118_2c". The wiring 118_2a, the wiring 118_2b, and the wiring 118_2c may be collectively referred to as the "wiring 118_2". The wiring 118_1 and the wiring 118_2 may be collectively referred to as a "wiring 118".

The opening 192_1a, the opening 192_1b, and the opening 192_1c may be collectively referred to as an "opening 192_1". The opening 192_2a, the opening 192_2b, and the opening 192_2c may be collectively referred to as an "opening 192_2". The opening 192_1 and the opening 192_2 may be collectively referred to as an "opening 192".

In the transistor 100, a channel is formed in the semiconductor layer 109_1b. In the transistor 200, a channel is formed in the semiconductor layer 109_2c. The semiconductor layers 109_1b and 109_2c are preferably formed using semiconductor materials having different physical properties. When the semiconductor layers 109_1b and 109_2c are formed using semiconductor materials having different physical properties, the transistors 100 and 200 can have different electrical characteristics. When semiconductor materials having different energy band gaps are used for the semiconductor layers 109_1b and 109_2c, for example, the transistors 100 and 200 can have different field-effect mobilities.

When a semiconductor material having lower electron affinity than that of the semiconductor layer 109_1b is used for the semiconductor layer 109_2c, for example, the transistor 200 can have higher $V_{th}$ than the transistor 100. For example, when the semiconductor layer 109_2c is an In-M-Zn oxide containing In, the element M, and Zn at an atomic ratio of $x_1:y_1:z_1$ and the semiconductor layer 109_1b is an In-M-Zn oxide containing In, M, and Zn at an atomic ratio of $x_2:y_2:z_2$, $y_1/x_1$ needs to be larger than $y_2/x_2$. With such In-M-Zn oxides, the transistor 200 can have higher $V_{th}$ than the transistor 100.

<Materials>
[Substrate]

There is no particular limitation on a material used for the substrate 101 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed. In this case, at least one of the gate, the source, and the drain of the transistor 100 and/or the transistor 200 may be electrically connected to the device.

Still alternatively, as the substrate 101, a glass substrate of barium borosilicate glass, aluminoborosilicate glass, or the like, a ceramic substrate, a quartz substrate, or a sapphire substrate can be used. Note that a flexible substrate may be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulating Layer]

The insulating layers 102 to 104, 106 to 108, 111, and 113 to 115 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 102 and/or the insulating layer 103 and the insulating layer 115 be formed using an insulating material that is relatively impermeable to impurities. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. A single layer or a stack including any of these materials may be used.

When the insulating material that is relatively impermeable to impurities is used for the insulating layer 102 and/or the insulating layer 103, impurity diffusion from the substrate 101 side to the transistor can be suppressed, and the reliability of the transistor can be improved. When the insulating material that is relatively impermeable to impurities is used for the insulating layer 115, impurity diffusion from layers above the insulating layer 115 to the transistor can be suppressed, and the reliability of the transistor can be improved.

Note that a stack of a plurality of insulating layers formed with these materials may be used as the insulating layer 102 and/or the insulating layer 103 and the insulating layer 115. One of the insulating layers 102 and 103 may be omitted.

When an oxide semiconductor is used for the semiconductor layer 109, the hydrogen concentrations in the insulating layers are preferably lowered in order to prevent an increase in the hydrogen concentration in the semiconductor layer 109. Specifically, the hydrogen concentration in the insulating layer that is measured by secondary ion mass spectrometry (SIMS) is set lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is particularly preferable to lower the hydrogen concentrations of the insulating layers 104, 106 to 108, 111, and 114. It is preferable to lower at least the hydrogen concentrations of the insulating layers in contact with the semiconductor layer 109 (the insulating layers 108, 111, and 114).

Furthermore, the nitrogen concentrations in the insulating layers are preferably low in order to prevent an increase in the nitrogen concentration in the semiconductor layer 109. Specifically, the nitrogen concentration in the insulating layer, which is measured by SIMS, is set lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable that a region of the insulating layer 108 that is in contact with at least the semiconductor layer 109 and a region of the insulating layer 111 that is in contact with at least the semiconductor layer 109 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. For example, in the case where a silicon oxide layer or a silicon oxynitride layer is used as the insulating layers 108 and 111, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ may be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density of a signal due to nitrogen dioxide (NO$_2$) is higher than or equal to $1 \times 10^{17}$ spins/cm$^3$ and lower than $1 \times 10^{18}$ spins/cm$^3$ as the insulating layers 108 and 111, for example.

Note that nitrogen oxide (NO$_x$) such as nitrogen dioxide (NO$_2$) forms a state in the insulating layer. The state is positioned in the energy gap of the oxide semiconductor layer. Thus, when nitrogen oxide (NO$_x$) is diffused to the interface between the insulating layer and the oxide semiconductor layer, an electron can potentially be trapped by the state on the insulating layer side. As a result, the trapped electrons remain in the vicinity of the interface between the insulating layer and the oxide semiconductor layer; thus, the threshold voltage of the transistor is shifted in the positive direction. Therefore, a shift in the threshold voltage of the transistor can be reduced when a film with a low nitrogen oxide content is used as the insulating layers 108 and 111.

As an insulating layer that releases little nitrogen oxide (NO$_x$), for example, a silicon oxynitride layer can be used. The silicon oxynitride layer is a film of which the amount of released ammonia is larger than the amount of released nitrogen oxide (NO$_x$) in thermal desorption spectroscopy (TDS); the typical amount of released ammonia is greater than or equal to $1 \times 10^{18}$/cm$^3$ and less than or equal to $5 \times 10^{19}$/cm$^3$. Note that the released amount of ammonia is the total amount of ammonia released by heat treatment in a range from 50° C. to 650° C. or a range from 50° C. to 550° C. in TDS.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers 108, 111, and 114 is preferably formed using an insulating layer from which oxygen is released by heating. Specifically, it is preferable to use an insulating layer of which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more, in TDS performed under such a condition that a surface of the insulating layer is heated at a temperature higher than or equal to 100° C. and lower than or equal to 700° C., preferably higher than or equal to 100° C. and lower than or equal to 500° C. Note that in this specification and the like, oxygen released by heating is also referred to as excess oxygen.

The insulating layer containing excess oxygen can be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used for the treatment for adding oxygen include an oxygen gas such as $^{16}O_2$ or $^{18}O_2$ and a gas containing oxygen such as a nitrous oxide gas or an ozone gas. In this specification, the treatment for adding oxygen is also referred to as "oxygen doping treatment". The oxygen doping treatment may be performed while the substrate is heated.

A heat-resistant organic material such as a polyimide, an acrylic-based resin, a benzocyclobutene-based resin, a polyamide, or an epoxy-based resin may be used to form the insulating layer 114. Other than the above organic materials, a low-dielectric constant material (low-k material), a siloxane-based resin, phosphosilicate glass (PSG), borophosphosilicate glass (BPSG), or the like can be used. Note that the insulating layer 114 may be formed by stacking a plurality of insulating layers formed using any of these materials.

Note that the siloxane-based resin corresponds to a resin including a Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on the method for forming the insulating layer 114. Note that a baking step is necessary depending on a material used for the insulating layer 114 in some cases. When the baking step of the insulating layer 114 also serves as heat treatment for another layer, the transistor can be manufactured efficiently.

Any of the above insulating layers may be used as the layer 129. In the case where the layer 129 is an insulating layer, an insulating layer that is less likely to release oxygen and/or that is less likely to absorb oxygen is preferably used.

[Electrode]

As a conductive material for forming the electrodes 105, 110, 112, 116, and 117, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, indium tin oxide to which silicon is added, or indium gallium zinc oxide containing nitrogen may be used.

A stack of a plurality of conductive layers formed with the above materials may be used. For example, a layered structure formed using a material containing the above metal element and a conductive material containing oxygen may be used. Alternatively, a layered structure formed using a material containing the above metal element and a conductive material containing nitrogen may be used. Still alternatively, a layered structure formed using a material containing the above metal element, a conductive material containing oxygen, and a conductive material containing nitrogen may be used. Still further alternatively, a layered structure formed using a conductive material containing nitrogen and a conductive material containing oxygen may be used.

Note that in the case where an oxide semiconductor is used for the semiconductor layer and a layered structure formed using a combination of a material including any of the metal elements listed above and a conductive material including oxygen is used as the gate electrode, the conductive material including oxygen is preferably provided on the semiconductor layer side. By providing the conductive material including oxygen on the semiconductor layer side, oxygen released from the conductive material is likely to be supplied to the semiconductor layer.

The electrode 116 may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the electrode 116 may be referred to as a contact plug.

In particular, the electrode 105 in contact with the insulating layers 104 and 108 is preferably formed using a conductive material that is relatively impermeable to impurities. Furthermore, the electrode 116 in contact with the insulating layers 114 and 115 is preferably formed using a conductive material that is relatively impermeable to impurities. As an example of the conductive material that is relatively impermeable to impurities, tantalum nitride can be given.

When the insulating layer 102 and/or the insulating layer 103 and the insulating layer 115 are formed using an insulating material that is relatively impermeable to impurities and the electrodes 105 and 116 are formed using a conductive material that is relatively impermeable to impurities, diffusion of impurities into the transistors 100 and 200 can be further suppressed. Thus, the reliabilities of the transistors 100 and 200 can be further increased.

Any of the above conductive materials may be used for the layer 129. In the case where the layer 129 is formed using a conductive material, a conductive material that is less likely to release oxygen and/or that is less likely to absorb oxygen is preferably used.

[Semiconductor Layer]

For the semiconductor layer 109, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, an organic semiconductor, or the like may be used.

In the case of using an organic semiconductor for the semiconductor layer 109, a low molecular organic material having an aromatic ring, a t-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

The semiconductor layers 109_1a, 109_1b, 109_1c, and 109_2c may be formed using semiconductors having different crystal states or different semiconductor materials.

The band gap of an oxide semiconductor is greater than or equal to 2 eV; thus, when the oxide semiconductor is used for the semiconductor layer 109, a transistor with an extremely low off-state current can be provided. Specifically, the off-state current per micrometer in channel width at room temperature (typically 25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits. A transistor using an oxide semiconductor in the semiconductor layer 109 has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this specification and the like, a transistor in which an oxide semiconductor is used for a semiconductor layer where a channel is formed is also referred to as an "OS transistor". In this specification and the like, a transistor in which silicon having crystallinity is used for a semiconductor layer where a channel is formed is also referred to as a "crystalline Si transistor".

The crystalline Si transistor tends to obtain relatively high mobility as compared to the OS transistor. On the other hand, the crystalline Si transistor has difficulty in obtaining an extremely low off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

In the case where the semiconductor layer 109 is formed using an oxide semiconductor layer, the oxide semiconductor layer is preferably formed by a sputtering method. The oxide semiconductor layer is preferably formed by a sputtering method, in which case the oxide semiconductor layer can have high density. In the case where the oxide semiconductor layer is formed by a sputtering method, a rare gas (typically argon), oxygen, or a mixed gas of a rare gas and oxygen is used as a sputtering gas. In addition, increasing the purity of the sputtering gas is necessary. For example, an oxygen gas or a rare gas used as a sputtering gas is a gas that is highly purified to have a dew point of $-60°$ C. or lower, preferably $-100°$ C. or lower. By using the sputtering gas that is highly purified, entry of moisture or the like into the oxide semiconductor layer can be prevented as much as possible.

In the case where an oxide semiconductor layer is formed by a sputtering method, it is preferable that moisture in a deposition chamber in a sputtering apparatus be removed as much as possible. For example, with an adsorption vacuum evacuation pump such as cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

In this embodiment, the case where an oxide semiconductor is used for the semiconductor layer 109 is described.
[Oxide Semiconductor]

An oxide semiconductor of the present invention is described below. An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor of the present invention are described with reference to FIGS. 53A to 53C. Note that the proportion of oxygen atoms is not shown in FIGS. 53A to 53C. The terms of the atomic ratio of indium, the element M, and zinc contained in the oxide semiconductor are denoted by [In], [M], and [Zn], respectively.

Figure 53A:
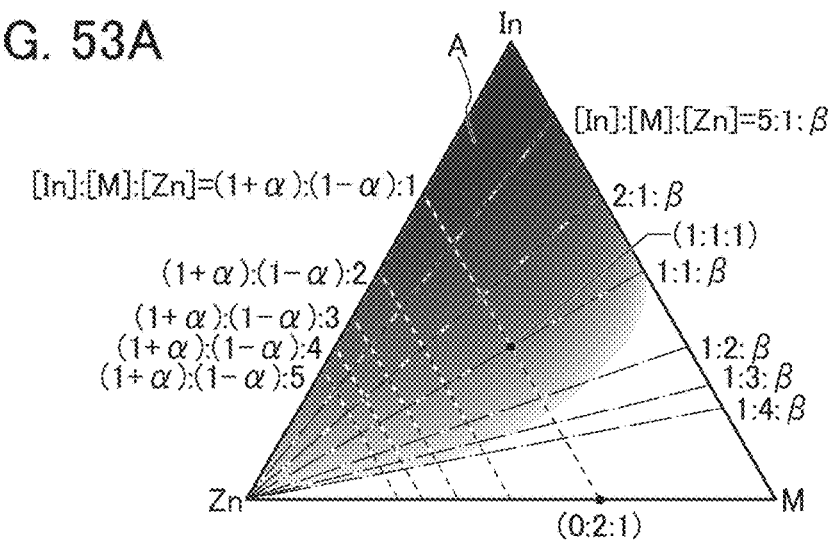
FIGS. 53A to 53C each illustrate the atomic ratio of an oxide of one embodiment of the present invention.
Figure 53B:
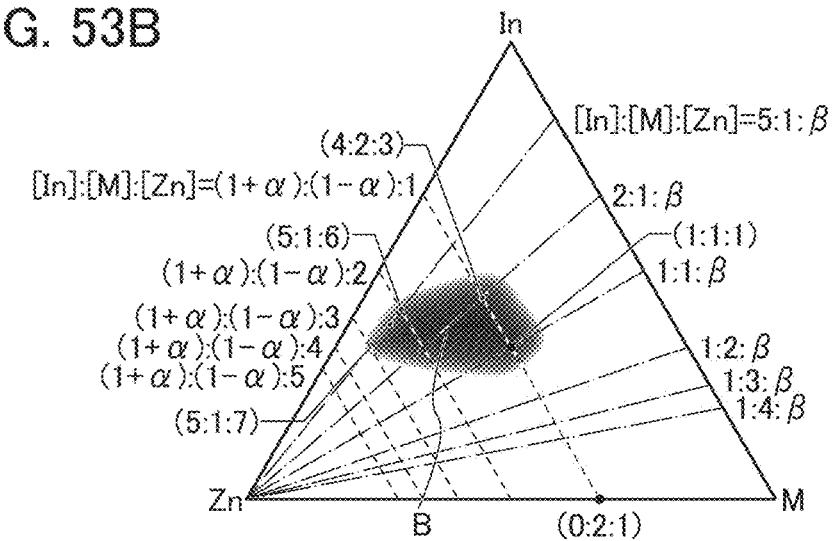
Figure 53C:
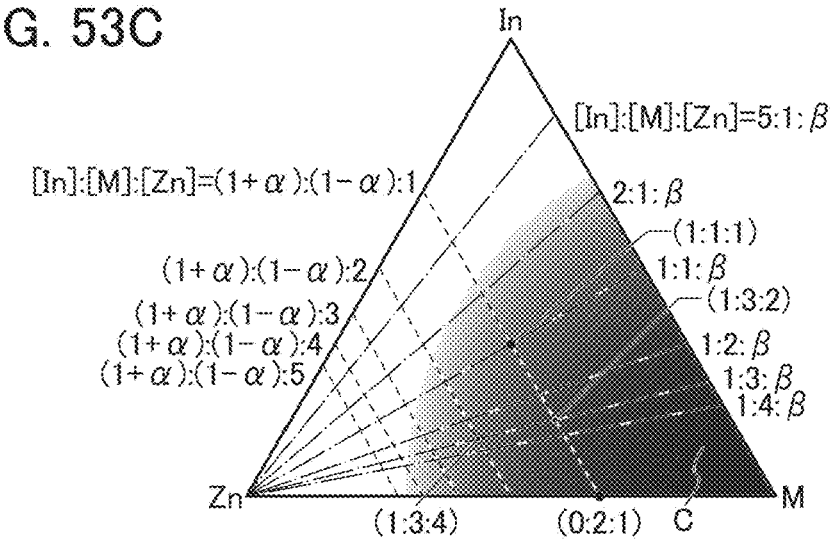

In FIGS. 53A to 53C, broken lines indicate a line where the atomic ratio [In]:[M]:[Zn] is $(1+\alpha):(1-\alpha):1$ (where $-1\le\alpha\le1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta\ge0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

An oxide semiconductor with the atomic ratio of [In]:[M]:[Zn]=0:2:1 or a neighborhood thereof in FIGS. 53A to 53C tends to have a spinel crystal structure.

FIGS. 53A and 53B illustrate examples of the preferred ranges of the atomic ratio of indium, the element M, and zinc contained in an oxide semiconductor in one embodiment of the present invention.

Figure 54:
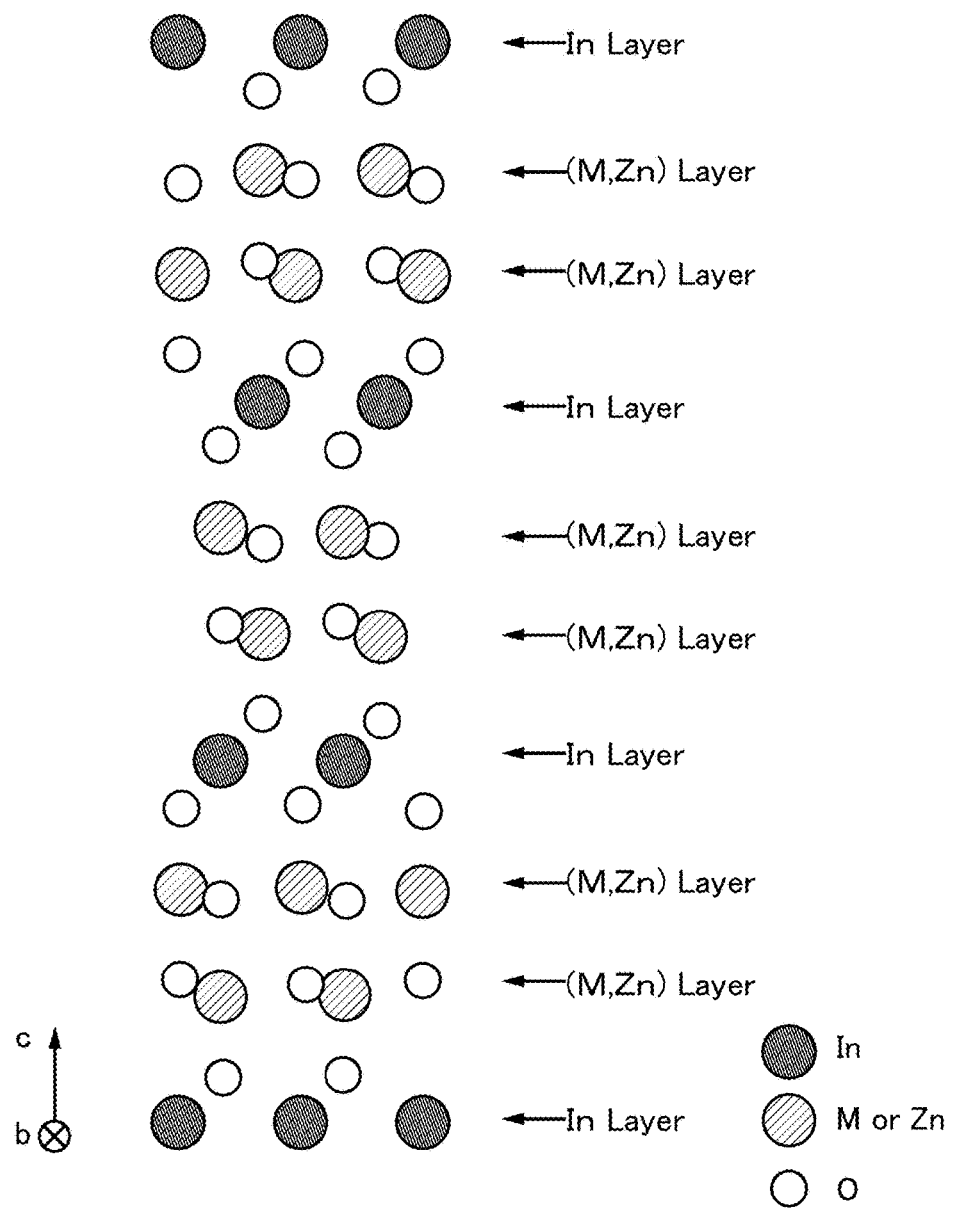
FIG. 54 illustrates an $InMZnO_4$ crystal.

FIG. 54 illustrates an example of the crystal structure of $InMZnO_4$ whose atomic ratio [In]:[M]:[Zn] is 1:1:1. In FIG. 54, the crystal structure of $InMZnO_4$ observed from the direction parallel to a b-axis is illustrated. Note that a metal element in a layer that contains M, Zn, and oxygen (hereinafter, this layer is referred to as an "(M,Zn) layer") in FIG. 54 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 54.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide semiconductor whose atomic ratio [In]:[M]:[Zn] is 1:1:2 has a layered structure that includes one In layer for every three (M,Zn) layers. In other words, if [Zn]

is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target, depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap. Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 53C), insulation performance becomes better.

Accordingly, an oxide semiconductor of one embodiment of the present invention preferably has an atomic ratio represented by a region A in FIG. 53A. With the atomic ratio, a layered structure with high carrier mobility and a few grain boundaries is easily obtained.

A region B in FIG. 53B represents an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof. An oxide semiconductor having an atomic ratio represented by the region B is an excellent oxide semiconductor that particularly easily becomes a CAAC-OS and has high carrier mobility.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and higher than or equal to $1\times10^{-9}/cm^3$ is used.

A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

Here, the influence of impurities in the oxide semiconductor is described.

When silicon or carbon, which is one of Group 14 elements, is contained in the oxide semiconductor, defect states are formed. Thus, the concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including, as a semiconductor, an oxide semiconductor that contains nitrogen is likely to be normally-on. For this reason, nitrogen in the oxide semiconductor is preferably reduced as much as possible. The nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics.

For the semiconductor layer 109b, an oxide semiconductor with a wide energy gap is used, for example. The energy gap of the semiconductor layer 109b is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, in the case where an InGaZnO$_X$ (X>0) film is formed by a thermal CVD method as the semiconductor layer 109, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where an InGaZnO$_X$ (X>0) film is formed as the semiconductor layer 109 by the ALD method, an In(CH$_3$)$_3$ gas and an O$_3$ gas are sequentially introduced a plurality of times to form an InO$_2$ layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed using these gases. Note that although an H$_2$O gas that is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the semiconductor layer 109 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the semiconductor layer 109 is formed by a sputtering method, the atomic ratio of In to M and Zn contained in the target may be 3:1:1, 3:1:2, 3:1:4, 1:1:0.5, 1:1:1, 1:1:2, 1:1:1.2, 1:4:4, 4:2:4.1, 1:3:2, 1:3:4, 5:1:6, or 5:1:8, for example.

In the case where the semiconductor layer 109 is formed by a sputtering method, a film having an atomic ratio different from the atomic ratio of the target may be formed. Especially for zinc, the proportion of zinc atoms of a formed film is smaller than that of zinc atoms of the target in some cases. Specifically, the film has an atomic ratio of zinc of 40 atomic % to 90 atomic % of the atomic ratio of zinc in the target.

The semiconductor layer 109a and the semiconductor layer 109c are preferably formed using a material including one or more kinds of metal elements, other than oxygen, included in the semiconductor layer 109b. With the use of such a material, interface states at interfaces between the semiconductor layer 109a and the semiconductor layer 109b and between the semiconductor layer 109c and the semiconductor layer 109b are less likely to be generated. Accordingly, carriers are not likely to be scattered or captured at the interfaces, which results in an improvement in field-effect mobility of the transistor. Furthermore, variation in threshold voltage (hereinafter also referred to as "$V_{th}$") of the transistor can be reduced. Thus, a semiconductor device having favorable electrical characteristics can be obtained.

When the semiconductor layer 109b is an In-M-Zn oxide containing In, the element M, and Zn at an atomic ratio of $x_2$:$y_2$:$z_2$ and each of the semiconductor layer 109a and the semiconductor layer 109c is an In-M-Zn oxide containing In, M, and Zn at an atomic ratio of $x_1$:$y_1$:$z_1$, $y_1/x_1$ is preferably larger than $y_2/x_2$. Further preferably, the semiconductor layer 109a, the semiconductor layer 109c, and the semiconductor layer 109b in which $y_1/x_1$ is 1.5 or more times as large as $y_2/x_2$ are selected. Still further preferably, the semiconductor layer 109a, the semiconductor layer 109c, and the semiconductor layer 109b in which $y_1/x_1$ is 2 or more times as large as $y_2/x_2$ are selected. Still further preferably, the semiconductor layer 109a, the semiconductor layer 109c, and the semiconductor layer 109b in which $y_1/x_1$ is 3 or more times as large as $y_2/x_2$ are selected. In the semiconductor layer 109b of this case, $y_2$ is preferably larger than or equal to $x_2$ because the transistor can have stable electrical characteristics. However, when $y_2$ is five or more times as large as $x_2$, the field-effect mobility of the transistor is reduced; accordingly, $y_2$ is preferably smaller than five times $x_2$. When the semiconductor layers 109a and 109c each have the above structure, each of the semiconductor layers 109a and 109c can be a layer in which oxygen vacancy is less likely to occur than in the semiconductor layer 109b.

In the case of using an In-M-Zn oxide as the semiconductor layer 109a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor layer 109b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor layer 109c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor layer 109c and the semiconductor layer 109a may be formed using the same type of oxide.

For example, an In—Ga—Zn oxide that is formed using a target having an atomic ratio of In:Ga:Zn=1:3:2, 1:3:4, 1:3:6, 1:4:5, 1:6:4, or 1:9:6 or an In—Ga oxide that is formed using a target having an atomic ratio of In:Ga=1:9 or 7:93 can be used for each of the semiconductor layers 109a and 109c containing In or Ga. Furthermore, an In—Ga—Zn oxide that is formed using a target having an atomic ratio of In:Ga:Zn=1:1:1 or 3:1:2 can be used for the semiconductor layer 109b. Note that the atomic ratio of each of the semiconductor layers 109a, 109b, and 109c may vary within a margin of ±20% of the corresponding atomic ratio.

For the semiconductor layer 109b, an oxide having an electron affinity higher than that of each of the semiconductor layer 109a and the semiconductor layer 109c is used. For example, for the semiconductor layer 109b, an oxide having an electron affinity higher than that of each of the semiconductor layer 109a and the semiconductor layer 109c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the semiconductor layer 109c preferably includes an indium gallium oxide. The gallium atomic ratio [Ga/(In+Ga)] is, for example, higher than or equal to 70%, preferably higher than or equal to 80%, further preferably higher than or equal to 90%.

Note that the semiconductor layer 109a and/or the semiconductor layer 109c may be gallium oxide. For example, when gallium oxide is used for the semiconductor layer 109c, a leakage current generated between the electrode 105 and the semiconductor layer 109 can be reduced. In other words, the off-state current of the transistor 100 can be reduced.

At this time, when a gate voltage is applied, a channel is formed in the semiconductor layer 109b having the highest electron affinity among the semiconductor layers 109a to 109c.

In order to give stable electrical characteristics to the OS transistor, it is preferable that impurities and oxygen vacancies in the oxide semiconductor layer be reduced to highly purify the oxide semiconductor layer so that at least the semiconductor layer 109b can be regarded as an intrinsic or substantially intrinsic oxide semiconductor layer. Furthermore, it is preferable that at least the channel formation region of the semiconductor layer 109b be regarded as an intrinsic or substantially intrinsic semiconductor layer.

The layer 129 (the layer 129a and the layer 129b) may be formed using a material and a method that are similar to those of the semiconductor layer 109. In the case where the layer 129 is formed using an oxide semiconductor layer, an oxide semiconductor layer that is less likely to release oxygen and/or that is less likely to absorb oxygen is preferably used.

[Energy Band Structure of Oxide Semiconductor Layer]

Figure 7A:
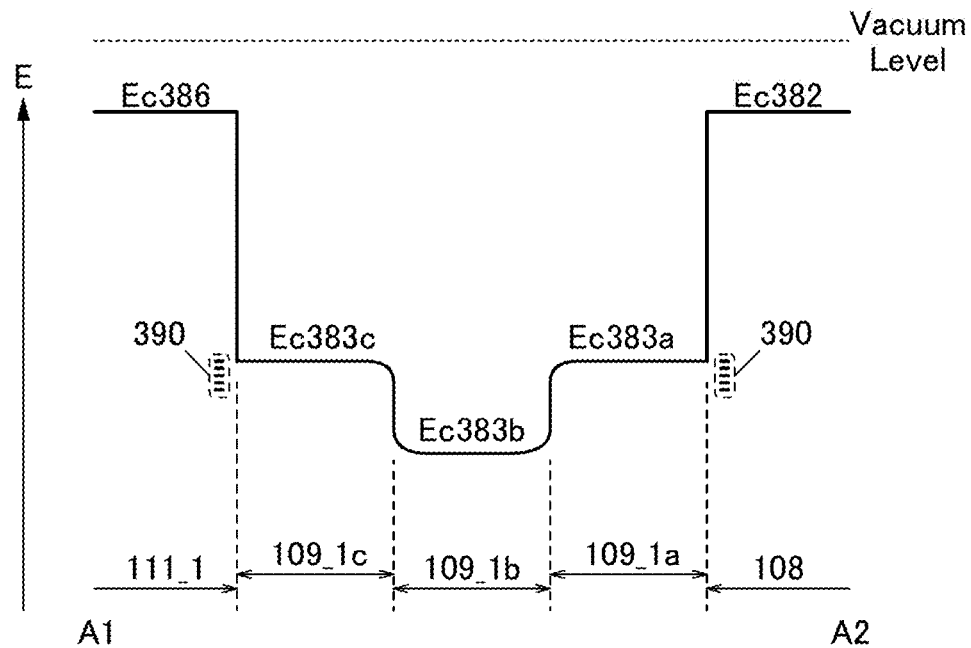
FIGS. 7A and 7B show energy band diagrams of a transistor.
Figure 7B:
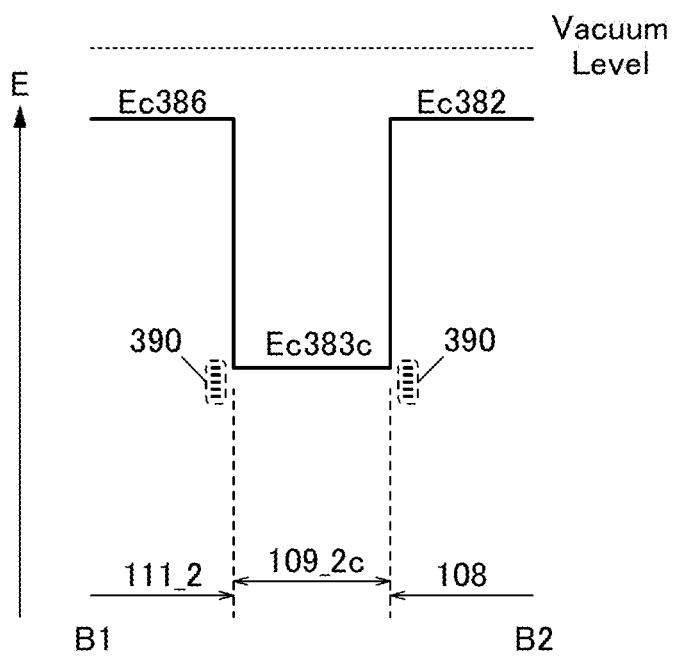

A function and an effect of the semiconductor layer 109 consisting of the stacked semiconductor layers 109_1a, 109_1b, and 109_1c are described using energy band structure diagrams of FIGS. 7A and 7B. FIG. 7A illustrates the energy band structure of a portion along dashed-dotted line A1-A2 in FIGS. 4A and 4B. In other words, FIG. 7A illustrates the energy band structure of a channel formation region of the transistor 100.

In FIG. 7A, Ec382, Ec383a, Ec383b, Ec383c, and Ec386 indicate the energy of the conduction band minimum of the insulating layer 108, the semiconductor layer 109_1a, the semiconductor layer 109_1b, the semiconductor layer 109_1c, and the insulating layer 111_1, respectively.

Here, an electron affinity corresponds to a value obtained by subtracting an energy gap from a difference in energy between the vacuum level and the valence band maximum (the difference is also referred to as "ionization potential"). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.)

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV. An In—Ga—Zn oxide formed using a target with an atomic ratio of In:Ga:Zn=3:1:4 has an energy gap of approximately 2.8 eV and an electron affinity of approximately 4.6 eV. An In—Ga—Zn oxide formed using a target with an atomic ratio of In:Ga:Zn=4:2:4.1 has an energy gap of approximately 3.0 eV and an electron affinity of approximately 4.4 eV.

Since the insulating layers 108 and 111_1 are insulators, Ec382 and Ec386 are closer to the vacuum level than Ec383a, Ec383b, and Ec383c (i.e., the insulating layers 108 and 111_1 have smaller electron affinities than the semiconductor layers 109_1a, 109_1b, and 109_1c).

Ec383a is closer to the vacuum level than Ec383b. Specifically, Ec383a is preferably located closer to the vacuum level than Ec383b by greater than or equal to 0.07 eV and less than or equal to 1.3 eV, further preferably greater than or equal to 0.1 eV and less than or equal to 0.7 eV, further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, further preferably greater than or equal to 0.1 eV and less than or equal to 0.7 eV, further preferably greater than or equal to 0.15 eV and less than or equal to 0.4 eV.

Here, a mixed region of the semiconductor layer 109_1a and the semiconductor layer 109_1b might exist between the semiconductor layer 109_1a and the semiconductor layer 109_1b. A mixed region of the semiconductor layer 109_1b and the semiconductor layer 109_1c might exist between the semiconductor layer 109_1b and the semiconductor layer 109_1c. The mixed region has a low density of interface states. For that reason, the stack including the semiconductor layers 109_1a, 109_1b, and 109_1c has a band structure where energy at each interface and in the vicinity of the interface is changed continuously (continuous junction).

At this time, electrons move mainly in the semiconductor layer 109_1b, not in the semiconductor layer 109_1a and the semiconductor layer 109_1c. Thus, when the interface state density at the interface between the semiconductor layer 109_1a and the semiconductor layer 109_1b and the interface state density at the interface between the semiconductor layer 109_1b and the semiconductor layer 109_1c are decreased, electron movement in the semiconductor layer 109_1b is less likely to be inhibited and the on-state current of the transistor 100 can be increased.

Although trap states 390 due to impurities or defects might be formed at or near the interface between the semiconductor layer 109_1a and the insulating layer 108 and at or near the interface between the semiconductor layer 109_1c and the insulating layer 111_1, the semiconductor layer 109_1b can be separated from the trap states owing to the existence of the semiconductor layer 109_1a and the semiconductor layer 109_1c.

Since the transistor 100 includes the back gate electrode, the channel is formed in the whole of the semiconductor layer 109_1b. Therefore, as the semiconductor layer 109_1b has a larger thickness, the channel formation region becomes larger. In other words, the thicker the semiconductor layer 109_1b is, the larger the on-state current of the transistor 100 is. The thickness of the semiconductor layer 109_1b is 5 nm or larger, preferably 10 nm or larger, further preferably 20 nm or larger, still further preferably 50 nm or larger.

Moreover, the thickness of the semiconductor layer 109_1c is preferably as small as possible to increase the on-state current of the transistor 100. The thickness of the semiconductor layer 109_1c is less than 20 nm, preferably less than or equal to 10 nm, further preferably less than or equal to 5 nm. Meanwhile, the semiconductor layer 109_1c has a function of blocking entry of elements other than oxygen (such as hydrogen and silicon) included in the adjacent insulator into the semiconductor layer 109_1b where a channel is formed. For this reason, it is preferable that the semiconductor layer 109_1c have a certain thickness. The semiconductor layer 109_1c has a thickness of greater than or equal to 0.3 nm, preferably greater than or equal to 1 nm, further preferably greater than or equal to 2 nm.

To improve reliability, preferably, the thickness of the semiconductor layer 109_1a is large. The semiconductor layer 109_1a has a thickness of greater than or equal to 10 nm, preferably greater than or equal to 20 nm, further preferably greater than or equal to 40 nm, still further preferably greater than or equal to 60 nm. When the thickness of the semiconductor layer 109_1a is made large, the distance from an interface between the adjacent insulator (the insulating layer 108) and the semiconductor layer 109_1a to the semiconductor layer 109_1b, in which a channel is formed, can be large. However, to prevent the productivity of the transistor 100 or the semiconductor device including the transistor 100 from being decreased, the semiconductor layer 109_1a has a thickness of, for example, less than or equal to 50 nm, preferably less than or equal to 20 nm, further preferably less than or equal to 10 nm.

The semiconductor layer 109_1a may have a function of blocking entry of elements other than oxygen (such as hydrogen and silicon) included in the adjacent insulator into the semiconductor layer 109_1b, where a channel is formed. The semiconductor layer 109_1a may have an oxygen-blocking property to suppress outward diffusion of oxygen included in the semiconductor layer 109_1b.

In the case where an electrode functioning as a gate electrode or a back gate electrode is provided below the semiconductor layer 109_1a, the thickness of the semiconductor layer 109_1a is preferably as small as possible to increase the on-state current of the transistor 100. In that case, the semiconductor layer 109_1a includes a region with a thickness of less than 20 nm, preferably less than or equal to 10 nm, further preferably less than or equal to 5 nm, for example.

FIG. 7B illustrates the energy band structure of a portion along dashed dotted line B1-B2 in FIG. 6. In other words, FIG. 7B illustrates the energy band structure of a channel formation region of the transistor 200.

In FIG. 7B, Ec382, Ec383c, and Ec386 indicate the energy of the conduction band minimum of the insulating layer 108, that of the semiconductor layer 109_2c, and that of the insulating layer 111_2, respectively. Since a region of the semiconductor layer 109_2c where a channel is formed is in direct contact with the insulating layers 108 and 111_2 in the transistor 200, the transistor 200 is likely to be affected by interface scattering and the trap states 390. Thus, the transistor 200 has a lower on-state current and field-effect mobility than the transistor 100. Furthermore, the transistor 200 has higher $V_{th}$ than the transistor 100. For the semiconductor layer 109_2c, a material similar to that for the semiconductor layer 109a or 109b may be used.

Although the semiconductor layer of the transistor 100 has the above three-layer structure in this embodiment, one embodiment of the present invention is not limited thereto. For example, the semiconductor layer may have a two-layer structure without one of the semiconductor layer 109_1a and the semiconductor layer 109_1c. Alternatively, a single layer structure using any one of the semiconductor layer 109_1a, the semiconductor layer 109_1b, and the semiconductor layer 109_1c may be employed. Alternatively, a four-layer structure in which any one of the above-described semiconductors is provided over or under the semiconductor layer 109_1a or over or under the semiconductor layer 109_1c may be employed. Still alternatively, it is possible to employ an n-layer structure (n is an integer of 5 or more) in which any one of the semiconductors described as examples of the semiconductor layer 109a, the semiconductor layer 109b, and the semiconductor layer 109c is provided at two of the following positions: over the semiconductor layer 109a; under the semiconductor layer 109a; over the semiconductor layer 109c; and under the semiconductor layer 109c.

[Concentration of Impurities in Oxide Semiconductor Layer]

Note that silicon contained in the oxide semiconductor might serve as a carrier trap or a carrier generation source. Therefore, the silicon concentration of the semiconductor layer 109 is preferably as low as possible. For example, a region with a silicon concentration of lower than $1 \times 10^{19}$ atoms/cm$^3$, preferably lower than 5×10$^{18}$ atoms/cm$^3$, further preferably lower than 2×10$^{18}$ atoms/cm$^3$ that is measured by SIMS is provided between the semiconductor layer 109_1b and the semiconductor layer 109_1a. A region with a silicon concentration of lower than 1×10$^{19}$ atoms/cm$^3$, preferably lower than 5×10$^{18}$ atoms/cm$^3$, further preferably lower than 2×10$^{18}$ atoms/cm$^3$ that is measured by SIMS is provided between the semiconductor layer 109_1b and the semiconductor layer 109_1c.

It is preferable to reduce the concentration of hydrogen in the semiconductor layer 109_1a and the semiconductor layer 109_1c in order to reduce the concentration of hydrogen in the semiconductor layer 109_1b. The semiconductor layer 109_1a and the semiconductor layer 109_1c each have a region in which the concentration of hydrogen measured by SIMS is lower than or equal to 2×10$^{20}$ atoms/cm$^3$, preferably lower than or equal to 5×10$^{19}$ atoms/cm$^3$, further preferably lower than or equal to 1×10$^{19}$ atoms/cm$^3$, still further preferably lower than or equal to 5×10$^{18}$ atoms/cm$^3$.

It is preferable to reduce the concentration of nitrogen in the semiconductor layer 109_1a and the semiconductor layer 109_1c in order to reduce the concentration of nitrogen in the semiconductor layer 109_1b. The semiconductor layer 109_1a and the semiconductor layer 109_1c each have a region in which the concentration of nitrogen measured by SIMS is lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the semiconductor layers 109b and 109_2c is preferably as low as possible. For example, the semiconductor layer 109b preferably has a region in which the copper concentration is lower than or equal to 1×10$^{19}$ atoms/cm$^3$, lower than or equal to 5×10$^{18}$ atoms/cm$^3$, or lower than or equal to 1×10$^{18}$ atoms/cm$^3$.

<Deposition Method>

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, a pulsed laser deposition (PLD) method, a dipping method, a spray coating method, a droplet discharge method (such as an inkjet method), or a printing method (such as screen printing or offset printing).

By using a PECVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

In the case where a film is formed by an ALD method, a gas that does not contain chlorine is preferably used as a material gas.

<Example of Method for Manufacturing Semiconductor Device 1000>

An example of a method for manufacturing the semiconductor device 1000 is described with reference to FIGS. 8A to 8E, FIGS. 9A to 9D, FIGS. 10A to 10C, FIGS. 11A to 11D, FIGS. 12A to 12C, FIGS. 13A to 13C, FIGS. 14A and 14B, and FIGS. 15A and 15B. An L1-L2 cross section in each of FIGS. 8A to 15B corresponds to the cross section taken along dashed-dotted line L1-L2 in FIG. 2. An L3-L4 cross section in each of FIGS. 8A to 15B corresponds to the cross section taken along dashed-dotted line L3-L4 in FIG. 2.

[Step 1]

Figure 8A:
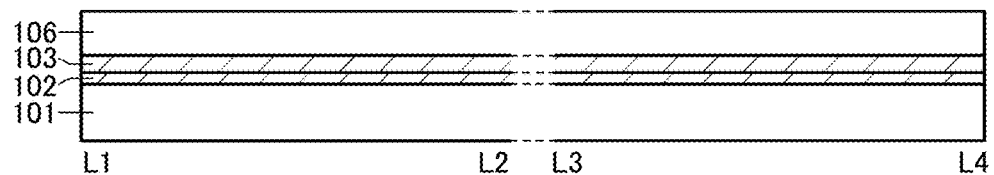
FIGS. 8A to 8E illustrate a method for manufacturing a semiconductor device.

First, the insulating layer 102, the insulating layer 103, and the insulating layer 106 are sequentially formed over the substrate 101 (see FIG. 8A). In this embodiment, a single crystal silicon substrate (a p-type semiconductor substrate or an n-type semiconductor substrate) is used as the substrate 101.

In this embodiment, a silicon nitride film is formed by a CVD method as the insulating layer 102. In this embodiment, an aluminum oxide film is formed by an ALD method as the insulating layer 103. A dense insulating layer including reduced defects such as cracks or pinholes or having a uniform thickness can be formed by an ALD method. In this embodiment, a silicon oxide film is formed by a CVD method as the insulating layer 106.

[Step 2]

Next, a resist mask is formed over the insulating layer 106 (not illustrated). The resist mask can be formed by a photolithography method, a printing method, an inkjet method, or the like as appropriate. Formation of the resist mask by a printing method, an inkjet method, or the like needs no photomask; thus, manufacturing cost can be reduced.

The formation of the resist mask by a photolithography method can be performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

Figure 8B:
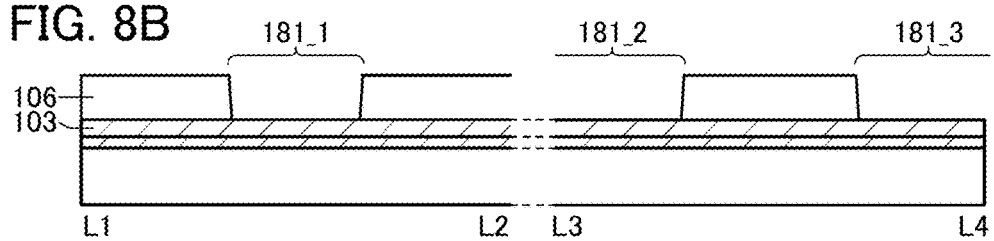

With the use of the resist mask as a mask, a portion of the insulating layer 106 is selectively removed to form an opening 181_1 to an opening 181_3 (see FIG. 8B). After that, the resist mask is removed. When the openings are formed, a portion of the insulating layer 103 is also removed in some cases. The insulating layer 106 can be removed by a dry etching method, a wet etching method, or the like. Both the dry etching method and the wet etching method may be used.

[Step 3]

Figure 8C:
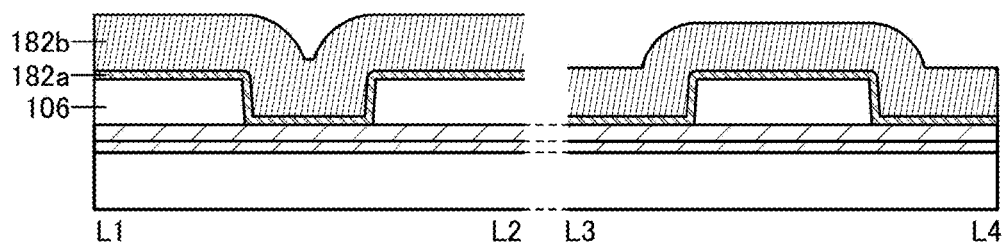

Next, a conductive layer 182a and a conductive layer 182b are formed over the insulating layers 103 and 106 (see FIG. 8C). In this embodiment, a tantalum nitride film is formed by a sputtering method as the conductive layer 182a. A tungsten film is formed by a sputtering method as the conductive layer 182b.

[Step 4]

Figure 8D:
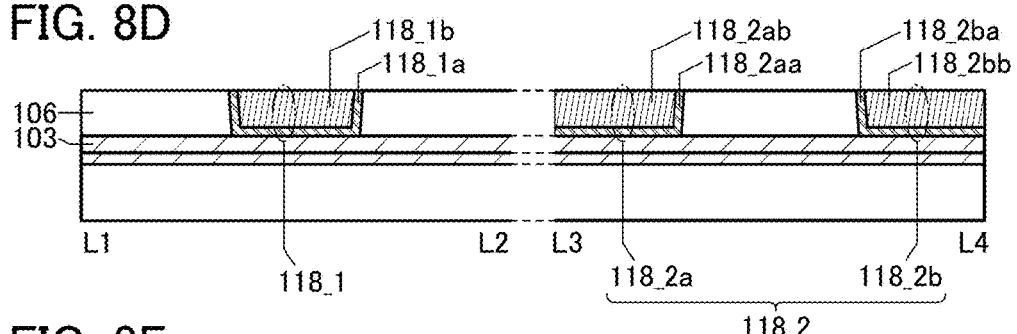

Next, chemical mechanical polishing (CMP) treatment (hereinafter also referred to as "CMP treatment") is performed (see FIG. 8D). By the CMP treatment, a portion of the conductive layer 182a is removed, so that the wiring 118_1a, a wiring 118_2aa, and a wiring 118_2ba are formed. In addition, a portion of the conductive layer 182b is removed, so that the wiring 118_1b, a wiring 118_2ab, and a wiring 118_2bb are formed. At this time, a portion of a surface of the insulating layer 106 is also removed in some cases. By the CMP treatment, unevenness of the sample surface can be reduced, and coverage with an insulating layer or a conductive layer to be formed later can be increased.

Note that the wiring 118_1 includes the wiring 118_1a and the wiring 118_1b. The wiring 118_2a includes the wiring 118_2aa and the wiring 118_2ab. The wiring 118_2b includes the wiring 118_2ba and the wiring 118_2bb.

[Step 5]

Figure 8E:
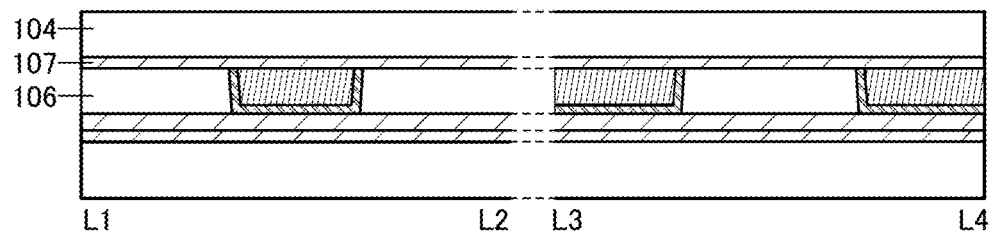

Next, the insulating layer 107 and the insulating layer 104 are sequentially formed (see FIG. 8E). In this embodiment, a 5-nm-thick aluminum oxide film is formed as the insulating layer 107 by an ALD method. Furthermore, a 30-nm-thick silicon oxynitride film is formed as the insulating layer 104 by a CVD method.

The insulating layer 104 may contain excess oxygen. The insulating layer 104 may be subjected to oxygen doping treatment. After the insulating layer 104 is formed, it is preferable to perform heat treatment so that hydrogen and moisture contained in the insulating layer 104 are reduced. Oxygen doping treatment may be performed after the heat treatment. For example, the oxygen doping treatment may be performed while the substrate is heated to 400° C. and a gas containing argon and oxygen is excited at a frequency of 2.45 GHz. The heat treatment and the oxygen doping treatment may be performed plural times.

The insulating layer 104 may be exposed to a plasma atmosphere of nitrogen and/or an inert gas. When the insulating layer 104 is exposed to the plasma atmosphere of nitrogen and/or an inert gas, impurities such as hydrogen and carbon on the surface of the insulating layer 104 or in its vicinity can be reduced. For example, the insulating layer 104 may be exposed to a plasma atmosphere in which a gas containing argon and nitrogen is excited at a frequency of 2.45 GHz while the substrate is heated to 400° C.

For example, the heat treatment is performed in an inert atmosphere of nitrogen, a rare gas, or the like, an oxidizing atmosphere, or an ultra-dry air atmosphere (the moisture amount is 20 ppm (−55° C. by conversion into a dew point) or less, preferably 1 ppm or less, further preferably 10 ppb or less, in the case where the measurement is performed with a dew point meter in a cavity ring down laser spectroscopy (CRDS) system). Note that the "oxidizing atmosphere" refers to an atmosphere including an oxidation gas such as oxygen, ozone, or nitrogen oxide at 10 ppm or higher. The inert atmosphere refers to an atmosphere that includes the oxidation gas at lower than 10 ppm and is filled with nitrogen or a rare gas. The pressure during the heat treatment is not particularly limited; however, the heat treatment is preferably performed under a reduced pressure.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

[Step 6]

Next, a resist mask is formed over the insulating layer 104 (not illustrated). With the use of the resist mask as a mask, a portion of the insulating layer 104 and a portion of the insulating layer 107 are selectively removed to form an opening 183 including a region overlapping with the wiring 118_1 (see FIG. 9A). A portion of the wiring 118_1 is exposed in the opening 183. After that, the resist mask is removed. When the opening 183 is formed, a portion of the wiring 118_1 is also removed in some cases. The insulating layer 104 and the insulating layer 107 can be removed by a dry etching method, a wet etching method, or the like. Both the dry etching method and the wet etching method may be used.

[Step 7]

Figure 9A:
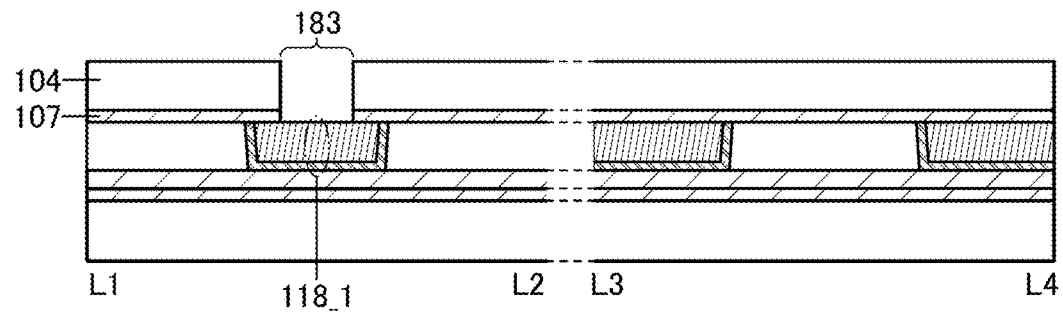
FIGS. 9A to 9D illustrate a method for manufacturing a semiconductor device.
Figure 9B:
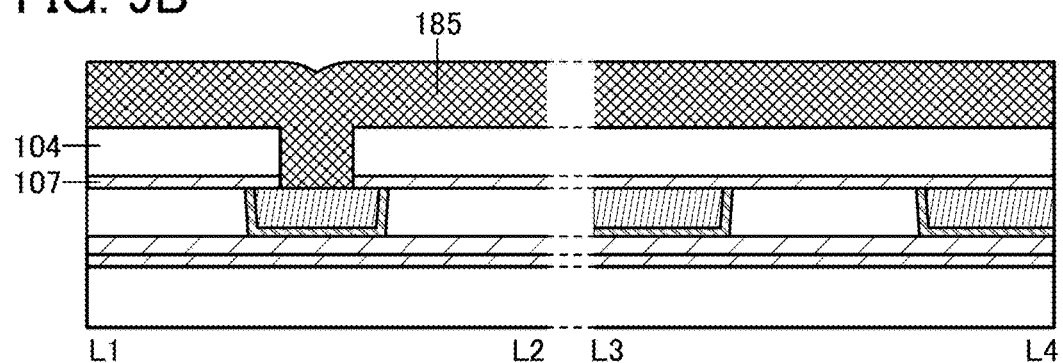

Next, a conductive layer 185 is formed (see FIG. 9B). In this embodiment, as the conductive layer 185, a tantalum nitride film is formed by a sputtering method.

[Step 8]

Figure 9C:
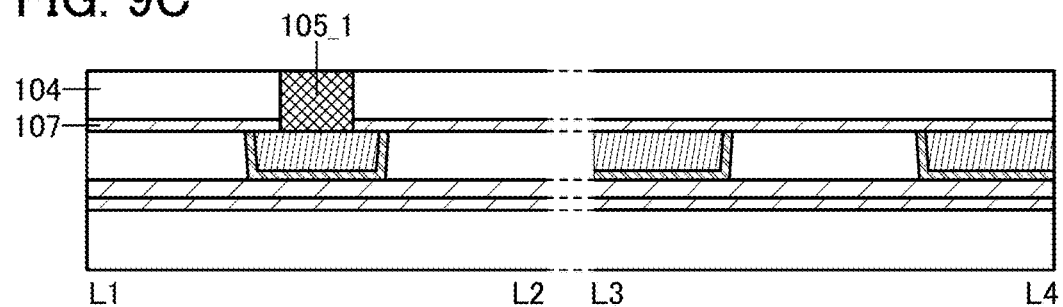

Next, CMP treatment is performed (see FIG. 9C). By CMP treatment, a portion of the conductive layer 185 is removed to form the electrode 105_1. At this time, a portion of a surface of the insulating layer 104 is also removed in some cases. By the CMP treatment, unevenness of the sample surface can be reduced, and coverage with an insulating layer or a conductive layer to be formed later can be increased.

[Step 9]

Figure 9D:
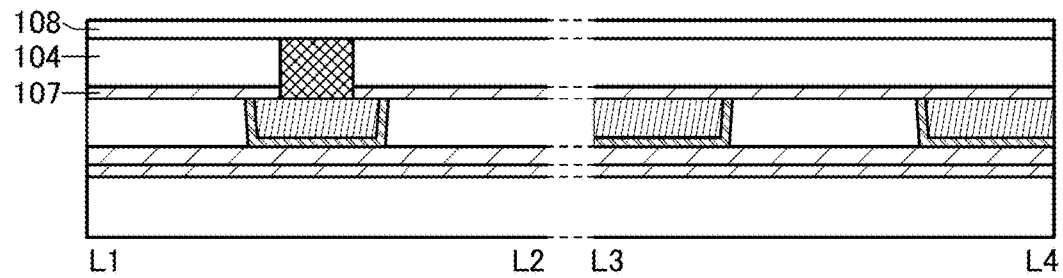

Next, the insulating layer 108 is formed (see FIG. 9D). In this embodiment, a 20-nm-thick silicon oxynitride film is formed by a CVD method. As described above, the insulating layer 108 is preferably an insulating layer containing excess oxygen. The insulating layer 108 may be subjected to oxygen doping treatment. After the insulating layer 108 is formed, it is preferable to perform heat treatment so that hydrogen and moisture contained in the insulating layer 108 are reduced. Oxygen doping treatment may be performed after the heat treatment. The heat treatment and the oxygen doping treatment may be performed plural times.

The insulating layer 108 may be exposed to a plasma atmosphere of nitrogen and/or an inert gas. When the insulating layer 108 is exposed to the plasma atmosphere of nitrogen and/or an inert gas, impurities such as hydrogen and carbon on the surface of the insulating layer 108 or in its vicinity can be reduced.

[Step 10]

Figure 10A:
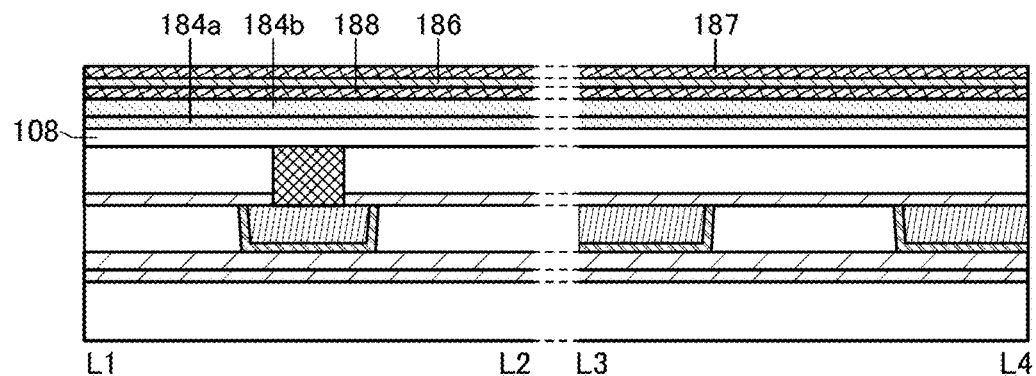
FIGS. 10A to 10C illustrate a method for manufacturing a semiconductor device.
Figure 10B:
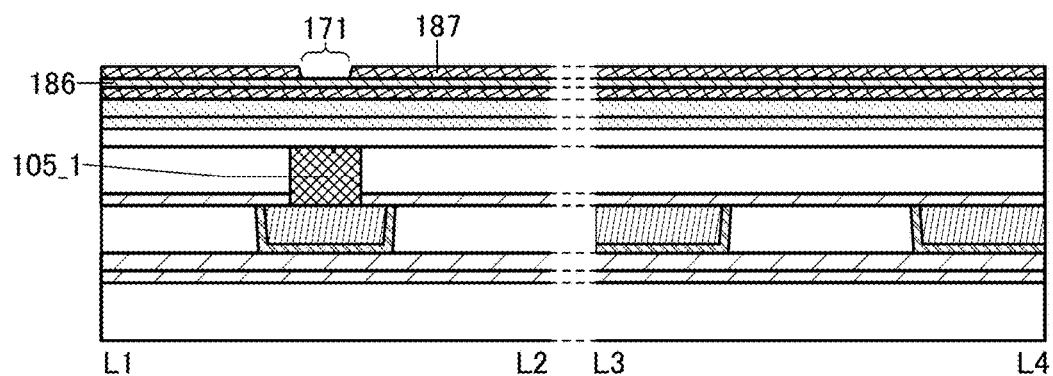

Next, a semiconductor layer 184a, a semiconductor layer 184b, a conductive layer 188, a layer 186, and a layer 187 are sequentially formed (see FIG. 10A). In this embodiment, the semiconductor layer 184a is formed by a sputtering method using a target having a composition of In:Ga:Zn=1:3:4. Oxygen or a mixed gas of oxygen and a rare gas is used as a sputtering gas. The proportion of oxygen in the sputtering gas is preferably 70% or more, further preferably 80% or more, still further preferably 100%. By increasing the proportion of oxygen in the sputtering gas, the amount of excess oxygen in the semiconductor layer 184a can be increased. When a semiconductor layer containing excess oxygen is used as the semiconductor layer 184a, oxygen can be supplied to the semiconductor layer 184b, which is to be the semiconductor layer 109b, by later heat treatment.

At the formation of the semiconductor layer 184a, part of oxygen contained in the sputtering gas is supplied to the insulating layer 108. As the amount of oxygen contained in the sputtering gas increases, the amount of oxygen supplied to the insulating layer 108 also increases. Part of oxygen supplied to the insulating layer 108 reacts with hydrogen left in the insulating layer 108 to produce water and the water is released from the insulating layer 108 by later heat treatment. Thus, the hydrogen concentration in the insulating layer 108 can be reduced. When excess oxygen in the insulating layer 108 is increased, oxygen can be supplied to the semiconductor layer 184b, which is to be the semiconductor layer 109b, by later heat treatment.

The semiconductor layer 184b is formed by a sputtering method using a target having a composition of In:Ga:Zn=4:2:4.1. At this time, when the proportion of oxygen in the sputtering gas is higher than or equal to 1% and lower than or equal to 30%, preferably higher than or equal to 5% and lower than or equal to 20%, an oxygen-deficient oxide semiconductor layer is formed. A transistor including an oxygen-deficient oxide semiconductor layer can have relatively high field-effect mobility.

Note that in the case where an oxygen-deficient oxide semiconductor layer is used as the semiconductor layer 184b, a semiconductor layer containing excess oxygen is preferably used as the semiconductor layer 184a.

The semiconductor layer 184b may be formed by a sputtering method using a target having a composition of In:Ga:Zn=1:1:1. The use of such an oxide semiconductor layer makes it possible to provide a highly reliable transistor.

In this embodiment, as the conductive layer 188 and the layer 187, a tantalum nitride film is formed by a sputtering method. Furthermore, an aluminum oxide film is formed by an ALD method as the layer 186.

By introducing impurity elements into the semiconductor layer 184b after the semiconductor layer 184b is formed, the threshold voltage of the transistor 100 can be changed. Impurity elements can be introduced by an ion implantation method, an ion doping method, a plasma immersion ion implantation method, plasma treatment using a gas containing impurity elements, or the like. In the case where impurity elements are introduced by an ion implantation method or the like, the introduction may be performed after the conductive layer 188 is formed, after the layer 186 is formed, or after the layer 187 is formed.

After the semiconductor layer 184b is formed, oxygen doping treatment and/or heat treatment may be performed. The heat treatment and/or the oxygen doping treatment may be performed plural times.

[Step 11]

Next, a resist mask is formed over the layer 187 by a photolithography method (not illustrated). With the use of the resist mask as a mask, a portion of the layer 187 is selectively removed to form an opening 171 (see FIG. 10B). A portion of the layer 186 is exposed at the opening 171. There is a region where the opening 171 and the electrode 105_1 overlap with each other.

[Step 12]

Figure 10C:
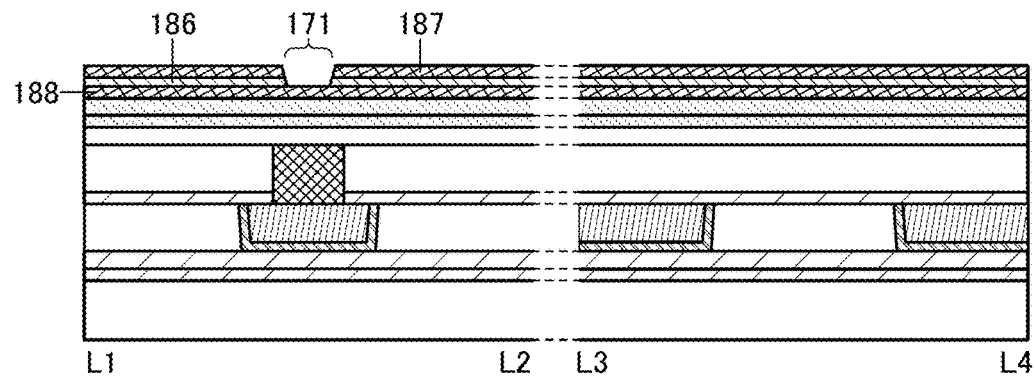

Subsequently, a portion of the layer 186 is selectively removed with the use of the layer 187 having the opening 171 as a mask (see FIG. 10C). At this time, the conductive layer 188 in a region overlapping with the opening 171 is exposed.

[Step 13]

Next, the layer 186 is exposed by removing the layer 187. At the same time as the removal of the layer 187, the conductive layer 188 in the region overlapping with the opening 171 is also removed, so that the semiconductor layer 184b in the region overlapping with the opening 171 is exposed (see FIG. 11A). Note that an exposed portion of the semiconductor layer 184b is removed in some cases.

The cross-sectional shape of the side surface of the opening 171 is preferably tapered. The taper angle θ of the side surface of the opening 171 is preferably greater than or equal to 20° and less than 90°, further preferably greater than or equal to 30° and less than 80°, still further preferably greater than or equal to 40° and less than 70°. Note that the taper angle θ refers to an angle formed by the side surface and bottom surface of a layer having a tapered shape when the layer is seen from the cross-section direction of the layer (i.e., the plane perpendicular to the surface of the substrate). The taper angle θ shown in FIG. 11A is an angle of an outer side of the opening 171, which is an angle formed by a bottom surface of the conductive layer 188 and a side surface of the conductive layer 188 that are in contact with the opening 171. Alternatively, the taper angle θ shown in FIG. 11A is an angle of an outer side of the opening 171, which is an angle formed by the bottom surface of the conductive layer 188 and a side surface of the layer 186 that are in contact with the opening 171. The tapered shape having a taper angle θ smaller than 90° is called a forward tapered shape, and the tapered shape having a taper angle θ larger than or equal to 90° is called an inverse tapered shape.

When the opening 171 has a tapered shape, disconnection of a layer formed thereover can be prevented; thus, the coverage can be improved. Furthermore, when the end portions of the conductive layer are tapered, the concentration of an electric field of the upper end portion of the conductive layer can be relaxed. When the taper angle θ is too small, miniaturization of transistors is difficult or the size of an opening, the width of a wiring, or the like is significantly varied in some cases.

The side surface of the opening 171 (the side surface of the conductive layer 188 and/or the side surface of the layer 186) may have a step-like shape. When the side surface has a step-like shape, disconnection of a layer formed thereover can be prevented, so that the coverage can be improved. This is not limited to the side surface of the opening 171, and when the end portion of each layer has a forward tapered shape or a step-like shape, disconnection of a layer formed thereover (disconnection caused by a step) can be prevented, so that the coverage becomes favorable.

When the opening 171 is formed by a dry etching method, impurity elements such as remaining components of an etching gas are attached to the exposed portion of the semiconductor layer 184b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases.

The impurity elements attached to the exposed surface of the semiconductor layer 184b are preferably reduced by cleaning treatment described later.

[Step 14]

Next, a resist mask is formed by a photolithography method (not illustrated). With the use of the resist mask as a mask, a portion of each of the semiconductor layer 184a, the semiconductor layer 184b, the conductive layer 188, and the layer 186 is selectively removed, so that the semiconductor layer 109_1a, the semiconductor layer 109_1b, the electrode 110_1a, the electrode 110_1b, the layer 129_1a, and the layer 129_1b are formed (see FIG. 11B). At this time, the insulating layer 108 might be partly removed, thereby having a projection.

When the semiconductor layer 109_1a, the semiconductor layer 109_1b, the electrode 110_1a, the electrode 110_1b, the layer 129_1a, and the layer 129_1b are formed by a dry etching method, impurity elements such as remaining components of an etching gas are attached to the exposed portion of the insulating layer 108 in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. Because of the formation of the resist mask, impurity elements such as carbon are attached to the surface of the semiconductor layer 109_1b that is exposed at the opening 171 in some cases.

The impurity elements attached to the exposed surfaces of the insulating layer 108 and the semiconductor 109_1b are preferably reduced. The impurity elements can be reduced by cleaning treatment using dilute hydrofluoric acid or the like, cleaning treatment using ozone or the like, or cleaning treatment using ultraviolet rays or the like. Plasma treatment using an oxidation gas may be performed. For example, plasma treatment using a nitrous oxide gas may be performed. By the plasma treatment, fluorine and the like attached on the exposed surface can be reduced. Moreover, the plasma treatment is effective in removing an organic substance. Note that different types of cleaning treatment may be combined. Cleaning treatment and plasma treatment may be combined. Cleaning treatment and/or plasma treatment may be performed after Step 11 and/or after Step 13.

Here, a region of the semiconductor layer 109_1b that overlaps with the electrode 110_1a is referred to as the region 189a. A region of the semiconductor layer 109_1b that overlaps with the electrode 110_1b is referred to as the region 189b. A region of the semiconductor layer 109_1b that is located between the region 189a and the region 189b in the plan view is referred to as the region 189c (see FIG. 11C). One of the region 189a and the region 189b functions as one of the source region and the drain region of the transistor 100 in some cases. The other of the region 189a and the region 189b functions as the other of the source region and the drain region of the transistor 100 in some cases. A channel of the transistor 100 is formed in the region 189c.

Note that the introduction of impurity elements into the semiconductor layer 184b (the semiconductor layer 109_1b) that is described in Step 10 may be performed after Step 14.

Oxygen doping treatment may be performed after Step 14. Furthermore, heat treatment may be performed after Step 13.

[Step 15]

Figure 11D:
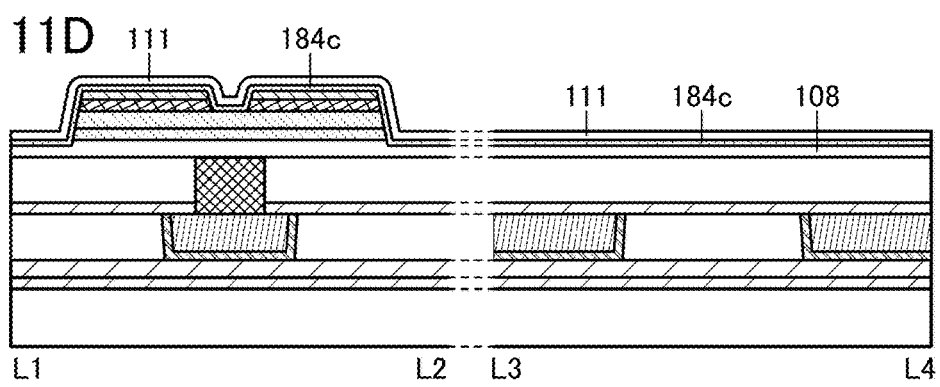

A semiconductor layer 184c and the insulating layer 111 are sequentially formed (see FIG. 11D). In this embodiment, an oxide semiconductor containing excess oxygen that is formed under the same conditions as those of the semiconductor layer 184a is used for the semiconductor layer 184c. Since the transmittance of oxygen in an oxide semiconductor depends on the composition, the composition of the oxide semiconductor to be used may be determined in accordance with the purpose as appropriate. For example, the semiconductor layer 184c may be formed using a target having a composition of In:Ga:Zn=1:3:4. When the semiconductor layer containing excess oxygen is used as the semiconductor layer 184c, oxygen can be supplied to the semiconductor layer 109_1b by later heat treatment.

At the formation of the semiconductor layer 184c, part of oxygen contained in the sputtering gas is supplied to the insulating layer 108, as in the case of the semiconductor layer 184a. At the formation of the semiconductor layer 184c, part of oxygen contained in the sputtering gas is supplied to the insulating layer 109_1b. In other words, excess oxygen is supplied to the insulating layer 108 and the semiconductor layer 109_1b. Part of oxygen supplied to the insulating layer 108 reacts with hydrogen left in the insulating layer 108 to produce water and the water is released from the insulating layer 108 by later heat treatment. Thus, the hydrogen concentration in the insulating layer 108 can be reduced.

After the insulating layer 111 is formed, oxygen doping treatment and/or heat treatment may be performed. The heat treatment and/or the oxygen doping treatment may be performed plural times. The insulating layer 111 may be exposed to a plasma atmosphere of nitrogen and/or an inert gas. When the insulating layer 111 is exposed to the plasma atmosphere of nitrogen and/or an inert gas, impurities such as hydrogen and carbon on the surface of the insulating layer 111 or in its vicinity can be reduced.

[Step 16]

Figure 12A:
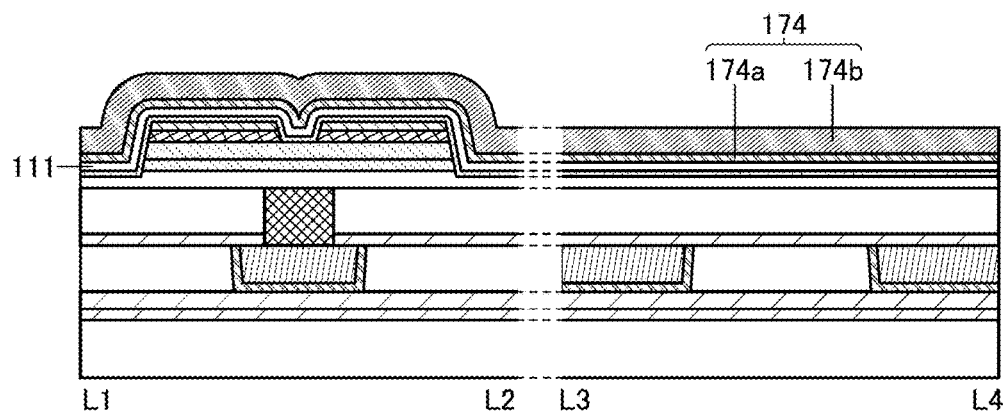
FIGS. 12A to 12C illustrate a method for manufacturing a semiconductor device.
Figure 12B:
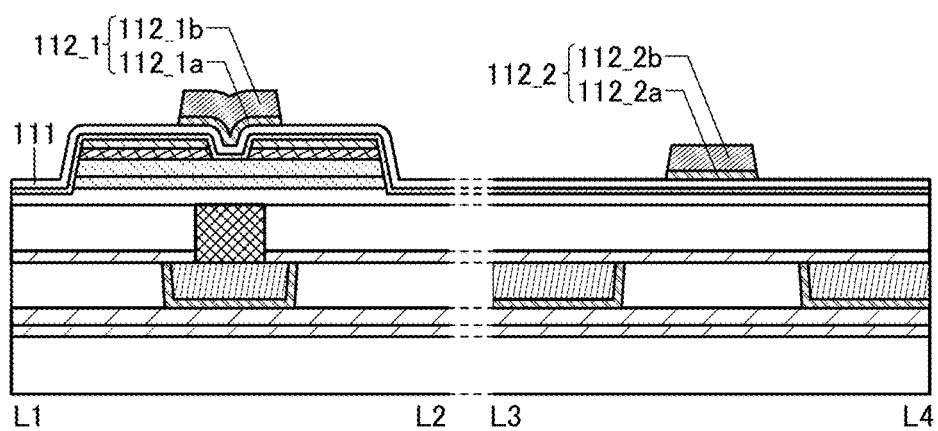

Then, a conductive layer 174 is formed over the insulating layer 111 (see FIG. 12A). In this embodiment, an example in which the conductive layer 174 is a stacked layer of a conductive layer 174a and a conductive layer 174b is described. In this embodiment, for the conductive layer 174a, indium gallium zinc oxide is used. For example, the conductive layer 174a is formed by a sputtering method using a target having a composition of In:Ga:Zn=4:2:4.1. The proportion of oxygen in the sputtering gas is preferably 70% or more, further preferably 80% or more, still further preferably 100%. At the formation of the conductive layer 174a, part of oxygen contained in the sputtering gas is supplied to the insulating layer 111 in some cases. As the amount of oxygen contained in the sputtering gas increases, the amount of oxygen supplied to the insulating layer 111 tends to increase.

In this embodiment, a stacked film of titanium nitride and tungsten is formed as the conductive layer 174b by a sputtering method.
[Step 17]

Next, a resist mask is formed by a photolithography method (not illustrated). With the use of the resist mask as a mask, a portion of the conductive layer 174 is selectively removed, so that the electrode 112_1 (the electrode 112_1a and the electrode 112_1b) and the electrode 112_2 (the electrode 112_2a and the electrode 112_2b) are formed (see FIG. 12B).

After the resist mask is removed, the electrodes 112_1 and 112_2 and the insulating layer 11 may be exposed to a plasma atmosphere of nitrogen and/or an inert gas. When the electrodes 112_1 and 112_2 and the insulating layer 111 are exposed to the plasma atmosphere of nitrogen and/or an inert gas, impurities such as hydrogen and carbon on the surfaces of the electrodes 112_1 and 112_2 and the insulating layer 111 or in the vicinity can be reduced.
[Step 18]

Figure 12C:
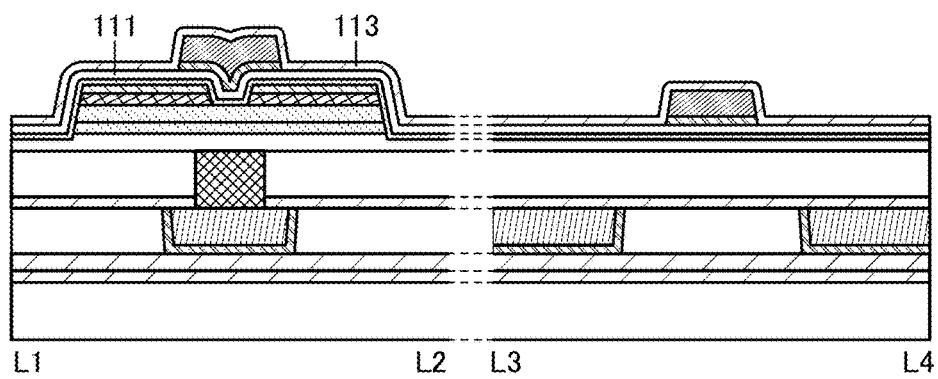

Next, the insulating layer 113 is formed (see FIG. 12C). In this embodiment, an aluminum oxide film is formed by an ALD method as the insulating layer 113.

When the insulating layer 114 to be formed later and the electrode 112 are in direct contact with each other, depending on the material used for the electrode 112, oxygen in the insulating layer 114 is absorbed by the electrode 112 in heat treatment to be performed later, so that the amount of oxygen supplied to the semiconductor layer 109 might be insufficient. The resistance of the electrode 112 might be increased by oxidizing the electrode 112. By covering the electrode 112 with the insulating layer 113 before the insulating layer 114 is formed, oxygen contained in the insulating layer 114 can be prevented from moving to the electrode 112.

By forming the insulating layer 113 by an ALD method, oxidation of the electrode 112 at the formation of the insulating layer 113 can be prevented.

The insulating layer 113 may be exposed to a plasma atmosphere of nitrogen and/or an inert gas. When the insulating layer 113 is exposed to the plasma atmosphere of nitrogen and/or an inert gas, impurities such as hydrogen and carbon on the surface of the insulating layer 113 or in its vicinity can be reduced.

Note that in the case where the electrode 112 is formed using a material which is less likely to absorb oxygen, the insulating layer 113 is not necessarily formed.
[Step 19]

Next, a resist mask is formed over the insulating layer 113 by a photolithography method (not illustrated). With the use of the resist mask as a mask, a portion of each of the insulating layer 113, the insulating layer 111, and the semiconductor layer 184c is selectively removed, so that the insulating layer 113_1, the insulating layer 113_2, the insulating layer 111_1, the insulating layer 111_2, the semiconductor layer 109_1c, and the semiconductor layer 109_2c are formed (see FIG. 13A).

The insulating layer 113_1 and the insulating layer 111_1 overlap with each other on an outer side of an end portion of the electrode 112_1. The insulating layer 113_2 and the insulating layer 111_2 overlap with each other on an outer side of an end portion of the electrode 112_2. The insulating layers 113_2 and 111_2 and the semiconductor layer 109_2c include a region overlapping with the wiring 118_2a and a region overlapping with the wiring 118_2b.

After the resist mask is removed, exposed surfaces may be exposed to a plasma atmosphere of nitrogen and/or an inert gas. When the exposed surfaces are exposed to the plasma atmosphere of nitrogen and/or an inert gas, impurities such as hydrogen and carbon on the exposed surfaces or in the vicinity can be reduced.
[Step 20]

Next, the insulating layer 114 and the insulating layer 115 are sequentially formed (see FIG. 13B). In this embodiment, a silicon oxynitride film is formed by a CVD method as the insulating layer 114. The insulating layer 114 is preferably an insulating layer containing excess oxygen. After the formation of the insulating layer 114, CMP treatment is preferably performed on the sample surface to reduce unevenness of the sample surface.

In this embodiment, an aluminum oxide film is formed by a sputtering method as the insulating layer 115. At this time, part of oxygen used as a sputtering gas is introduced into the insulating layer 114, whereby a region 114a to be an insulating layer containing excess oxygen is formed.

Part of oxygen in the insulating layer 114 reacts with hydrogen left in the insulating layer 114 to be water in some cases. Thus, in the case where the insulating layer 115 is removed and heat treatment is performed after the insulating layer 115 is formed, hydrogen left in the insulating layer 114 can be released as water. When the formation of the insulating layer 115, the removal of the insulating layer 115, and the heat treatment are repeated sequentially a plurality of times, the hydrogen concentration in the insulating layer 114 can be further reduced.

When oxygen doping treatment and heat treatment are performed after the formation of the insulating layer 114 before the formation of the insulating layer 115, hydrogen left in the insulating layer 114 can be released as water. When the oxygen doping treatment and the heat treatment are repeated sequentially a plurality of times, the hydrogen concentration in the insulating layer 114 can be further reduced.

The insulating layer 114 may be exposed to a plasma atmosphere of nitrogen and/or an inert gas. When the insulating layer 114 is exposed to the plasma atmosphere of nitrogen and/or an inert gas, impurities such as hydrogen and carbon on the surface of the insulating layer 114 or in its vicinity can be reduced.

After the formation of the insulating layer 115, oxygen doping treatment may be performed. The insulating layer 115 may be exposed to a plasma atmosphere of nitrogen and/or an inert gas.

By providing the layer 129 (the layer 129_1a and the layer 129_1b), oxygen in the insulating layer 114 can be less likely to be absorbed by the electrode 110 (the electrode 110_1a and the electrode 110_1b). Furthermore, by providing the insulating layer 113 (the insulating layer 113_1 and the insulating layer 113_2), oxygen in the insulating layer 114 can be less likely to be absorbed by the electrode 112 (the electrode 112_1 and the electrode 112_2). Thus, an increase in resistance of the electrodes 110 and 112 due to oxidation can be suppressed. Furthermore, the shortage of oxygen supplied to the semiconductor layer 109 can be prevented.
[Step 21]

Next, a resist mask is formed over the sample surface by a photolithography method (not illustrated). With the use of the resist mask as a mask, a portion of each of the insulating layer 115, the insulating layer 114, and the layer 129_1a is removed, so that the opening 192_1a is formed (see FIG. 13C). The opening 192_1a includes a region overlapping with the electrode 110_1a. A portion of each of the insulating layer 115, the insulating layer 114, and the layer 129_1b is removed, so that the opening 192_1b is formed. The opening 192_1b includes a region overlapping with the electrode 110_1b. A portion of each of the insulating layer 115, the insulating layer 114, and the insulating layer 113_1 is removed, so that the opening 192_1c is formed (not illustrated). The opening 192_1c includes a region overlapping with the electrode 112_1.

A portion of each of the insulating layer 115, the insulating layer 114, the insulating layer 113_2, the insulating layer 111_2, the semiconductor layer 109_2c, the insulating layer 108, the insulating layer 104, and the insulating layer 107 is removed, so that the opening 192_2a and the opening 192_2b are formed. The opening 192_2a includes a region overlapping with the wiring 118_2a. The opening 192_2b includes a region overlapping with the wiring 118_2b. A portion of each of the insulating layer 115, the insulating layer 114, and the insulating layer 113_2 is removed, so that the opening 192_2c is formed. The opening 192_2c includes a region overlapping with the electrode 112_2.

The opening 192_2a includes a region where the portion of the semiconductor layer 109_2c is exposed. The opening 192_2b includes a region where the portion of the semiconductor layer 109_2c is exposed.

An exposed portion of the electrode 110_1a is etched at the formation of the opening 192_1a in some cases. An exposed portion of the electrode 110_1b is etched at the formation of the opening 192_1b in some cases. An exposed portion of the electrode 112_1 is etched at the formation of the opening 192_1c in some cases. An exposed portion of the wiring 118_2a is etched at the formation of the opening 192_2a in some cases. An exposed portion of the wiring 118_2b is etched at the formation of the opening 192_2b in some cases. An exposed portion of the electrode 112_2 is etched at the formation of the opening 192_2c in some cases.

The opening 192 can be removed by a dry etching method, a wet etching method, or the like. Both the dry etching method and the wet etching method may be used. The dry etching method is preferably employed to form an opening with a high aspect ratio. Depending on the etching conditions, the electrode 110, the electrode 112, and the wiring 118 can serve as etching stoppers.

[Step 22]

Figure 14A:
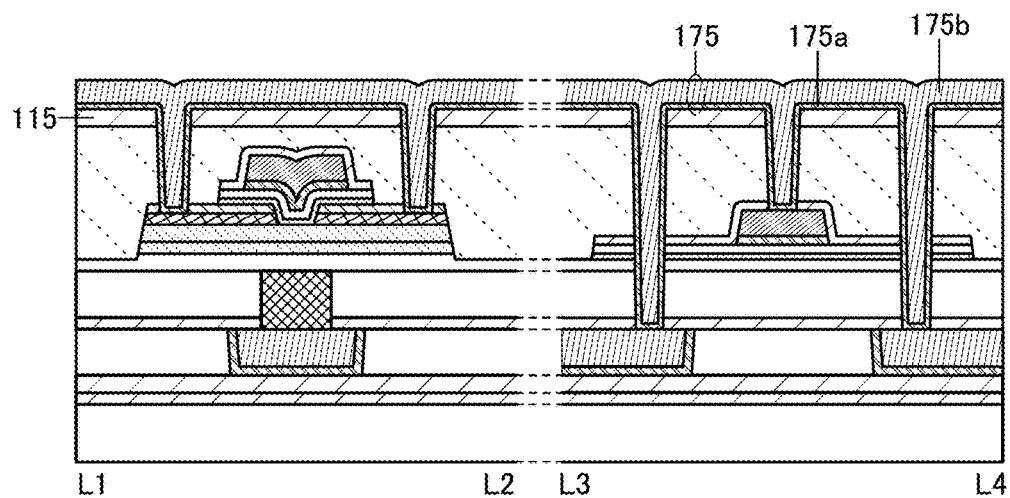
FIGS. 14A and 14B illustrate a method for manufacturing a semiconductor device.

Then, a conductive layer 175 is formed (see FIG. 14A). In this embodiment, an example in which the conductive layer 175 is a stacked layer of a conductive layer 175a and a conductive layer 175b is described. In this embodiment, a titanium nitride film is formed by an ALD method as the conductive layer 175a. A tungsten film is formed by an ALD method as the conductive layer 175b.

[Step 23]

Figure 14B:
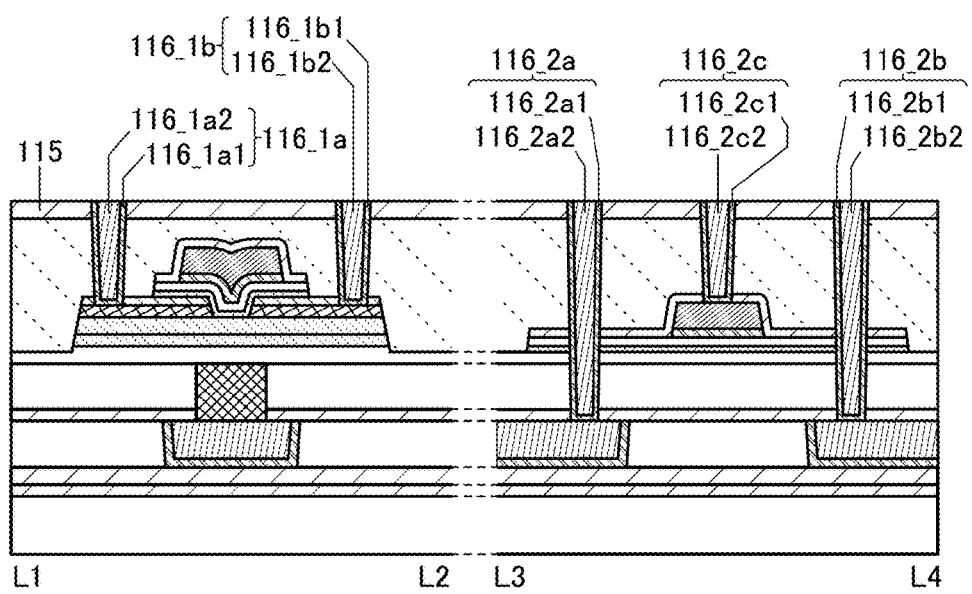

Next, CMP treatment is performed. By the CMP treatment, a portion of the conductive layer 175 is removed, so that the electrode 116_1a (an electrode 116_1a1 and an electrode 116_1a2), the electrode 116_1b (an electrode 116_1b1 and an electrode 116_1b2), the electrode 116_1c (not illustrated), the electrode 116_2a (an electrode 116_2a1 and an electrode 116_2a2), the electrode 116_2b (an electrode 116_2b1 and an electrode 116_2b2), and the electrode 116_2c (an electrode 116_2c1 and an electrode 116_2c2) are formed (see FIG. 14B). FIG. 14B illustrates an example where a portion of the conductive layer 175a is removed, so that the electrode 116_1a1, the electrode 116_1b1, the electrode 116_2a1, the electrode 116_2b1, and the electrode 116_2c1 are formed and an example where a portion of the conductive layer 175b is removed, so that the electrode 116_1a2, the electrode 116_1b2, the electrode 116_2a2, the electrode 116_2b2, and the electrode 116_2c2 are formed.

The electrode 116_1a is electrically connected to the electrode 110_1a. The electrode 116_1b is electrically connected to the electrode 110_1b. The electrode 116_1c is electrically connected to the electrode 112_1. The electrode 116_2a is electrically connected to the wiring 118_2a. The electrode 116_2b is electrically connected to the wiring 118_2b. The electrode 116_2c is electrically connected to the electrode 112_2. The electrode 116_2a is electrically connected to the semiconductor layer 109_2c. The electrode 116_2b is electrically connected to the semiconductor layer 109_2c.

[Step 24]

Figure 15A:
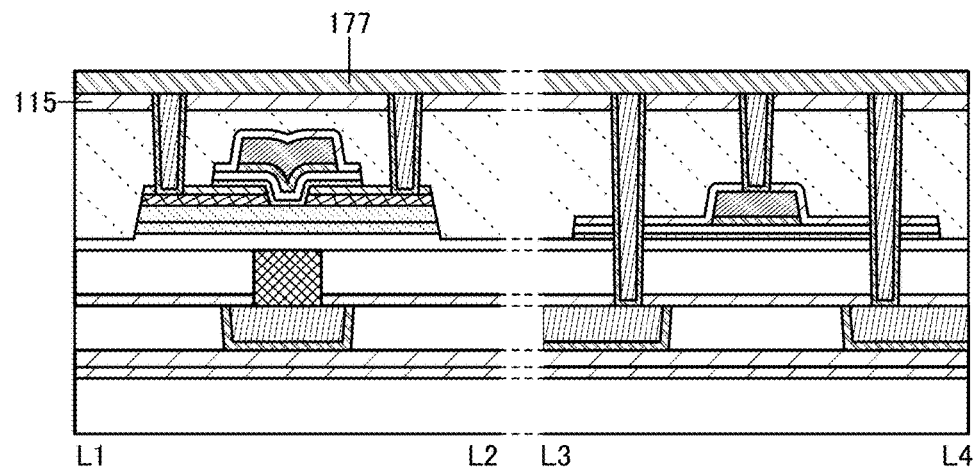
FIGS. 15A and 15B illustrate a method for manufacturing a semiconductor device.
Figure 15B:
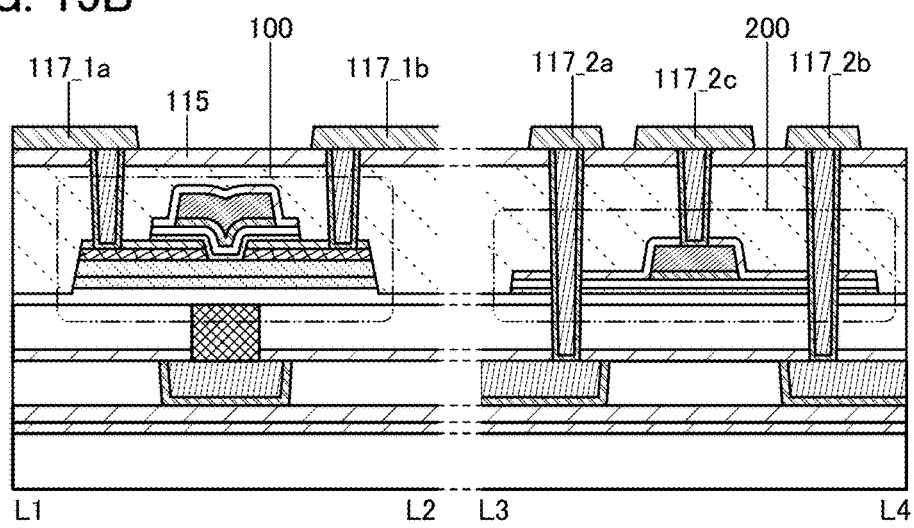

Next, a conductive layer 177 is formed (see FIG. 15A). In this embodiment, a tungsten film is formed by a sputtering method as the conductive layer.

[Step 25]

A resist mask is formed by a photolithography method (not illustrated). With the use of the resist mask as a mask, a portion of the conductive layer 177 is selectively removed to form the electrode 117_1a, the electrode 117_1b, the electrode 117_1c (not illustrated), and the electrode 117_2 (see FIG. 15B). Note that when the electrode 117 is formed, a portion of the insulating layer 115 is removed in some cases.

In such a manner, the transistors 100 and 200 having different structures can be provided over the same substrate through substantially the same process. By the above-described manufacturing method, the transistor 200 is not necessarily manufactured after the transistor 100 is manufactured, for example; thus, the productivity of the semiconductor device can be increased.

In the transistor 100, a channel is formed in the semiconductor layer 109_1b in contact with the semiconductor layer 109_1a and the semiconductor layer 109_1c (see FIGS. 3A and 3B and FIGS. 4A and 4B). In the transistor 200, a channel is formed in the semiconductor layer 109_2c in contact with the insulating layers 108 and 111_2 (see FIGS. 5A and 5B and FIG. 6). Thus, the transistor 200 is likely to be affected by interface scattering compared with the transistor 100. In this embodiment, the electron affinity of the semiconductor layer 109_2c is lower than that of the semiconductor layer 109_1b. Thus, the transistor 200 has higher $V_{th}$ than the transistor 100.

According to one embodiment of the present invention, transistors having different structures can be manufactured through substantially the same process. According to one embodiment of the present invention, a semiconductor device including transistors having different structures can be manufactured with high productivity. According to one embodiment of the present invention, a semiconductor device including transistors having different electrical characteristics can be manufactured with high productivity.

When insulating layers that are relatively impermeable to impurities and are formed using aluminum oxide or the like are provided over and under the transistors 100 and 200, impurity diffusion into the transistors 100 and 200 from the outside can be prevented, the operations of the transistors 100 and 200 can be stabilized, and the reliabilities thereof can be improved. In addition, when the insulating layers of aluminum oxide or the like that are relatively impermeable to oxygen are provided over and under the transistors 100 and 200, oxygen release can be prevented. Thus, the operations of the transistors 100 and 200 can be stabilized, and the reliabilities thereof can be improved. In addition, the electrical characteristics of the transistor can be improved.
<Modification Example of Semiconductor Device 1000>

Modification examples of the semiconductor device 1000 is described with reference to FIGS. 16A and 16B, FIGS. 17A and 17B, FIGS. 18A and 18B, FIGS. 19A and 19B, FIG. 20, FIG. 21, FIGS. 24A and 24B, and FIG. 25.

Modification Example 1

Figure 16A:
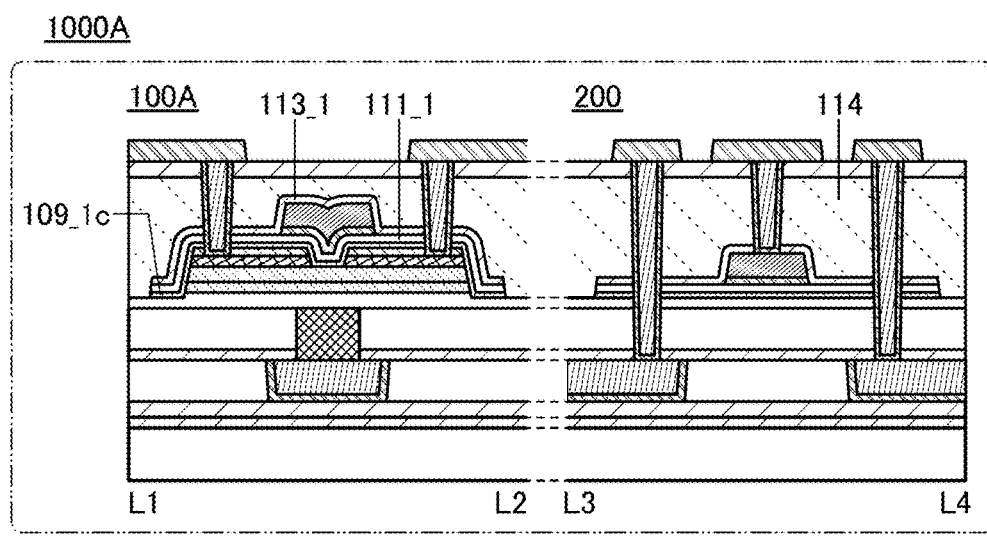
FIGS. 16A and 16B illustrate semiconductor devices.

A semiconductor device 1000A illustrated in FIG. 16A includes a transistor 100A and the transistor 200. The transistor 100A differs from the transistor 100 in the shapes of the insulating layer 111_1, the insulating layer 113_1, and the semiconductor layer 109_1c.

In the transistor 100A, the layer 129, the electrode 110_1, the semiconductor layer 109_1a, and the semiconductor layer 109_1b are covered with the semiconductor layer 109_1c, the insulating layer 111_1, and the insulating layer 113_1. Thus, each of the semiconductor layer 109_1c, the insulating layer 111_1, and the insulating layer 113_1 has a region overlapping with a side surface of the layer 129, a region overlapping with a side surface of the electrode 110_1, a region overlapping with a side surface of the semiconductor layer 109_1a, and a region overlapping with a side surface of the semiconductor layer 109_1b.

In particular, covering the side surface of the semiconductor layer 109_1b with the semiconductor layer 109_1c, the insulating layer 111_1, or the insulating layer 113_1 can prevent impurities contained in the insulating layer 114 from being diffused through the side surface of the semiconductor layer 109_1b to the inside of the semiconductor layer 109_1b. The semiconductor device 1000A can be formed by changing the shape of the above-described resist mask of Step 19.

Modification Example 2

Figure 16B:
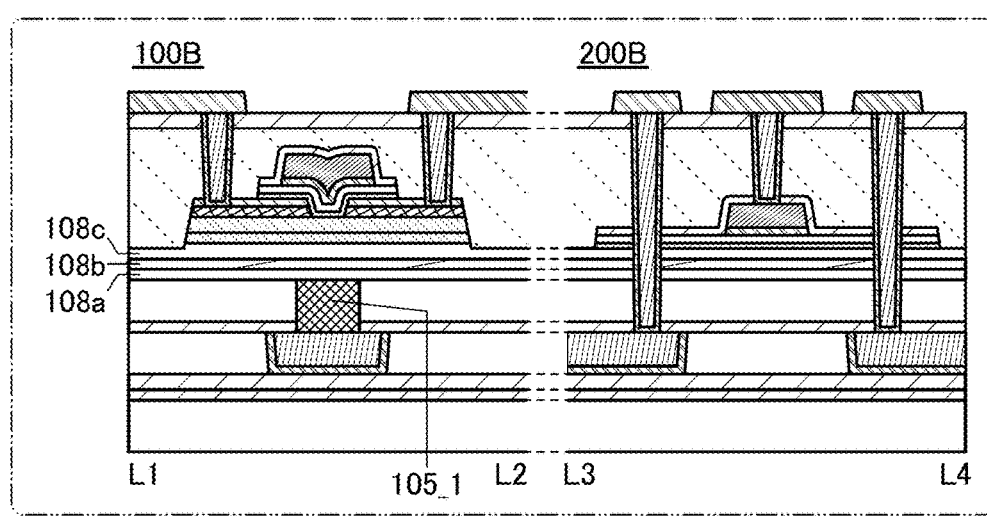

A semiconductor device 1000B illustrated in FIG. 16B includes a transistor 100B and a transistor 200B. The transistors 100B and 200B are different from the transistors 100 and 200 in that a stacked layer of an insulating layer 108a, an insulating layer 108b, and an insulating layer 108c is used instead of the insulating layer 108.

For example, the insulating layers 108a and 108c are formed using silicon oxynitride. The insulating layer 108b is formed using a high-k material such as hafnium oxide, aluminum oxide, tantalum oxide, or yttrium oxide. When the insulating layer 108b is formed using any of these materials, the insulating layer 108b can function as a charge trap layer. The threshold voltage of the transistors 100B and 200B can be changed by injecting electrons into the insulating layer 108b. For example, the injection of electrons into the insulating layer 108b can be performed with the use of the tunnel effect. By applying a positive voltage to the electrode 105_1, tunnel electrons can be injected into the insulating layer 108b. The thickness of each of the insulating layers 108a, 108b, and 108c is preferably greater than or equal to 1 nm and less than or equal to 100 nm, further preferably greater than or equal to 5 nm and less than or equal to 50 nm.

By providing an electrode serving as a back gate in the transistor 200B, the threshold voltage can be changed as in the case of the transistor 100B.

Modification Example 3

Figure 17A:
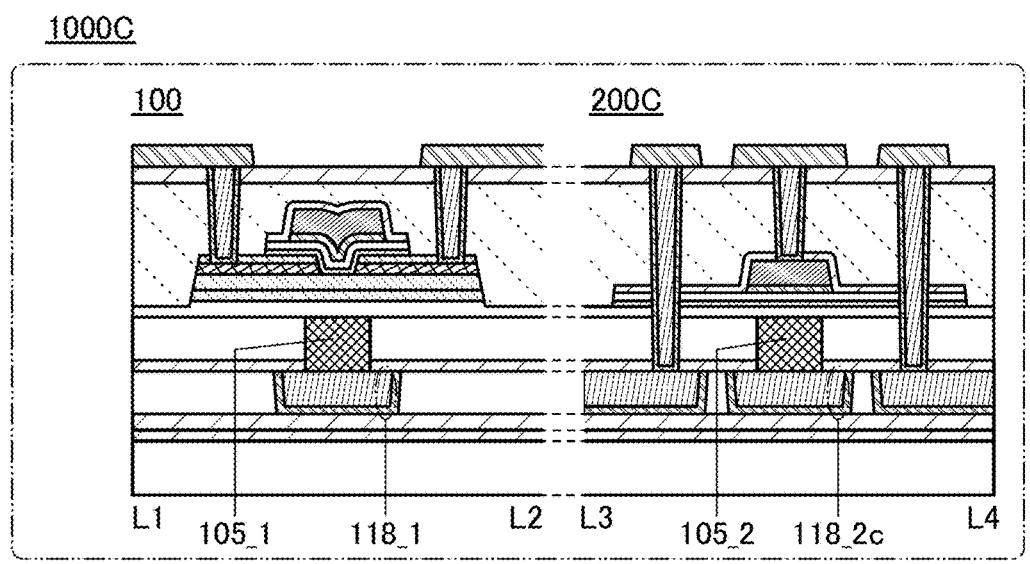
FIGS. 17A and 17B illustrate semiconductor devices.

A semiconductor device 1000C illustrated in FIG. 17A includes the transistor 100 and a transistor 200C. The transistor 200C has a structure in which the electrode 105_2 and the wiring 118_2c are provided in the transistor 200. The electrode 105_2 is electrically connected to the wiring 118_2c. The electrode 105_2 can function as a gate or a back gate. The electrode 105_2 can be formed using a material and a method similar to those of the electrode 105_1 at the same time. The wiring 118_2c can be formed using a material and a method similar to those of the wirings 118_1, 118_2a, and 118_2b at the same time. The electrode 105_2 and the wiring 118_2c are not necessarily provided, depending on the performance, purpose, or the like required for the semiconductor device.

Modification Example 4

Figure 17B:
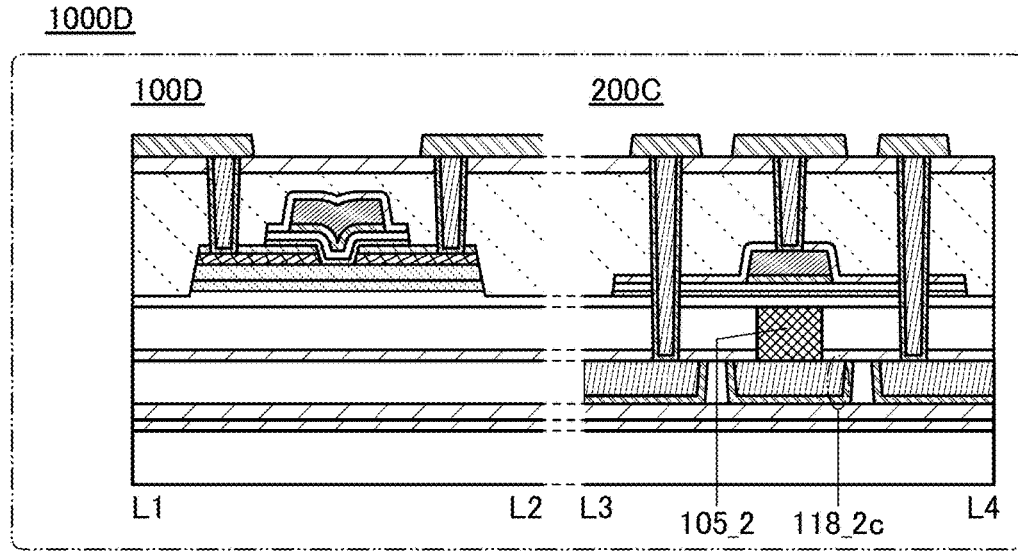

A semiconductor device 1000D illustrated in FIG. 17B includes a transistor 100D and the transistor 200C. The transistor 100D has a structure in which the electrode 105_1 and the wiring 118 are removed from the transistor 100. The electrode 105_1 is not necessarily provided, depending on the performance, purpose, or the like required for the semiconductor device. Note that a structure where neither the electrode 105_1 nor the electrode 105_2 is provided can be employed.

Modification Example 5

Figure 18A:
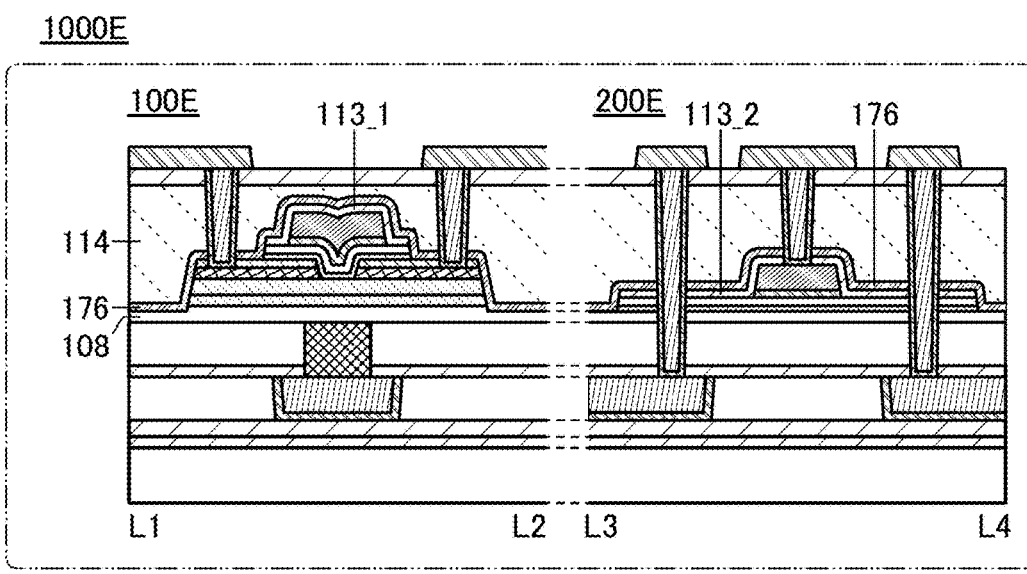
FIGS. 18A and 18B illustrate semiconductor devices.

A semiconductor device 1000E illustrated in FIG. 18A includes a transistor 100E and a transistor 200E. The transistors 100E and 200E are different from the transistors 100 and 200 in that the semiconductor layer 109, the electrode 110, the layer 129, the insulating layer 111, the electrode 112, and the insulating layer 113 are covered with an insulating layer 176.

The insulating layer 176 is formed after the above-described Step 19 is completed before the insulating layer 114 is formed in the following Step 20. The insulating layer 176 can be formed using a material and a method similar to those of the insulating layer 102. Note that the insulating layer 176 is preferably formed using an insulating material through which impurities do not easily pass. When the insulating material that is relatively impermeable to impurities is used for the insulating layer 176, impurity diffusion from the insulating layer 114 side to the transistor can be suppressed, and the reliability of the transistor can be improved.

Heat treatment may be performed after Step 19. The insulating layer 176 is preferably formed without exposure to the air after the heat treatment. When the heat treatment and the formation of the insulating layer 176 are successively performed, moisture and the like can be prevented from being attached to the surface on which the insulating layer 176 is formed. Note that the heat treatment is preferably performed under a reduced pressure.

Oxygen doping treatment may be performed after the formation of the insulating layer 176. It is preferable that the heat treatment, the oxygen doping treatment, and the formation of the insulating layer 176 be successively performed without exposure to the air.

The insulating layer 176 can be formed by a sputtering method using a sputtering gas containing oxygen. By forming the insulating layer 176 by a sputtering method using a sputtering gas containing oxygen, oxygen can be supplied to the insulating layer 108 in forming the insulating layer 176. Part of oxygen contained in the insulating layer 108 is diffused to the semiconductor layer 109 by later heat treatment, so that oxygen vacancies in the semiconductor layer 109 can be reduced.

Modification Example 6

Figure 18B:
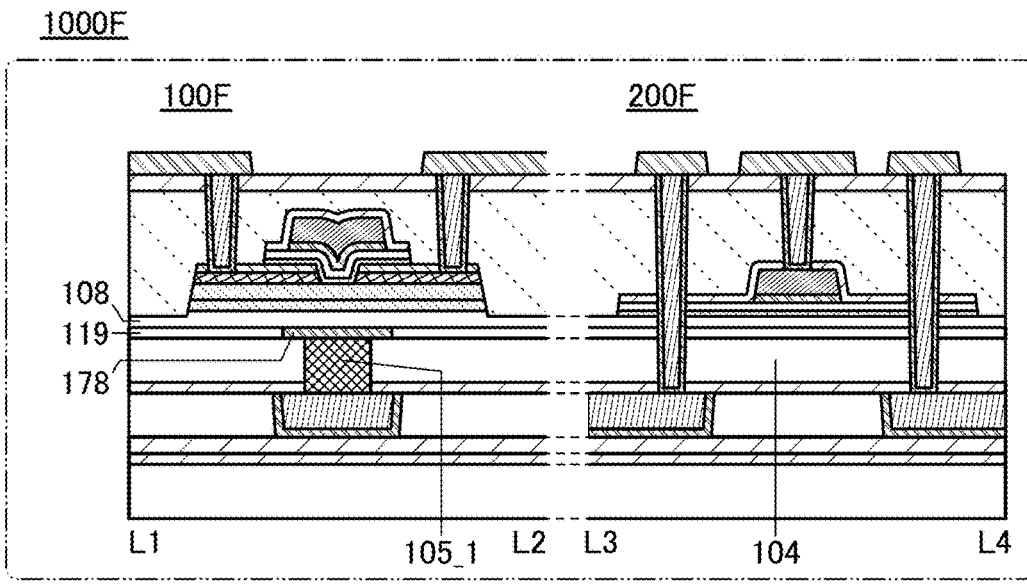

A semiconductor device 1000F illustrated in FIG. 18B includes a transistor 100F and a transistor 200F. The transistors 100F and 200F are different from the transistors 100 and 200 in that the insulating layer 119 is provided between the insulating layer 104 and the insulating layer 108. The transistor 100F includes an electrode 178 in the same layer as the insulating layer 119. The electrode 178 includes a region electrically connected to the electrode 105_1.

The electrode 178 may be formed by a damascene method. The insulating layer 119 may be formed after the electrode 178 is formed, and then, a surface of the electrode 178 may be exposed by CMP treatment or the like. Unevenness of the sample surface can be reduced by CMP treatment. The electrode 178 can be formed using a material and a method similar to those of the electrode 105.

Furthermore, the electrode 178 is preferably formed using a conductive material which is relatively impermeable to oxygen. When the electrode 178 is formed using a conductive material which is relatively impermeable to oxygen, oxidation of the electrode 105_1 can be prevented.

In the case where an oxide semiconductor is used for the semiconductor layer, a conductive material containing oxygen is preferably used for the electrode 178. When the electrode 178 has a layered structure, of conductive materials forming the electrode 178, a conductive material containing a large amount of oxygen is preferably provided on the semiconductor layer side. By providing the conductive material containing a large amount of oxygen on the semiconductor layer side, oxygen released from the conductive material is likely to be supplied to the semiconductor layer.

Modification Example 7

Figure 19A:
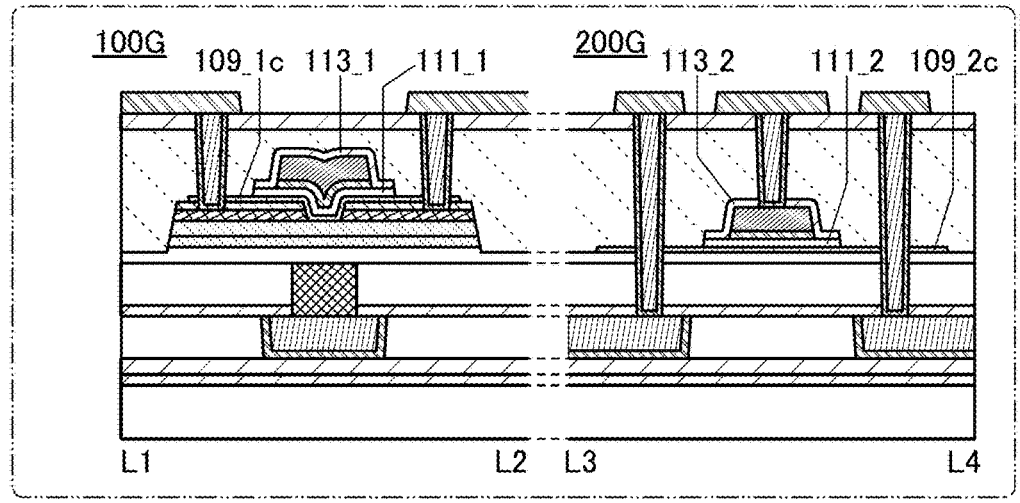
FIGS. 19A and 19B illustrate semiconductor devices.

A semiconductor device 1000G illustrated in FIG. 19A includes a transistor 100G and a transistor 200G. The transistors 100G and 200G are different from the transistors 100 and 200 in the shape of the semiconductor layer 109c.

The semiconductor device 1000G can be provided by forming a resist mask using a photolithography method after the semiconductor layer 184c is formed in Step 15 and selectively removing a portion of the semiconductor layer 184c to form the semiconductor layer 109_1c and the semiconductor layer 109_2c.

Modification Example 8

Figure 19B:
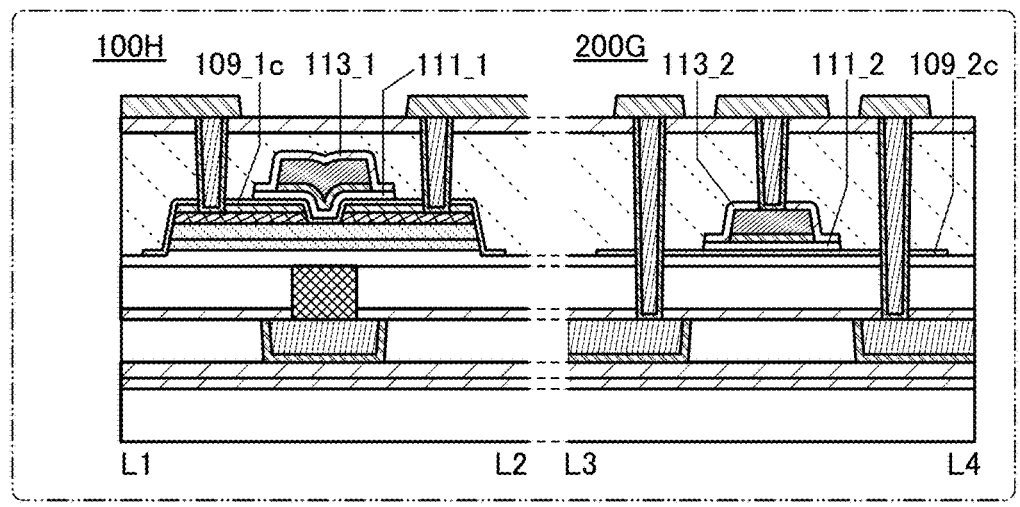

A semiconductor device 1000H illustrated in FIG. 19B includes a transistor 100H and the transistor 200G. The transistor 100H is different from the transistor 100G in the shape of the semiconductor layer 109_1c.

In the transistor 100H, the layer 129, the electrode 110_1, the semiconductor layer 109_1a, and the semiconductor layer 109_1b are covered with the semiconductor layer 109_1c. Thus, the semiconductor layer 109_1c includes a region overlapping with a side surface of the layer 129, a region overlapping with a side surface of the electrode 110_1, a region overlapping with a side surface of the semiconductor layer 109_1a, and a region overlapping with a side surface of the semiconductor layer 109_1b.

In particular, covering the side surface of the semiconductor layer 109_1b with the semiconductor layer 109_1c can prevent impurities contained in the insulating layer 114 from being diffused through the side surface of the semiconductor layer 109_1b into the inner side of the semiconductor layer 109_1b. The semiconductor device 1000H can be formed by changing the shape of the above-described resist mask in Step 19.

The semiconductor device 1000H can be provided, in a manner similar to that of the semiconductor device 1000G, by forming a resist mask using a photolithography method after the semiconductor layer 184c is formed in Step 15 and selectively removing a portion of the semiconductor layer 184c to form the semiconductor layer 109_1c and the semiconductor layer 109_2c.

Modification Example 9

Figure 20:
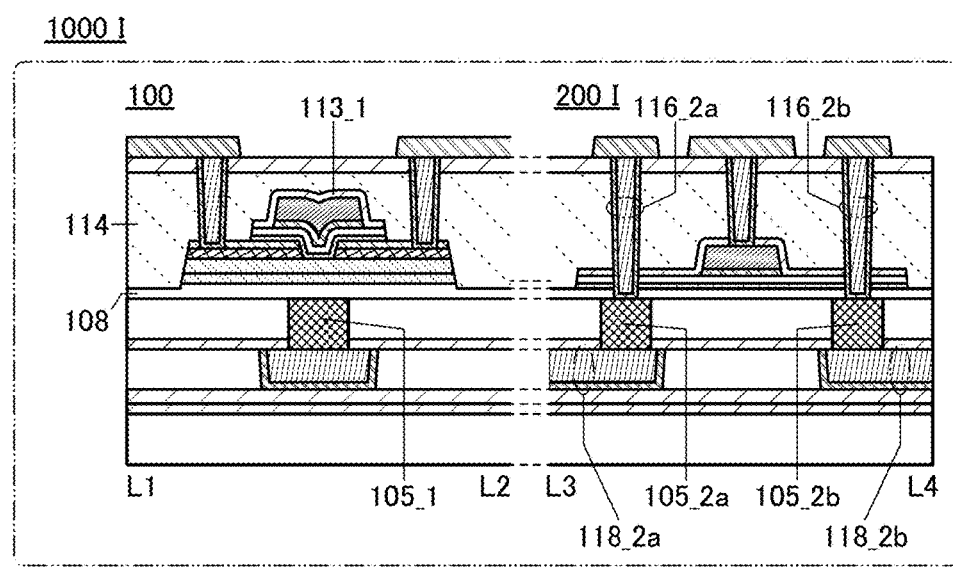
FIG. 20 illustrates a semiconductor device.

A semiconductor device 1000I illustrated in FIG. 20 includes the transistor 100 and a transistor 200I. The transistor 200I is different from the transistor 200 in that the electrode 105_2a and the electrode 105_2b are provided.

In the transistor 200I, the electrode 116_2a and the wiring 118_2a are electrically connected to each other through the electrode 105_2a. The electrode 116_2b and the wiring 118_2b are electrically connected to each other through the electrode 105_2b. The electrode 105_2a includes a region overlapping with the electrode 116_2a and a region overlapping with the wiring 118_2a. The electrode 105_2b includes a region overlapping with the electrode 116_2b and a region overlapping with the wiring 118_2b. The electrode 105_2 (the electrode 105_2a and the electrode 105_2b) can be formed using a material and a method similar to those of the electrode 105_1 at the same time.

Modification Example 10

A semiconductor device 1000J illustrated in FIG. 21 includes the transistor 100 and a transistor 200J. The transistor 200J is different from the transistor 200 in that the semiconductor layer 109_2a1, the semiconductor layer 109_2b1, the semiconductor layer 109_2a2, and the semiconductor layer 109_2b2 are provided. In addition, the transistor 200J is different from the transistor 200 in the shape of each of the insulating layers 113_2 and 111_2.

In the transistor 200J, the semiconductor layer 109_2c includes a region 189d overlapping with the semiconductor layer 109_2b1, a region 189e overlapping with the semiconductor layer 109_2b2, and a region 189f sandwiched between the region 189d and the region 189e in the plan view.

The semiconductor layer 109_2c includes a region overlapping with the electrode 112_2 with the insulating layer 111_2 located therebetween in the region 189d. The semiconductor layer 109_2c includes a region overlapping with the electrode 112_2 with the insulating layer 111_2 located therebetween in the region 189e. The semiconductor layer 109_2c includes a region overlapping with the electrode 112_2 with the insulating layer 111_2 located therebetween in the region 189f. Furthermore, the region 189f of the semiconductor layer 109_2c can function as a channel formation region.

In the transistor 200J, the semiconductor layer 109_2c includes a region electrically connected to the electrode 116_2a with the semiconductor layer 109_2b1 located therebetween. The semiconductor layer 109_2c includes a region electrically connected to the electrode 116_2b through the semiconductor layer 109_2b2.

The semiconductor layer 109_2b (the semiconductor layer 109_2b1 and the semiconductor layer 109_2b2) is preferably formed using a material having electron affinity between the electron affinity of the semiconductor layer 109_2c and the work function of the electrode 116_2.

Specifically, the semiconductor layer 109_2b is preferably formed using a material having electron affinity between the electron affinity of the semiconductor layer 109_2c and the work function of a region in contact with the semiconductor layer 109_2b of the electrode 116_2 (e.g., the work function of the electrode 116_2a1 or 116_2b1). When such a material is used for the semiconductor layer 109_2b, the height of the energy barrier between the electrode 116_2 and the semiconductor layer 109_2b and the height of the energy barrier between the semiconductor layer 109_2b and the semiconductor layer 109_2c can be lower than that in the case where the electrode 116_2 and the semiconductor layer 109_2c are in direct contact with each other.

A smaller energy barrier allows electrons to move more easily. In general, the work functions of even the same metal materials are likely to vary because of the deposition condition, the crystal orientation, and the like. When the work function of the source electrode varies, the amount of electrons that move from the source electrode to the channel (the amount of current) is likely to vary. That is to say, the electrical characteristics of a transistor are likely to noticeably vary. However, when the height of the energy barrier is small, an influence of variation in the work function can also be small. The height of the energy barrier is preferably 0.3 eV or less, more preferably 0.2 eV or less.

According to one embodiment of the present invention, a transistor with favorable electrical characteristics can be provided. According to one embodiment of the present invention, a transistor with a small variation in electrical characteristics can be provided.

[Example of Method for Manufacturing Semiconductor Device 1000J]

An example of a method for manufacturing a semiconductor device 1000J is described. In order to avoid repeated description, a description is mainly made on portions different from the method for manufacturing the semiconductor device 1000.

Figure 22A:
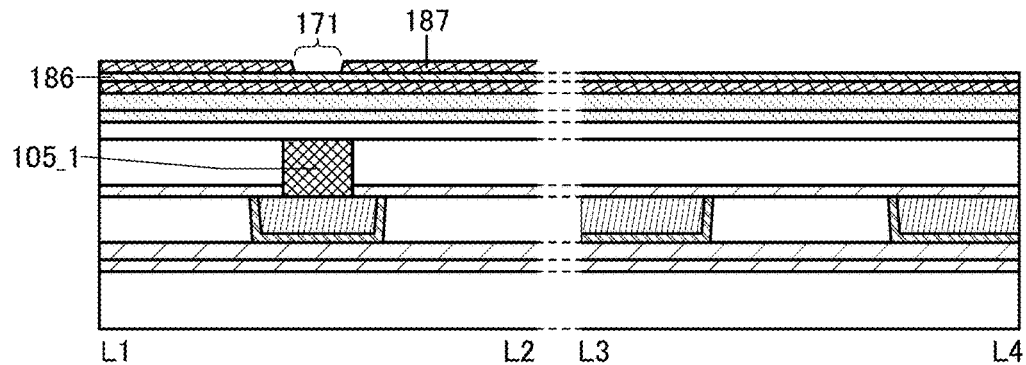
FIGS. 22A to 22C illustrate a method for manufacturing a semiconductor device.

First, the steps up to Step 10 described above are performed. Next, when the opening 171 is formed in Step 11, the layer 187 in a region where the transistor 200J is formed is also removed (see FIG. 22A).

Figure 22B:
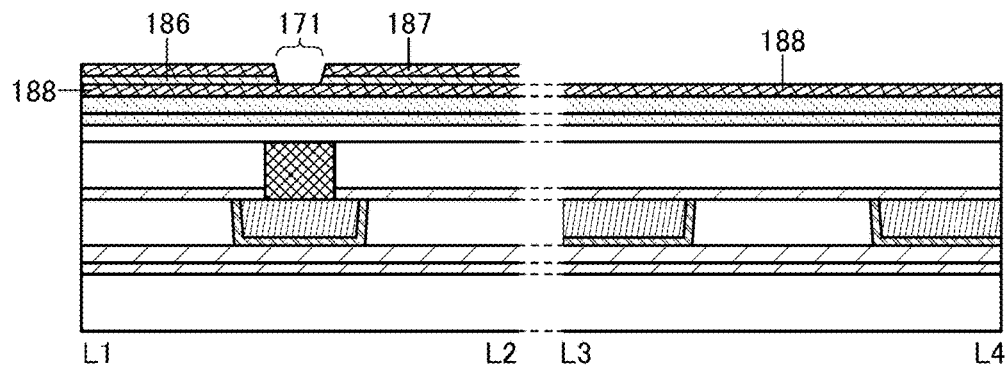

Next, Step 12 is performed. A portion of the layer 186 in a region overlapping with the opening 171 is removed, so that the conductive layer 188 in the region overlapping with the opening 171 is exposed. Furthermore, the layer 186 in a region where the transistor 200J is formed is also removed, so that the conductive layer 188 in the region is exposed (see FIG. 22B).

Figure 22C:
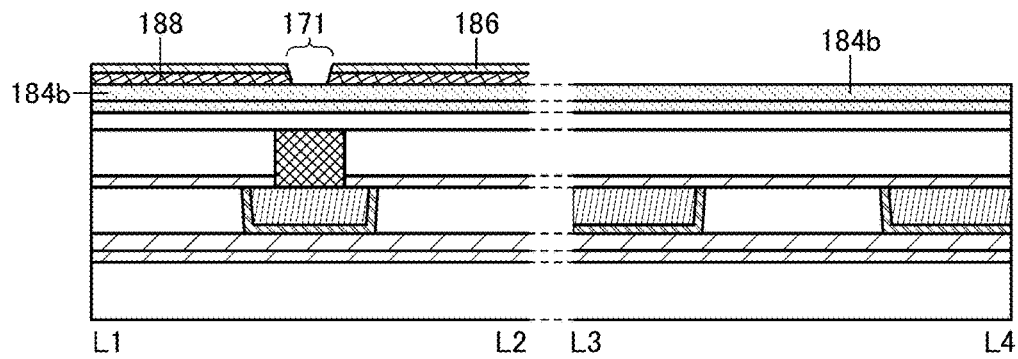

Next, Step 13 is performed. At the same time as the removal of the layer 187, the conductive layer 188 in the region overlapping with the opening 171 is removed, so that the semiconductor layer 184b in a region overlapping with the opening 171 is exposed. The conductive layer 188 in the region where the transistor 200J is formed is also removed, so that the semiconductor layer 184b in the region is exposed (see FIG. 22C).

Figure 23A:
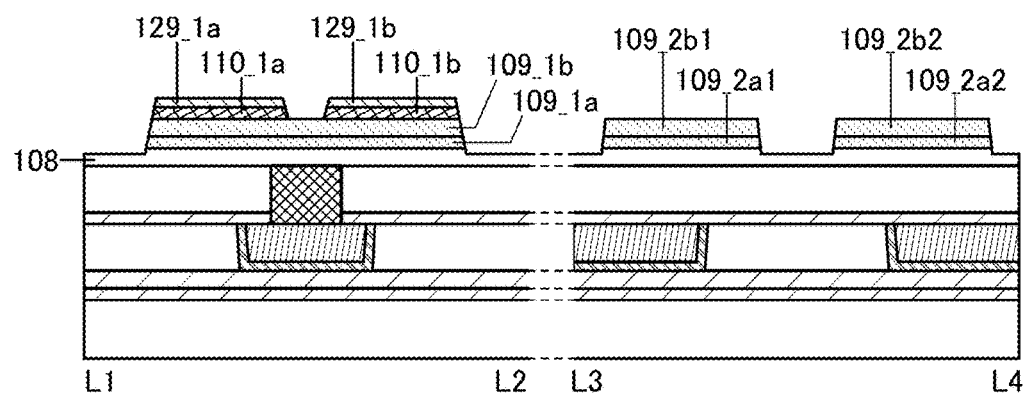
FIGS. 23A and 23B illustrate a method for manufacturing a semiconductor device.

Next, Step 14 is performed. A resist mask is formed not only in a region where the transistor 100 is formed but also in the region where the transistor 200J is formed. When the resist mask is used as a mask, a portion of each of the semiconductor layer 184a, the semiconductor layer 184b, the conductive layer 188, and the layer 186 is selectively removed, so that the semiconductor layer 109_1a, the semiconductor layer 109_1b, the electrode 110_1a, the electrode 110_1b, the layer 129_1a, the layer 129_1b, the semiconductor layer 109_2a1, the semiconductor layer 109_2b1, the semiconductor layer 109_2a2, and the semiconductor layer 109_2b2 are formed (see FIG. 23A).

Figure 23B:
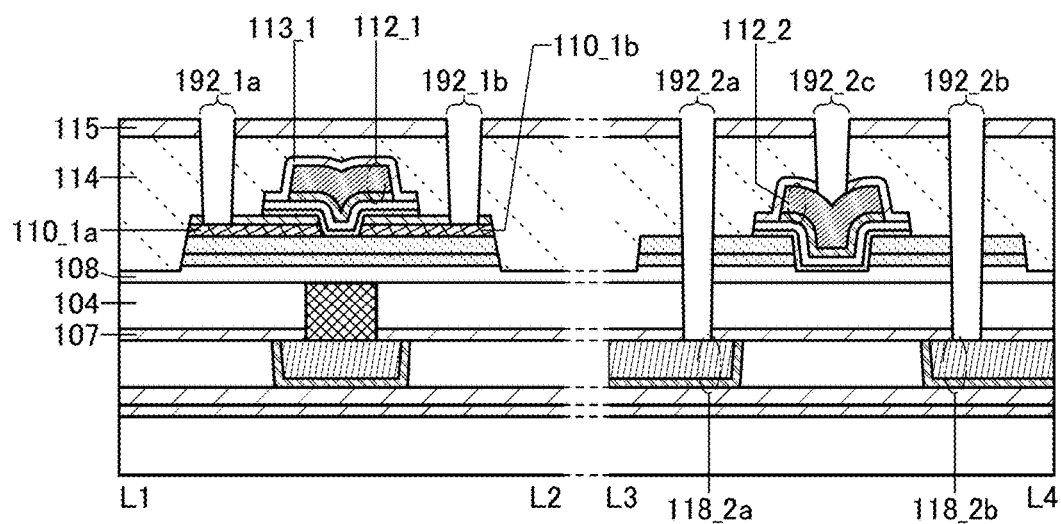

Step 15 and the subsequent steps are performed in a manner similar to that in the example of the manufacturing method of the semiconductor device 1000. In Step 21, in the transistor 200J, a portion of each of the insulating layer 115, the insulating layer 114, the semiconductor layer 109_2b1, the semiconductor layer 109_2a1, the insulating layer 108, the insulating layer 104, and the insulating layer 107 is removed, so that the opening 192_2a is formed. Furthermore, a portion of each of the insulating layer 115, the insulating layer 114, the semiconductor layer 109_2b2, the semiconductor layer 109_2a2, the insulating layer 108, the insulating layer 104, and the insulating layer 107 is removed, so that the opening 192_2b is formed (see FIG. 23B).

Modification Example 11

Figure 24A:
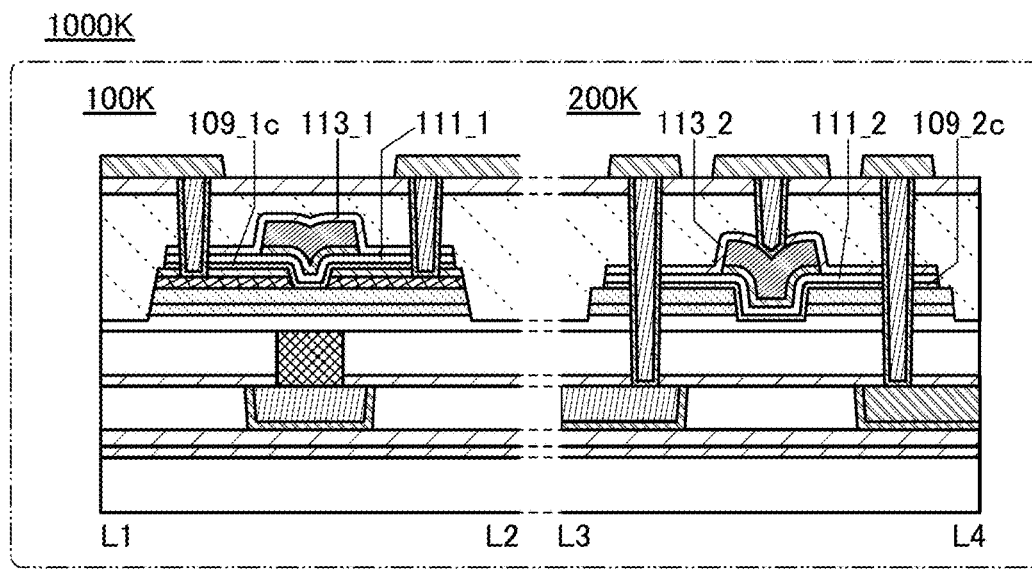
FIGS. 24A and 24B illustrate semiconductor devices.

A semiconductor device 1000K illustrated in FIG. 24A includes a transistor 100K and a transistor 200K. The transistors 100K and 200K are different from the transistors 100 and 200J in the shapes of the insulating layer 113, the insulating layer 111, and the semiconductor layer 109c.

In the transistors 100K and 200K, the insulating layer 113, the insulating layer 111, and the semiconductor layer 109c extend beyond the opening 192. In the opening 192, the semiconductor layer 109c is electrically connected to the electrode 116. The contact resistance between the electrode 116 and the whole semiconductor layer 109 can be reduced. The semiconductor device 1000K can be formed by changing the shape of the resist mask in Step 19 without increasing the number of steps.

Modification Example 12

Figure 24B:
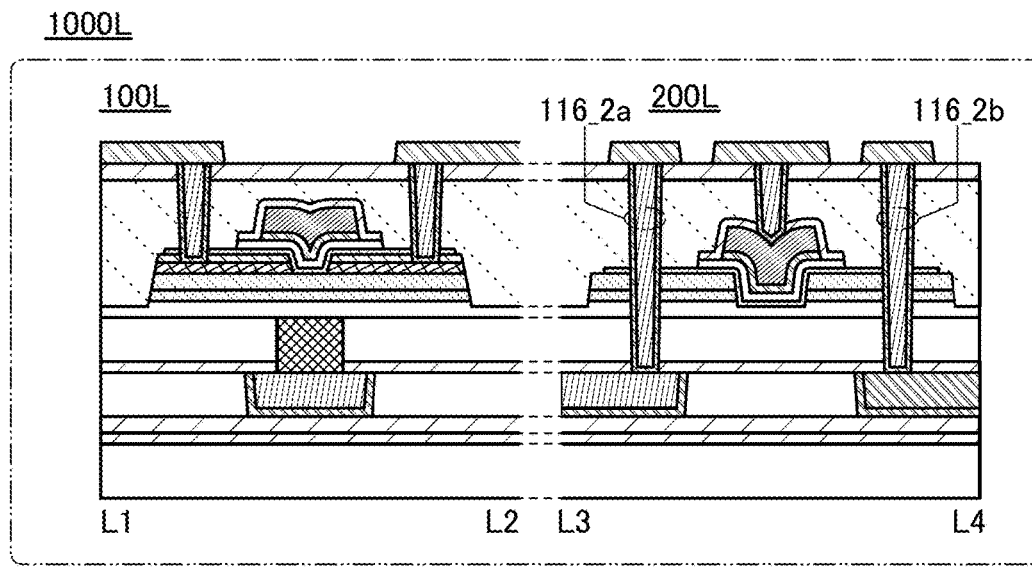

A semiconductor device 1000L illustrated in FIG. 24B includes a transistor 100L and a transistor 200L. The transistors 100L and 200L are different from the transistors 100 and 200J in the shape of the semiconductor layer 109c.

In the transistors 100L and 200L, the semiconductor layer 109c extends beyond the opening 192. Furthermore, the semiconductor layer 109c is electrically connected to the electrode 116 in the opening 192. Thus, the contact resistance between the electrode 116 and the semiconductor layer 109 can be reduced.

An example of a method for manufacturing the semiconductor device 1000L is described. First, the steps up to Step 14 are performed in a manner similar to the manufacturing steps of the semiconductor device 1000J. Next, a resist mask is formed after the semiconductor layer 184c is formed in Step 15. With the use of the resist mask as a mask, a portion of the semiconductor layer 184c is selectively removed, so that the semiconductor layer 109c is formed. After that, the insulating layer 111 is formed. The subsequent steps are performed in a manner similar to the manufacturing steps of the semiconductor device 1000J, but when a portion of each of the insulating layers 113 and 111 is selectively removed in Step 19, the semiconductor layer 109c is not removed.

Another example of the method for manufacturing the semiconductor device 1000L is described. First, the steps up to Step 18 are performed in a manner similar to the manufacturing steps of the semiconductor device 1000J. Next, when a portion of each of the insulating layers 113 and 111 is selectively removed in Step 19, the semiconductor layer 184c is not removed. After Step 19, a resist mask is formed and a portion of the semiconductor layer 184c is selectively removed, so that the semiconductor layer 109c is formed. The subsequent steps are performed in a manner similar to the manufacturing steps of the semiconductor device 1000J.

Modification Example 13

Figure 25:
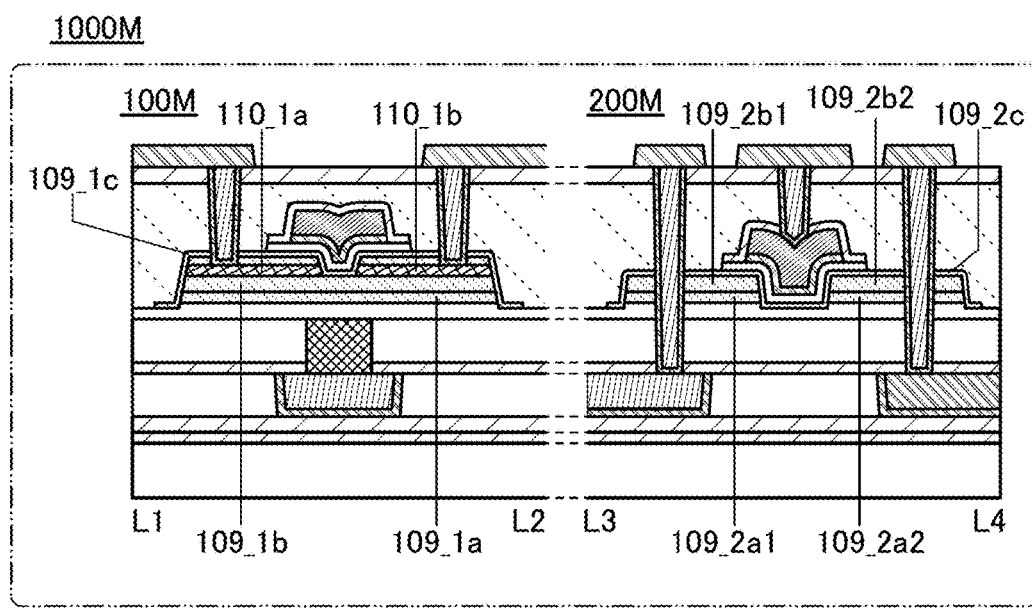
FIG. 25 illustrates a semiconductor device.

A semiconductor device 1000M illustrated in FIG. 25 includes a transistor 100M and a transistor 200M. The transistors 100M and 200M are different from the transistors 100L and 200L in the shape of the semiconductor layer 109c.

In the transistor 100M, the layer 129, the electrode 110_1, the semiconductor layer 109_1a, and the semiconductor layer 109_1b are covered with the semiconductor layer 109_1c. Thus, the semiconductor layer 109_1c includes a region overlapping with a side surface of the layer 129, a region overlapping with a side surface of the electrode 110_1, a region overlapping with a side surface of the semiconductor layer 109_1a, and a region overlapping with a side surface of the semiconductor layer 109_1b.

In the transistor 200M, the semiconductor layer 109_2a and the semiconductor layer 109_2b are covered with the semiconductor layer 109_2c. Thus, the semiconductor layer 109_2c includes a region overlapping with a side surface of the semiconductor layer 109_2a and a region overlapping with a side surface of the semiconductor layer 109_2b.

In particular, by covering the side surface of the semiconductor layer 109_1b with the semiconductor layer 109_1c, impurities contained in the insulating layer 114 can be prevented from being diffused through the side surface of the semiconductor layer 109_1b into the inner side of the semiconductor layer 109_1b. Similarly, covering the side surface of the semiconductor layer 109_2b with the semiconductor layer 109_2c can prevent impurities contained in the insulating layer 114 from being diffused through the side surface of the semiconductor layer 109_2b to the inside of the semiconductor layer 109_2b.

The semiconductor device 1000M can be manufactured by a method similar to that of the semiconductor device 1000L by changing the shape of the resist mask for forming the semiconductor layers 109_1c and 109_2c.

This embodiment can be implemented in appropriate combination with any of the structures described in the other embodiments and the like.

Embodiment 2

In this embodiment, examples of a semiconductor device including any of the transistors disclosed in this specification and the like are described.

<Structural Example of Semiconductor Device>

Figure 26A:
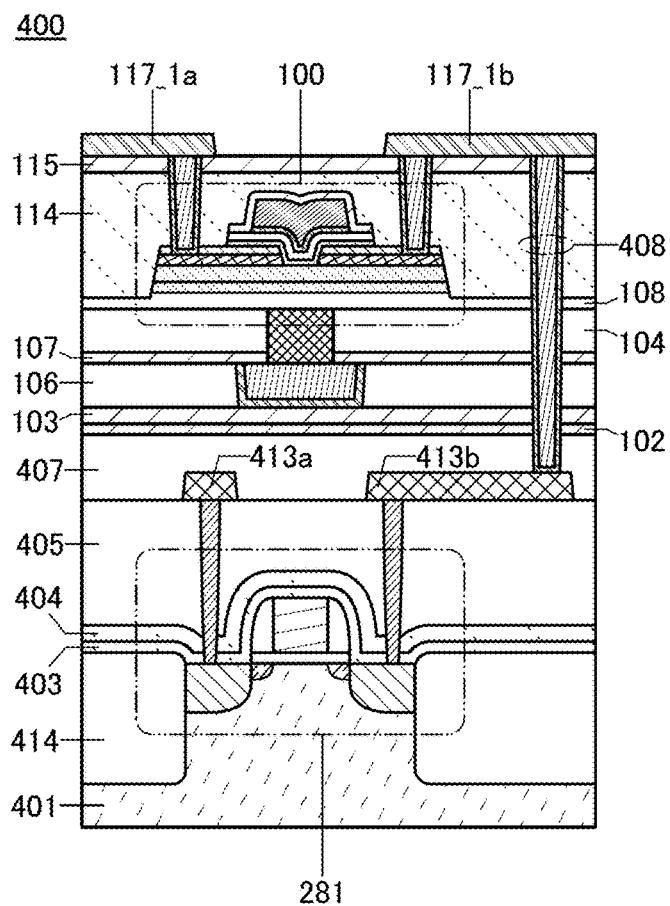
FIGS. 26A to 26C illustrate a semiconductor device.
Figure 26B:
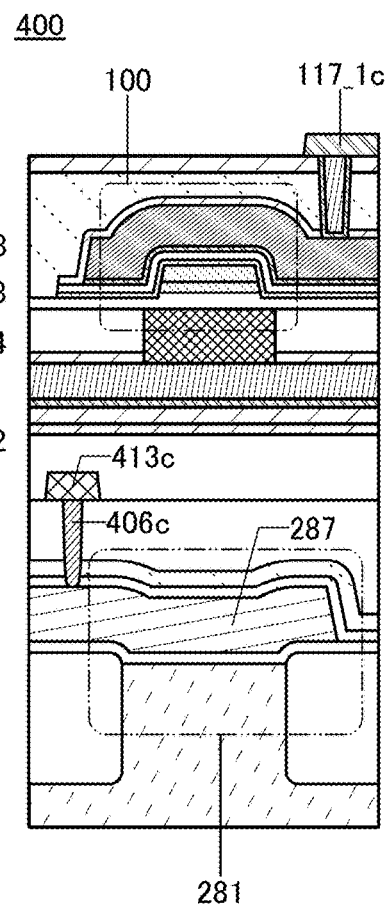
Figure 26C:
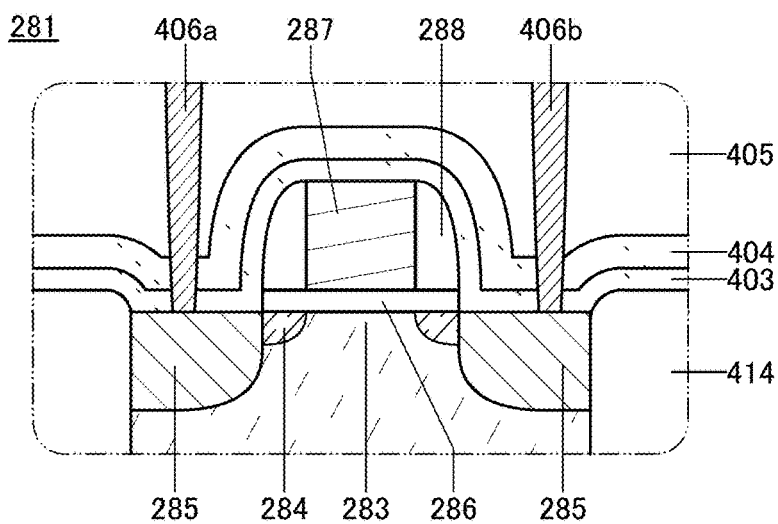

FIGS. 26A to 26C are cross-sectional views of a semiconductor device 400. The semiconductor device 400 includes the transistor 100 and a transistor 281. Note that the transistor 100 described in this embodiment can be replaced with any of the other transistors described in the above embodiments. FIG. 26A is a cross-sectional view of the transistor 100 and the transistor 281 in the channel length direction, and FIG. 26B is a cross-sectional view thereof in the channel width direction. FIG. 26C is an enlarged view of the transistor 281 in FIG. 26A.

In the semiconductor device 400, an n-type semiconductor is used for a substrate 401. The transistor 281 includes a channel formation region 283, high-concentration p-type impurity regions 285, an insulating layer 286, an electrode 287, and a sidewall 288. In regions overlapping with the sidewall 288 with the insulating layer 286 located therebetween, low-concentration p-type impurity regions 284 are provided. The insulating layer 286 can function as a gate insulating layer. The electrode 287 can function as a gate electrode. The channel formation region 283 of the transistor 281 is formed in part of the substrate 401.

The low-concentration p-type impurity regions 284 can be formed in such a manner that an impurity element is added with the use of the electrode 287 as a mask after the formation of the electrode 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 414. The element isolation layer can be formed by a local oxidation of silicon (LOCOS) method, a shallow trench isolation (STI) method, or the like.

The transistor 281 can function as a p-channel transistor. An insulating layer 403 is formed over the transistor 281, and an insulating layer 404 is formed over the insulating layer 403. The insulating layers 403 and 404 can be formed using a material and a method that are similar to those of the insulating layer described in the above embodiment. Note that the insulating layers 403 and 404 are preferably formed using an insulating material that has a function of preventing diffusion of impurities such as oxygen, hydrogen, water, alkali metal, and alkaline earth metal. Note that one of the insulating layers 403 and 404 may be omitted or another insulating layer may be stacked thereover.

The semiconductor device 400 includes an insulating layer 405 having a flat surface over the insulating layer 404. The insulating layer 405 can be formed using a material and a method that are similar to those of the insulating layer described in the above embodiment. A surface of the insulating layer 405 may be subjected to CMP treatment.

A heat-resistant organic material such as a polyimide, an acrylic-based resin, a benzocyclobutene-based resin, a polyamide, or an epoxy-based resin may be used to form the insulating layer 405. Other than such organic materials, a low-dielectric constant material (a low-k material), a siloxane-based resin, phosphosilicate glass (PSG), borophosphosilicate glass (BPSG), or the like may be used. Note that the insulating layer 405 may be formed by stacking a plurality of insulating layers formed using any of these materials.

An electrode 413a, an electrode 413b, and an electrode 413c are formed over the insulating layer 405. The electrode 413a, the electrode 413b, and the electrode 413c can be formed using a material and a method that are similar to those of the electrode described in the above embodiment.

The electrode 413a is electrically connected to one of the high-concentration p-type impurity regions 285 through a contact plug 406a. The electrode 413b is electrically connected to the other of the high-concentration p-type impurity regions 285 through a contact plug 406b. The electrode 413c is electrically connected to the electrode 287 through a contact plug 406c.

An insulating layer 407 is formed so as to cover the electrode 413a, the electrode 413b, and the electrode 413c. The insulating layer 407 can be formed using a material and a method that are similar to those of the insulating layer 405. A surface of the insulating layer 407 may be subjected to CMP treatment.

The insulating layer 102 is formed over the insulating layer 407. Components over the insulating layer 407 can be understood with reference to the above embodiment. Thus, detailed description thereof is omitted in this embodiment. The electrode 117_1b is electrically connected to the electrode 413b through a contact plug 408.

The contact plugs 406a, 406b, 406c, and 408 can be formed using a material and a method that are similar to those of the electrode 116.

Modification Example 1

Figure 27A:
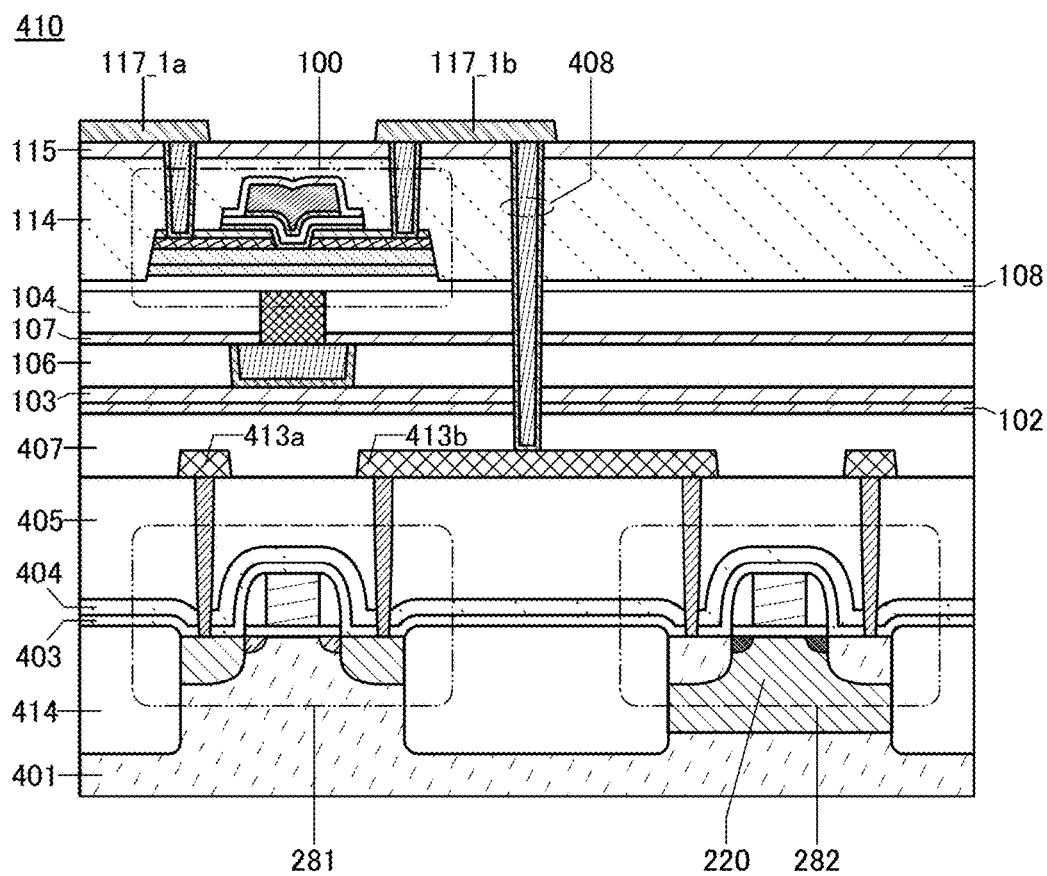
FIGS. 27A and 27B illustrate a semiconductor device.
Figure 27B:
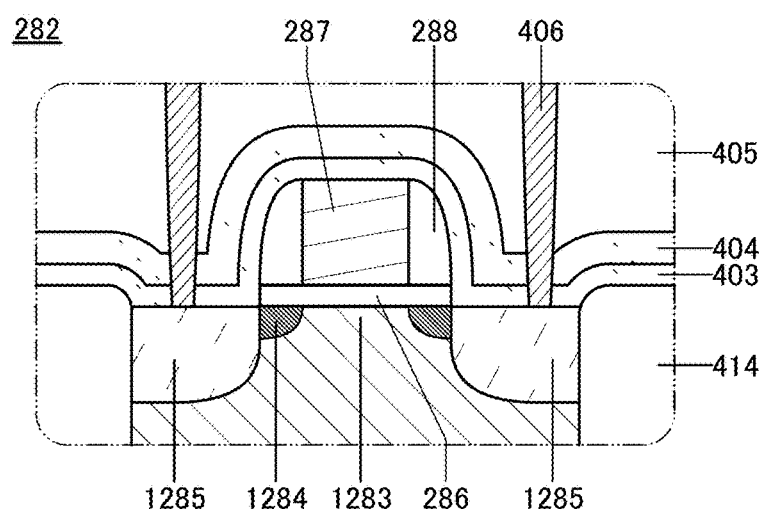

A transistor 282 that is an n-channel transistor may be provided on the substrate 401. FIGS. 27A and 27B are cross-sectional views of a semiconductor device 410. The semiconductor device 410 includes the transistor 282 in addition to the components of the semiconductor device 400. FIG. 27A is a cross-sectional view of the transistor 100, the transistor 281, and the transistor 282 in the channel length direction, and FIG. 27B is an enlarged view of the transistor 282.

In the transistor 282, a channel formation region 1283 is formed in a well 220. The transistor 282 includes the channel formation region 1283, high-concentration n-type impurity regions 1285, the insulating layer 286, the electrode 287, and the sidewall 288. In regions overlapping with the sidewall 288 with the insulating layer 286 located therebetween, low-concentration n-type impurity regions 1284 are provided.

The low-concentration n-type impurity regions 1284 can be formed in such a manner that an impurity element is added with the use of the electrode 287 as a mask after the formation of the electrode 287 and before the formation of the sidewall 288. In other words, the low-concentration n-type impurity regions 1284 can be formed in a self-aligned manner. After the sidewall 288 is formed, the high-concentration n-type impurity regions 1285 are formed. Note that the low-concentration n-type impurity regions 1284 have the same conductivity type as the high-concentration n-type impurity regions 1285, and have a lower concentration of the impurity imparting the conductivity type than the high-concentration n-type impurity regions 1285. The low-concentration n-type impurity regions 1284 are not necessarily provided depending on circumstances.

Modification Example 2

Figure 28A:
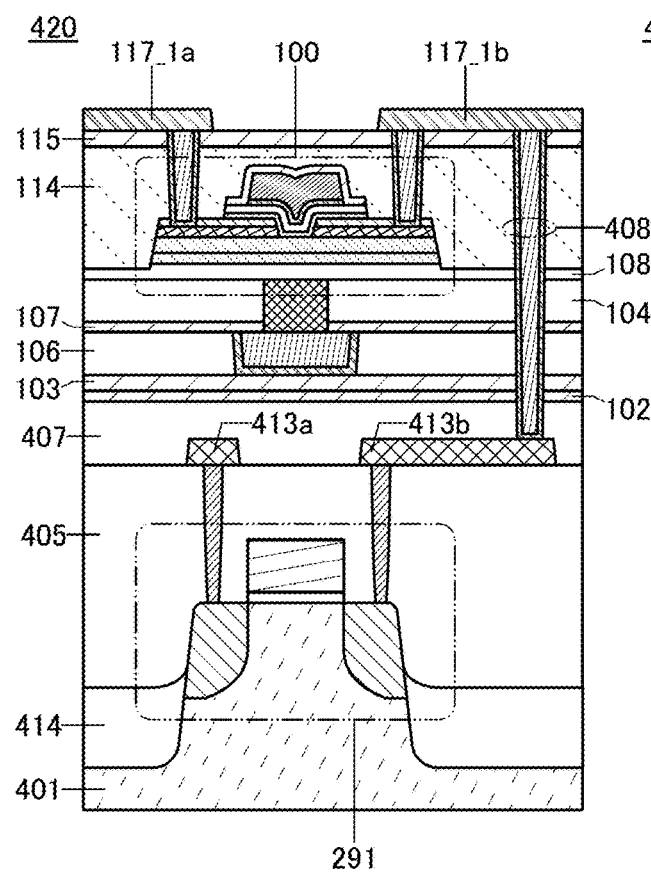
FIGS. 28A to 28C illustrate a semiconductor device.
Figure 28B:
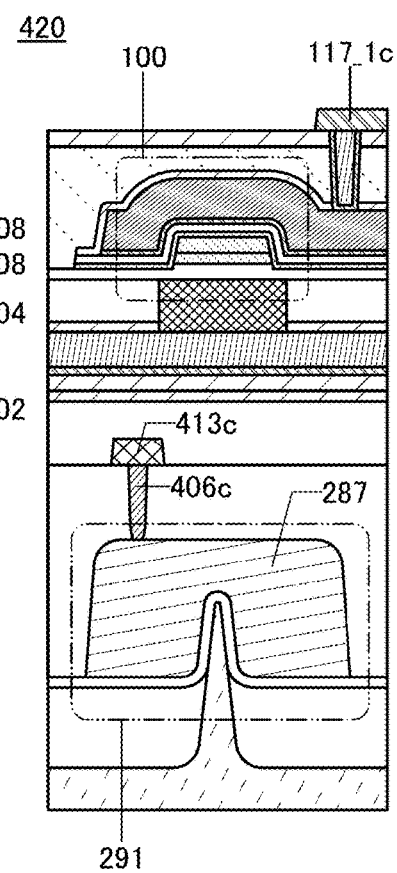
Figure 28C:
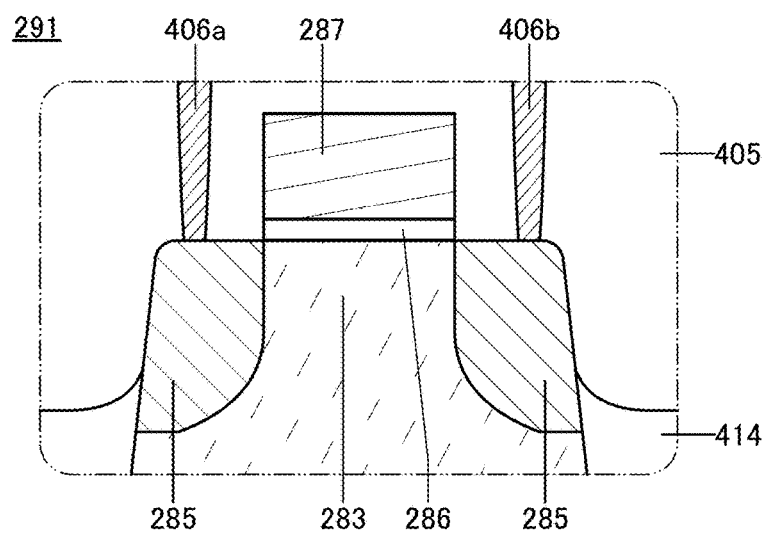

FIGS. 28A to 28C are cross-sectional views of a semiconductor device 420. The semiconductor device 420 has a structure obtained by replacing the transistor 281 of the semiconductor device 400 with a FIN-type transistor 291. The effective channel width is increased in the FIN-type transistor, whereby the on-state characteristics of the transistor can be improved. In addition, since contribution of the electric field of the gate electrode to the channel formation region can be increased, the off-state characteristics of the transistor can be improved.

Modification Example 3

Figure 29:
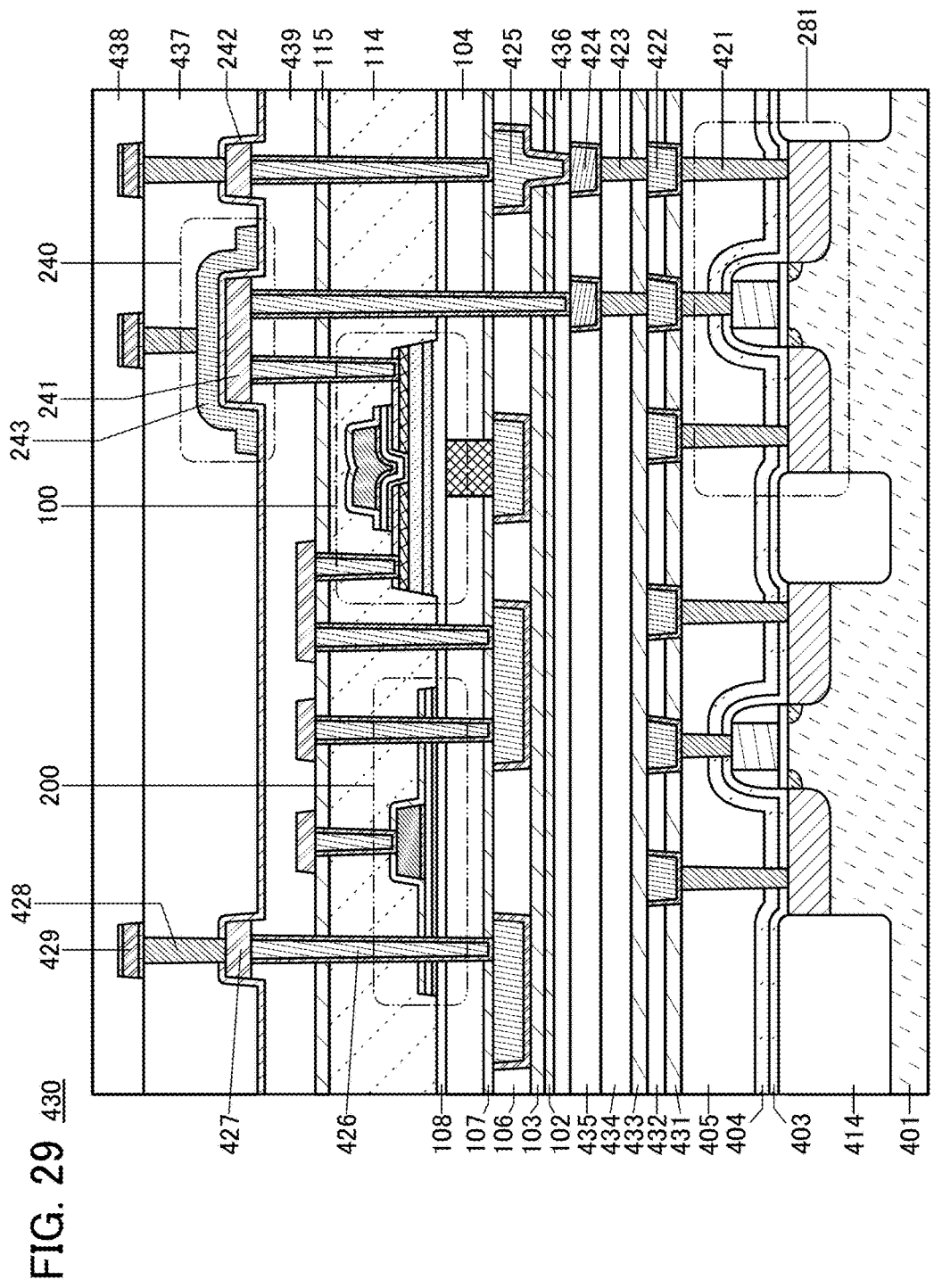
FIG. 29 illustrates a semiconductor device.

FIG. 29 is a cross-sectional view of a semiconductor device 430. The semiconductor device 430 includes the transistor 100, the transistor 200, the transistor 281, and a capacitor 240. In the semiconductor device 430, an insulating layer 431, an insulating layer 432, an insulating layer 433, an insulating layer 434, an insulating layer 435, and an insulating layer 436 are provided over the insulating layer 405 covering the transistor 281. Furthermore, in the semiconductor device 430, an electrode 422 and an electrode 424 are provided over the insulating layer 405.

The electrode 422 is provided to be embedded in the insulating layers 431 and 432 and is electrically connected to the transistor 281 through an electrode 421 provided in the insulating layers 403 to 405.

The electrode 424 is provided to be embedded in the insulating layer 435 and is electrically connected to the electrode 422 through an electrode 423 provided in the insulating layers 433 and 434.

In the semiconductor device 430, the transistors 100 and 200 are provided over the insulating layer 436 with the insulating layers 102 and 103 and the like located therebetween. The insulating layer 439 is provided over the transistors 100 and 200 with the insulating layer 114 and the like located therebetween, and an electrode 427 and an electrode 241 are provided over the insulating layer 439. An insulating layer 242 covering the electrodes 427 and 241 is provided. Furthermore, an electrode 243 covering the electrode 241 is provided over the insulating layer 242.

A region where the electrode 241, the insulating layer 242, and the electrode 243 overlap with each other functions as the capacitor 240. By providing the electrode 243 to cover the electrode 241, not only a top surface but also side surfaces of the electrode 241 can function as the capacitor.

The electrode 427 is electrically connected to a source or a drain of the transistor 200 through an electrode 426.

An insulating layer 437 is provided over the electrode 243 and the insulating layer 242, an electrode 429 is provided over the insulating layer 437, and an insulating layer 438 is provided over the electrode 429. The electrode 429 is electrically connected to the electrode 427 through an electrode 428 provided in a portion of the insulating layer 437.

The insulating layers 431 to 439 and 242 can be formed using a material and a method that are similar to those of the insulating layers described in the above embodiments and the like. Furthermore, the electrodes 421 to 429, 241, and 243 can be formed using a material and a method that are similar to those of the electrodes described in the above embodiments and the like.

The electrodes 421 to 429 may be formed by a damascene method, a dual damascene method, or the like.

<Example of Semiconductor Circuit>

The transistors disclosed in this specification and the like can be used in a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integration circuit, a differentiation circuit, and a memory element.

Figure 30A:
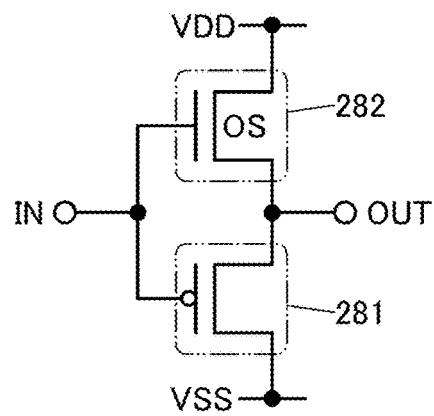
FIGS. 30A to 30C are each a circuit diagram of a semiconductor device.
Figure 30B:
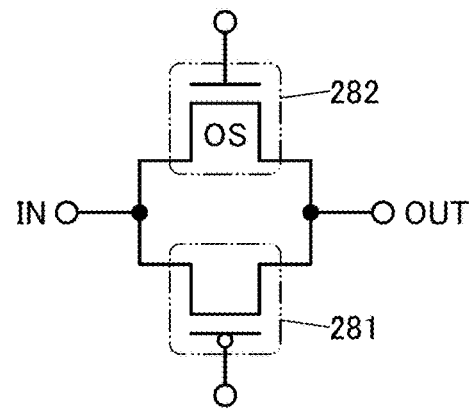
Figure 30C:
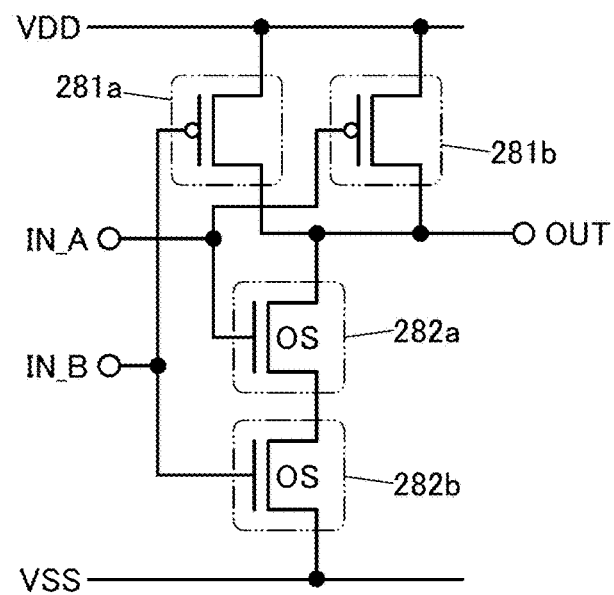

Examples of a semiconductor circuit including the transistor disclosed in this specification and the like are illustrated in circuit diagrams in FIGS. 30A to 30C. In the circuit diagrams and the like, "OS" is given beside the circuit symbol of a transistor that is preferably an OS transistor.

The semiconductor circuit illustrated in FIG. 30A has a configuration of an inverter circuit in which the p-channel transistor 281 and the n-channel transistor 282 are connected to each other in series and in which gates of the transistors are connected to each other.

The semiconductor circuit illustrated in FIG. 30B has a configuration of an analog switch circuit in which the p-channel transistor 281 and the n-channel transistor 282 are connected to each other in parallel.

The semiconductor circuit illustrated in FIG. 30C has a configuration of a NAND circuit including a transistor 281a, a transistor 281b, a transistor 282a, and a transistor 282b. A potential output from the NAND circuit depends on the combination of potentials input to an input terminal IN_A and an input terminal IN_B.

<Examples of Memory Element>

Figure 31A:
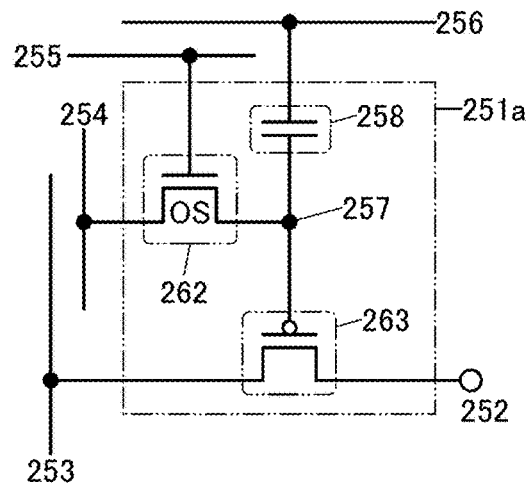
FIGS. 31A to 31D are each a circuit diagram of a semiconductor device.

The semiconductor circuit illustrated in FIG. 31A has a configuration of a memory element 251a in which one of a source and a drain of a transistor 262 is connected to a gate of a transistor 263 and one electrode of a capacitor 258. The circuit illustrated in FIG. 31B has a configuration of a memory element 261a in which one of the source and the drain of the transistor 262 is connected to one electrode of the capacitor 258.

The memory element 251a and the memory element 261a can each store charge injected through a wiring 254 and the transistor 262 at a node 257. The transistor 262 is an OS transistor, which enables charge to be stored at the node 257 for a long period.

The memory element 251a includes the transistor 263. Although the transistor 263 is a p-channel transistor in FIG. 31A, the transistor 263 may be an n-channel transistor. For example, the transistor 281 or the transistor 282 may be used as the transistor 263. An OS transistor may also be used as the transistor 263.

Figure 31B:
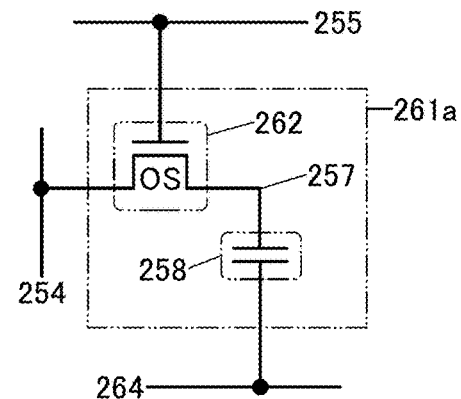

The memory element 251a in FIG. 31A and the memory element 261a in FIG. 31B are described in detail here.

The memory element 251a includes the transistor 263 using a first semiconductor, the transistor 262 using a second semiconductor, and the capacitor 258.

As the transistor 262, the OS transistors disclosed in the above embodiment can be used. The use of such a transistor with a low off-state current as the transistor 262 enables data to be retained at the node 257 for a long period. In other words, power consumption of the memory element can be reduced because refresh operation becomes unnecessary or the frequency of refresh operation can be extremely low.

In FIG. 31A, a wiring 252 is electrically connected to one of a source and a drain of the transistor 263, and a wiring 253 is electrically connected to the other of the source and the drain of the transistor 263. The wiring 254 is electrically connected to the other of the source and the drain of the transistor 262. A wiring 255 is electrically connected to a gate of the transistor 262. The gate of the transistor 263, the one of the source and the drain of the transistor 262, and the one electrode of the capacitor 258 are electrically connected to the node 257. A wiring 256 is electrically connected to the other electrode of the capacitor 258.

The memory element 251a illustrated in FIG. 31A has a feature that the charge supplied to the node 257 can be retained, and thus enables writing, retaining, and reading of data as follows.

[Writing and Retaining Operations]

Data writing and retaining operations of the memory element 251a are described. First, the potential of the wiring 255 is set to a potential at which the transistor 262 is on. Accordingly, the potential of the wiring 254 is supplied to the node 257. That is, a predetermined charge is supplied to the node 257 (writing). Here, one of two kinds of charges providing different potential levels (hereinafter also referred to as a "low-level charge" and a "high-level charge") is supplied. After that, the potential of the wiring 255 is set to a potential at which the transistor 262 is off. Thus, the charge is retained at the node 257 (retaining operation).

Note that the high-level charge is a charge that supplies a higher potential to the node 257 than the low-level charge. In the case where the transistor 263 is a p-channel transistor, each of the high-level and low-level charges is a charge that supplies a potential higher than the threshold voltage of the transistor 263. In the case where the transistor 263 is an n-channel transistor, each of the high-level and low-level charges is a charge that supplies a potential lower than the threshold voltage of the transistor 263. In other words, each of the high-level and low-level charges is a charge that supplies a potential at which the transistor 263 is off.

[Reading Operation 1]

Next, data reading operation is described. A reading potential $V_R$ is supplied to the wiring 256 while a predetermined potential (a constant potential) different from the potential of the wiring 253 is supplied to the wiring 252, whereby data retained at the node 257 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 256 in a period during which data is not read is set to a potential higher than $V_H$ in the case where the transistor 263 is a p-channel transistor, and is set to a potential lower than $V_L$ in the case where the transistor 263 is an n-channel transistor.

For example, in the case where the transistor 263 is a p-channel transistor, $V_R$ is −2 V when $V_{th}$ of the transistor 263 is −2 V, $V_H$ is 1 V, and $V_L$ is −1 V. When the potential written to the node 257 is $V_H$ and $V_R$ is applied to the wiring 256, $V_R+V_H$, i.e., −1 V, is applied to the gate of the transistor 263. Since −1 V is higher than $V_{th}$, the transistor 263 is not turned on. Thus, the potential of the wiring 253 is not changed. When the potential written to the node 257 is $V_L$ and $V_R$ is applied to the wiring 256, $V_R+V_L$, i.e., −3 V, is applied to the gate of the transistor 263. Since −3 V is lower than $V_{th}$, the transistor 263 is turned on. Thus, the potential of the wiring 253 is changed.

In the case where the transistor 263 is an n-channel transistor, $V_R$ is 2 V when $V_{th}$ of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than $V_{th}$, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than $V_{th}$, the transistor 263 is not turned on. Thus, the potential of the wiring 253 is not changed.

By determining the potential of the wiring 253, data retained at the node 257 can be read.

The memory element 261a illustrated in FIG. 31B is different from the memory element 251a in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261a in a manner similar to that of the memory element 251a.

[Reading Operation 2]

Data reading operation of the memory element 261a is described. When a potential at which the transistor 262 is turned on is supplied to the wiring 255, the wiring 254 that is in a floating state and the capacitor 258 are brought into conduction, and the charge is redistributed between the wiring 254 and the capacitor 258. As a result, the potential of the wiring 254 is changed. The amount of change in the potential of the wiring 254 depends on the potential of the node 257 (or the charge accumulated in the node 257).

For example, the potential of the wiring 254 after the charge redistribution is $(C_B \times V_{B0} + C \times V)/(C_B + C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0$ ($V_1 > V_0$), the potential of the wiring 254 in the case of retaining the potential $V_1$ ($=(C_B \times V_{B0} + C \times V_1)/(C_B + C)$) is higher than the potential of the wiring 254 in the case of retaining the potential $V_0$ ($=(C_B \times V_{B0} + C \times V_0)/(C_B + C)$).

Then, by comparing the potential of the wiring 254 with a predetermined potential, data can be read.

When including a transistor using an oxide semiconductor and having an extremely low off-state current, the memory element described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory element, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

Figure 31C:
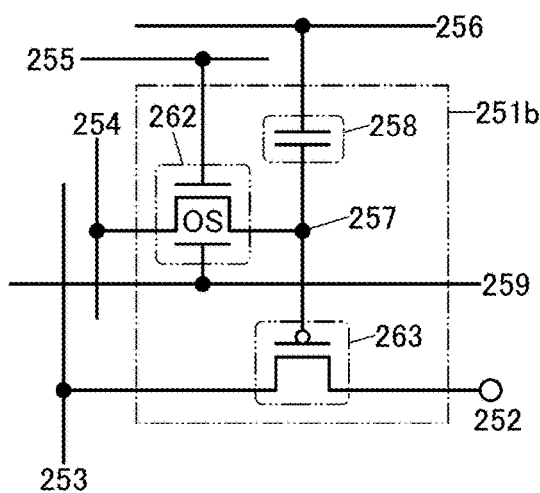
Figure 31D:
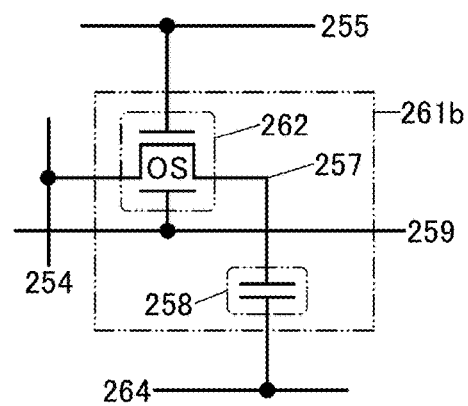

The transistor 262 may be a transistor including a back gate. By controlling the potential supplied to the back gate, the threshold voltage of the transistor 262 can be appropriately changed. A memory element 251b illustrated in FIG. 31C has substantially the same circuit configuration as the memory element 251a. The memory element 251b is different from the memory element 251a in that a transistor including a back gate is used as the transistor 262. A memory element 261b illustrated in FIG. 31D has substantially the same circuit configuration as the memory element 261a. The memory element 261b is different from the memory element 261a in that a transistor including a back gate is used as the transistor 262.

In each of the memory elements 251b and 261b, the back gate of the transistor 262 is electrically connected to a wiring 259. By controlling the potential supplied to the wiring 259, the threshold voltage of the transistor 262 can be appropriately changed.

<Examples of Memory Device>

Examples of a memory device including any of the above memory elements are shown in circuit diagrams in FIGS. 32A and 32B. A memory device 300 illustrated in FIG. 32A includes a memory circuit 310 and a voltage retention circuit 320. A memory device 300a illustrated in FIG. 32B includes a memory circuit 310a and a voltage retention circuit 320a. The memory circuits 310 and 310a each include a plurality of memory elements. FIGS. 32A and 32B illustrate the case where three memory elements 261b (memory elements 261b_1 to 261b_3) are provided.

In the memory device 300 illustrated in FIG. 32A, the memory element 261b_1 included in the memory circuit 310 is electrically connected to a wiring 255_1 and a wiring 254_1. The memory element 261b_2 included in the memory circuit 310 is electrically connected to a wiring 255_2 and a wiring 254_2. The memory element 261b_3 included in the memory circuit 310 is electrically connected to a wiring 255_3 and a wiring 254_3. The memory elements 261b_1 to 261b_3 included in the memory circuit 310 are electrically connected to the wiring 264.

In the memory device 300a illustrated in FIG. 32B, the memory elements 261b_1 to 261b_3 included in the memory circuit 310a are electrically connected to the wiring 255. The memory element 261b_1 included in the memory circuit 310a is electrically connected to the wiring 254_1 and a wiring 264_1. The memory element 261b_2 included in the memory circuit 310a is electrically connected to the wiring 254_2 and a wiring 264_2. The memory element 261b_3 included in the memory circuit 310a is electrically connected to the wiring 254_3 and a wiring 264_3.

Note that the above description of the memory element 261b can be referred to for structures, operations, and the like of the memory elements 261b_1 to 261b_3. Thus, detailed description is omitted here.

The voltage retention circuit 320 includes a transistor 323 and a capacitor 324. In FIG. 32A, the transistor 323 is a transistor including a back gate. One of a source and a drain of the transistor 323 is electrically connected to a terminal 321. The other of the source and the drain, a gate, and the back gate of the transistor 323 are electrically connected to the wiring 259. One electrode of the capacitor 324 is electrically connected to the wiring 259. The other electrode of the capacitor 324 is electrically connected to a wiring 322.

The voltage retention circuit 320a includes a transistor 323a and the capacitor 324. The transistor 323a is different from the transistor 323 in not including a back gate. One of a source and a drain of the transistor 323a is electrically connected to the terminal 321. The other of the source and the drain and a gate of the transistor 323a are electrically connected to the wiring 259. One electrode of the capacitor 324 is electrically connected to the wiring 259. The other electrode of the capacitor 324 is electrically connected to the wiring 322.

In the memory devices 300 and 300a, the potential of the wiring 259 can be changed by controlling the potential of the wiring 322. In the reading operation and the writing operation of the memory devices 300 and 300a, a potential is supplied to the wiring 322 so that the potential of the wiring 259 is higher than a negative potential (a potential lower than GND) described later and lower than a potential corresponding to the $V_{th}$ of the transistor 262 (a potential at which the transistor 262 is turned on).

In the case where gates of the transistors 262 in the memory elements 261b_1 to 261b_3 are electrically connected to the wiring 255 as in the memory device 300a, the potential of the wiring 259 may be higher than or equal to a potential corresponding to the $V_{th}$ of the transistor 262.

By controlling the potential of the wiring 259, the operation speed of the transistor 262 can be increased. Furthermore, the apparent $V_{th}$ of the transistor 262 can be small. Thus, the data writing speed and the data reading speed can be increased.

In the retention operation of the memory circuit 310 (memory circuit 310a), a fixed potential is supplied to the wiring 322. For example, GND is supplied. After that, a negative potential (a potential lower than GND) is supplied to the terminal 321. When a negative potential is supplied to the terminal 321, the gate potential of the transistor 323 (transistor 323a) becomes relatively high, so that the transistor 323 (transistor 323a) is turned on. Consequently, the negative potential is supplied to the wiring 259 through the transistor 323 (transistor 323a). More accurately, the wiring 259 is supplied with a potential higher than the negative potential by the $V_{th}$ of the transistor 323 (transistor 323a). Note that the wiring 259 is supplied with the negative potential in this embodiment for easy understanding.

When the wiring 259 is supplied with a negative potential, the potential of the back gate of the transistor 262 is decreased, and the transistor 262 is turned off; thus, data written to the memory circuit 310 (memory circuit 310a) can be retained. Furthermore, by supplying the negative potential to the back gate of the transistor 262, apparent $V_{th}$ of the transistor is increased. Thus, even when the potential of the gate of the transistor 262 is changed, data written to the memory circuit 310 (memory circuit 310a) can be retained.

Next, a potential higher than or equal to GND is supplied to the terminal 321. For example, GND is supplied. Since the potential of the wiring 259 is a negative potential, the potential of the gate of the transistor becomes a negative potential. Accordingly, the transistor 323 (transistor 323a) is turned off. Even when power supply to the memory device 300 (memory device 300a) is stopped after that, the transistors 323 (323a) and 262 can remain off.

The voltage retention circuit 320 (voltage retention circuit 320a) has a function of suppressing a change in the potential of the wiring 259 in the retention operation of the memory device 300 (memory device 300a). The voltage retention circuit 320 (voltage retention circuit 320a) has a function of suppressing a change in the potential of the wiring 259 even when power supply to the memory device 300 (memory device 300a) is stopped. In other words, the voltage retention circuit 320 (voltage retention circuit 320a) has a function of retaining the voltage of the wiring 259. The transistor 323 (transistor 323a) is preferably a transistor having a low off-state current because it retains the voltage of the wiring 259. For example, when the capacitance of the capacitor 324 is 10 pF and an acceptable increase in potential of the wiring 259 is 0.5 V, it takes an hour until the potential of the wiring 259 is increased by 0.5 V in the case where the off-state current of the transistor 323 (transistor 323a) is $1.39 \times 10^{-15}$ A, a day in the case where the off-state current of the transistor 323 (transistor 323a) is $5.79 \times 10^{-17}$ A, a year in the case where the off-state current of the transistor 323 (transistor 323a) is $1.59 \times 10^{-19}$ A, and ten years in the case where the off-state current of the transistor 323 (transistor 323a) is $1.59 \times 10^{-20}$ A. When the off-state current of the transistor 323 (transistor 323a) is lower than or equal to $1.59 \times 10^{-20}$ A, data written to the memory circuit 310 (memory circuit 310a) can be retained for ten years or more.

For example, by using an OS transistor as the transistor 323 (transistor 323a), a transistor having an extremely low off-state current can be obtained. In order to reduce the off-state current, the transistor 323 (transistor 323a) is preferably a transistor having a long channel length. Alternatively, the transistor 323 (transistor 323a) is preferably a transistor with a short channel width. Alternatively, the transistor 323 (transistor 323a) is preferably a transistor with a channel length longer than a channel width.

The transistor 323 (transistor 323a) is particularly preferably a transistor having a low drain current (off-state current) at $V_g$ of 0 V. Thus, a transistor having high $V_{th}$ is preferably used as the transistor 323 (transistor 323a). As the transistor having high $V_{th}$, the transistor 200 described above or the like can be used.

As the transistor 262, which performs data writing and data reading, a transistor having a low $V_{th}$ is preferably used. The drain current (off-state current) of the transistor 262 when $V_g$ is 0 V is higher than that of the transistor 323 (transistor 323a) in some cases. As the transistor 262, a transistor having a high on-state current and high field-effect mobility is preferably used. Thus, the on-state current and field-effect mobility of the transistor 262 are higher than those of the transistor 323 (transistor 323a) in some cases. As the transistor 262, the transistor 100 described above or the like can be used.

Figure 33:
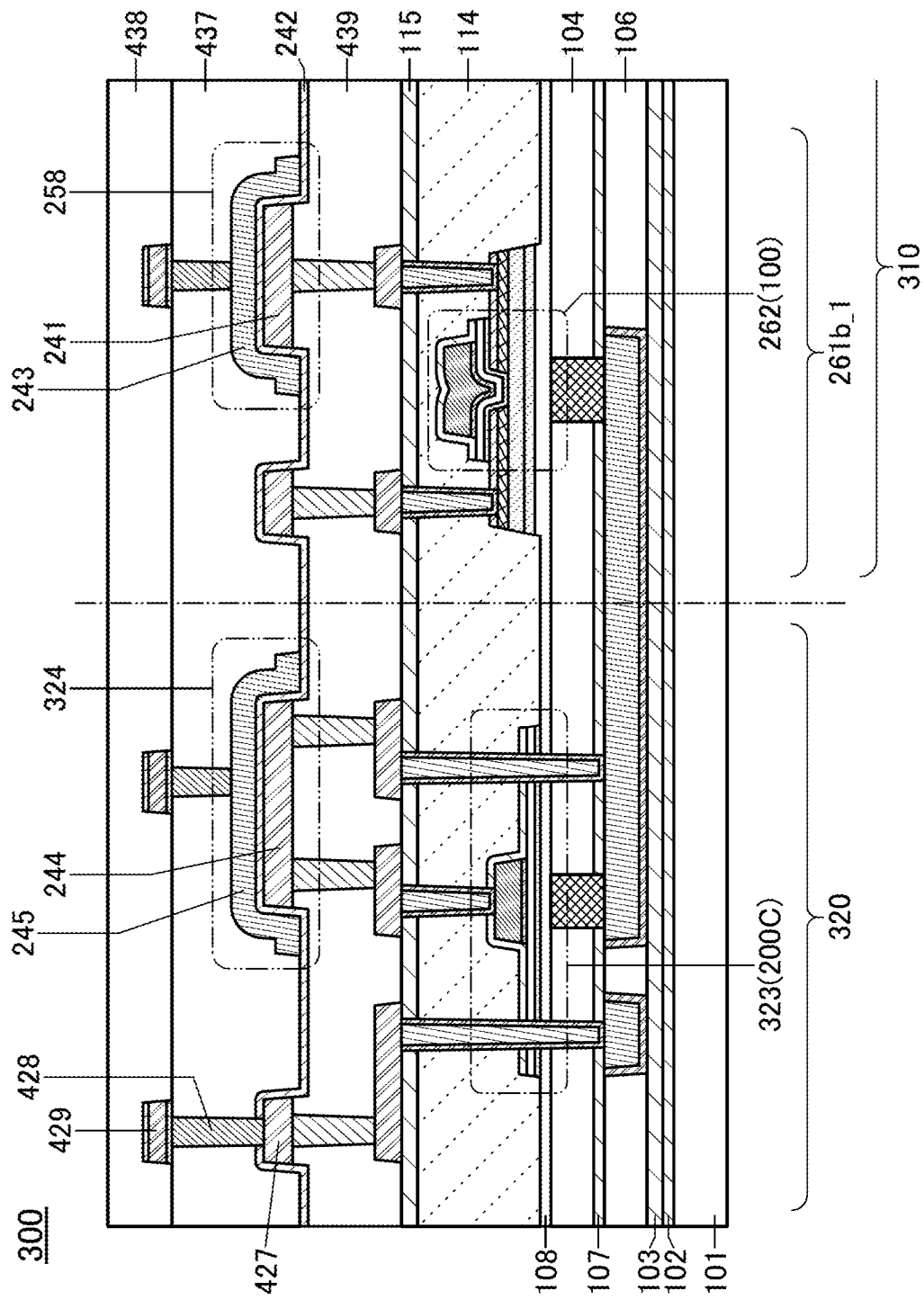
FIG. 33 illustrates an example of a structure of a memory device.

FIG. 33 illustrates part of a cross-sectional structure of the memory device 300 in the case where the transistor 100 is used as the transistor 262 of the memory circuit 310 and the transistor 200C is used as the transistor 323 of the voltage retention circuit 320.

In FIG. 33, the memory device 300 includes the transistor 262 and the transistor 323 over the substrate 101 with the insulating layers 102 and 103 provided therebetween; the insulating layer 115 and the insulating layer 439 over the transistors 262 and 323; the electrode 241, an electrode 244, and the electrode 427 over the insulating layer 439; the insulating layer 242 covering the electrodes 241, 244, and 427; and the electrode 243 covering the electrode 241 and an electrode 245 covering the electrode 244 over the insulating layer 242.

A region where the electrode 241, the insulating layer 242, and the electrode 243 overlap with each other functions as the capacitor 258. By providing the electrode 243 to cover the electrode 241, not only a top surface but also side surfaces of the electrode 241 can function as the capacitor. A region where the electrode 244, the insulating layer 242, and the electrode 245 overlap with each other functions as the capacitor 324. By providing the electrode 245 to cover the electrode 244, not only a top surface but also side surfaces of the electrode 244 can function as the capacitor.

The electrode 241 is electrically connected to one of a source and a drain of the transistor 262 through an electrode provided in a portion of the insulating layer 439 and an electrode provided in a portion of each of the insulating layers 115 and 114 and the layer 129.

The insulating layer 437 is provided over the electrode 243, the electrode 245, and the insulating layer 242, the electrode 429 is provided over the insulating layer 437, and the insulating layer 438 is provided over the electrode 429. The electrode 429 is electrically connected to the electrode 427 through the electrode 428 provided in a portion of the insulating layer 437.

The other of the source and the drain of the transistor 323 is electrically connected to a gate of the transistor 323 and a back gate of the transistor 262. Although not illustrated, the gate and back gate of the transistor 323 are electrically connected to each other.

The insulating layers 439, 242, 437, and 438 can be formed using a material and a method that are similar to those of the insulating layers described in the above embodiment or the like. The electrodes 427, 241, 243, 244, 245, 428, and 429 can be formed using a material and a method that are similar to those of the electrodes described in the above embodiment or the like. The electrodes 241, 244, and 427 can be formed through the same steps at the same time. The electrodes 243 and 245 can be formed through the same steps at the same time.

According to one embodiment of the present invention, transistors having different electrical characteristics can be manufactured through substantially the same process. Thus, according to one embodiment of the present invention, a memory device with high productivity can be provided. According to one embodiment of the present invention, a memory device that can retain data for a long period even when power supply is stopped can be provided. For example, a memory device that can retain data for a year or more, ten years or more after power supply is stopped can be provided. Thus, a memory device of one embodiment of the present invention can be regarded as a nonvolatile memory.

<Example of CPU>

Figure 34:
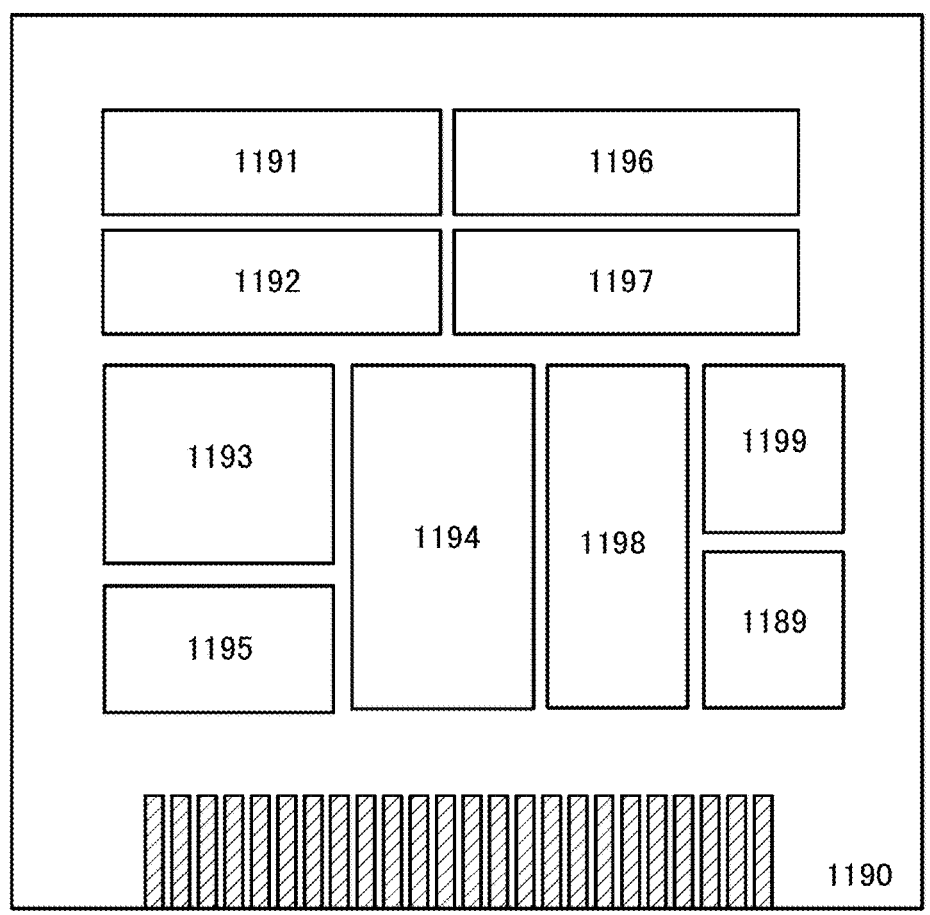
FIG. 34 is a block diagram showing a structure example of a CPU.

Next, an example of a CPU including any of the above-described transistors and/or semiconductor devices is described. FIG. 34 is a block diagram illustrating a structure example of the CPU including any of the above-described transistors as a component.

The CPU illustrated in FIG. 34 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 34 is just an example in which the structure is simplified, and an actual CPU may have a variety of structures depending on the application. For example, the CPU may have the following structure: a structure including the CPU illustrated in FIG. 34 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 34, a memory cell is provided in the register 1196. For the memory cell of the register 1196, any of the above-described transistors, the above-described memory device, or the like can be used.

In the CPU illustrated in FIG. 34, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to a memory element in the register 1196. When data retaining by the capacitor is selected, the data is rewritten in the capacitor, and supply of the power supply voltage to the memory cell in the register 1196 can be stopped.

<Example of RF Tag>

Figure 35:
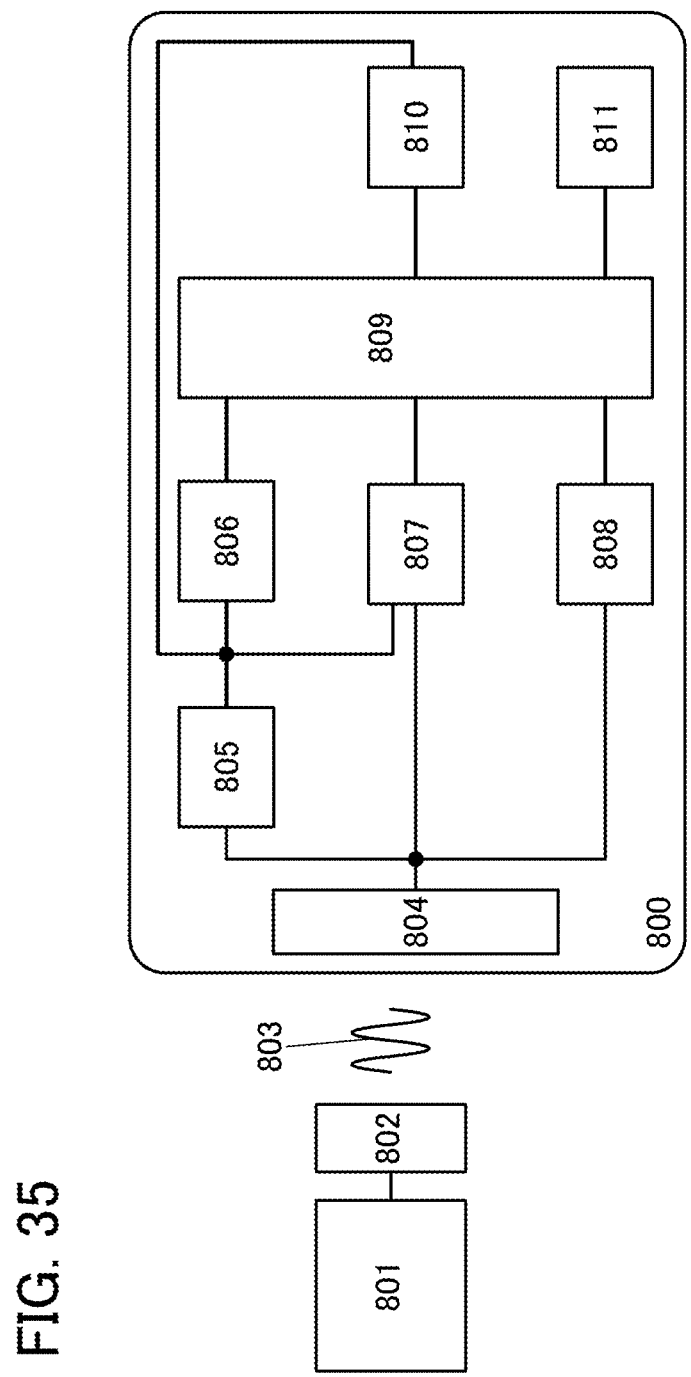
FIG. 35 is a block diagram of an RF tag.
Figure 36A:
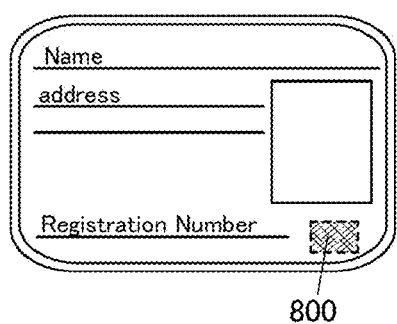
FIGS. 36A to 36F illustrate application examples of an RF tag.
Figure 36B:
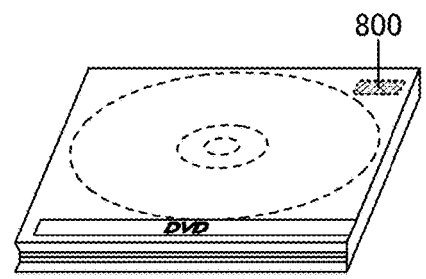
Figure 36C:
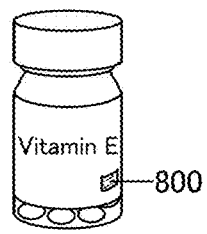
Figure 36D:
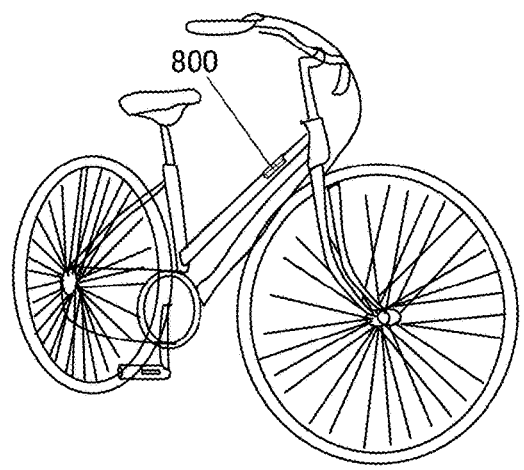
Figure 36E:
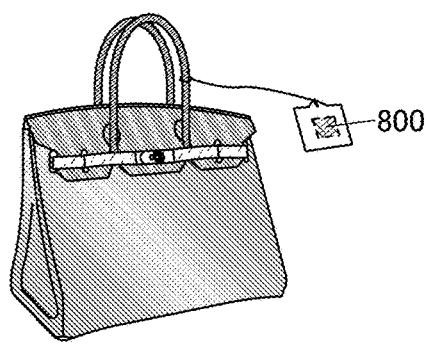
Figure 36F:
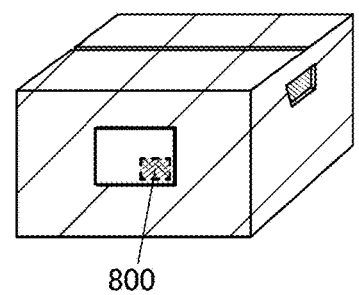

Next, an example of an RF tag including any of the above-described transistors and/or semiconductor devices is described. FIG. 35 is a block diagram illustrating a structure example of an RF tag.

The RF tag of one embodiment of the present invention includes a memory circuit (memory device), stores data in the memory circuit, and transmits and receives data to/from the outside with use of contactless means, for example, wireless communication. The RF tag with these features can be used for an individual authentication system in which an object or the like is recognized by reading the individual information, for example. In order that the RF tag is used for such application, high reliability is needed.

As shown in FIG. 35, an RF tag 800 includes an antenna 804 that receives a radio signal 803 that is transmitted from an antenna 802 connected to a communication device 801 (also referred to as an interrogator, a reader/writer, or the like). Any of the above-described transistors can be used for the communication device 801. The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a semiconductor that enables a reverse current to be low enough, for example, an oxide semiconductor. This can suppress reduction of a rectifying function due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit described above is provided can be determined as appropriate as needed.

Any of the semiconductor devices described above can be used as the memory circuit 810. Since the memory device of one embodiment of the present invention can retain data even when not powered, the memory device can be favorably used for an RF tag. In addition, the memory device of one embodiment of the present invention needs power (voltage) needed for data writing lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, putting identification numbers only to good products to be shipped is possible. Thus, the identification numbers of the shipped products are in series and customer management corresponding to the shipped products is easily performed.

Application examples of an RF tag of one embodiment of the present invention are described with reference to FIGS. 36A to 36F. The RF tag is widely used and can be provided for, for example, products, e.g., bills, coins, securities, bearer bonds, documents such as driver's licenses or resident's cards (see FIG. 36A), recording media such as DVD software or video tapes (see FIG. 36B), containers such as plates, cups, or bottles (see FIG. 36C), packaging containers such as wrapping paper, boxes, or ribbon, moving objects such as bicycles (see FIG. 36D), personal belongings such as bags or glasses, plants, animals, human bodies, clothing, household goods, medical supplies such as medicine and chemicals, and electronic devices (e.g., liquid crystal display devices, EL display devices, television sets, or cellular phones), or tags on products (see FIGS. 36E and 36F).

An RF tag 800 of one embodiment of the present invention is fixed to a product by being attached to a surface thereof or embedded therein. For example, the RF tag 800 is fixed to each product by being embedded in paper of a book, or embedded in an organic resin of a package. Since the RF tag 800 of one embodiment of the present invention can be reduced in size, thickness, and weight, it can be fixed to a product without spoiling the design of the product. Furthermore, a bill, a coin, a security, a bearer bond, a document, or the like can have an identification function by being provided with the RF tag 800 of one embodiment of the present invention, and the identification function can be utilized to prevent counterfeiting. Moreover, the efficiency of a system such as an inspection system can be improved by providing the RF tag 800 of one embodiment of the present invention for a packaging container, a recording medium, a personal belonging, clothing, household goods, an electronic device, or the like. A moving object can also have a higher level of security against theft or the like by being provided with the RF tag 800 of one embodiment of the present invention. As in the above cases, the RF tag 800 of one embodiment of the present invention can be used for a variety of applications.

<Imaging Device>

Next, an example of an imaging device that can include any of the above-described transistors or semiconductor devices is described. In this embodiment, an imaging device 610 is described with reference to drawings.

Figure 37A:
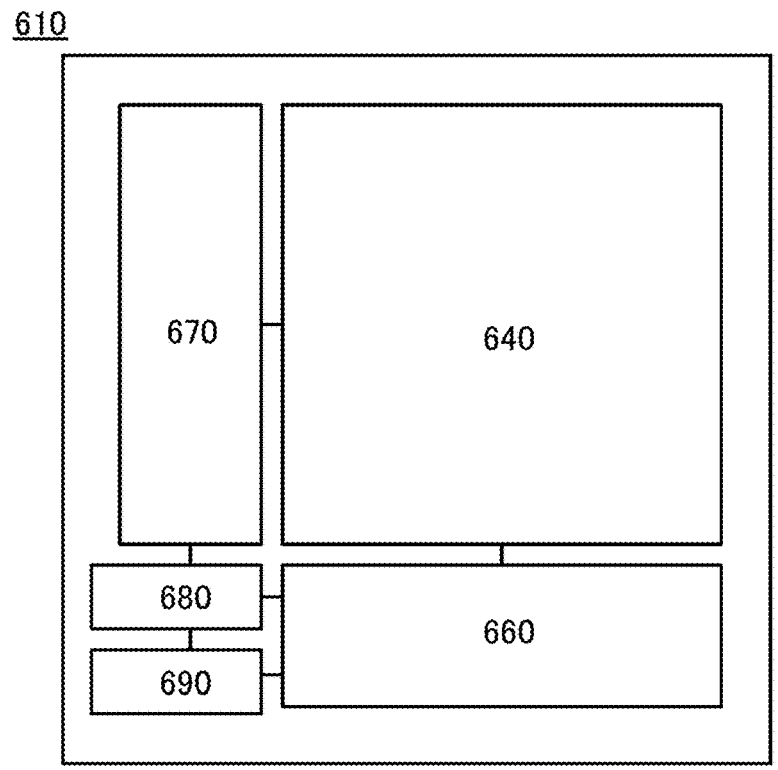
FIGS. 37A and 37B illustrate a structure example of an imaging device.

FIG. 37A is a plan view illustrating a configuration example of the imaging device 610. The imaging device 610 includes a pixel portion 640, a first circuit 660, a second circuit 670, a third circuit 680, and a fourth circuit 690. In this specification and the like, the first circuit 660 to the fourth circuit 690 and the like may be referred to as a "peripheral circuit" or a "driver circuit". For example, the first circuit 660 can be regarded as part of the peripheral circuit.

Figure 37B:
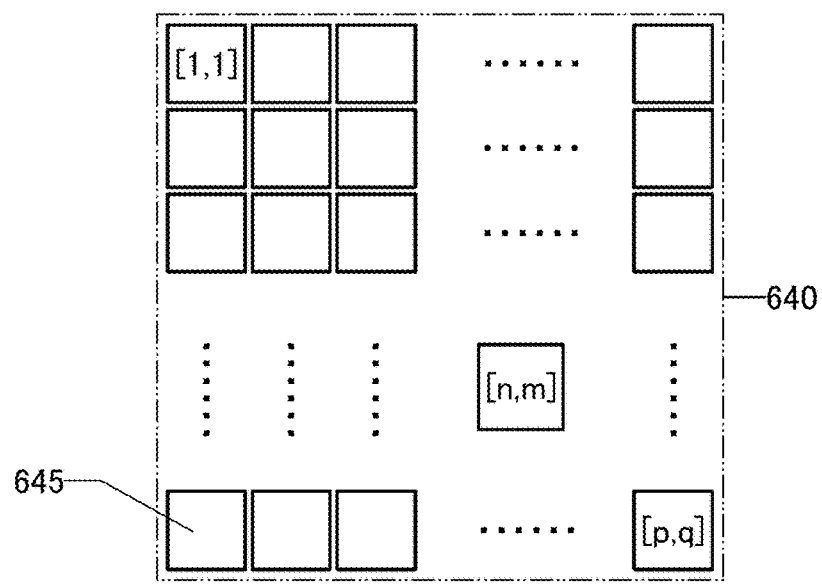

FIG. 37B illustrates a structure example of the pixel portion 640. The pixel portion 640 includes, for example, a plurality of pixels 645 (imaging elements) arranged in a matrix with p columns and q rows (p and q are each an integer greater than or equal to 2). Note that in FIG. 37B, n is a natural number of greater than or equal to 1 and smaller than or equal to p, and m is a natural number of greater than or equal to 1 and smaller than or equal to q.

For example, using the pixels 645 arranged in a 1920×1080 matrix, the imaging device 610 that can take an image with "full high definition" (also referred to as "2K resolution", "2K1K", "2K", and the like) can be obtained. Using the pixels 645 arranged in a 4096×2160 matrix, the imaging device 610 that can take an image with "ultra-high definition" (also referred to as "4K resolution", "4K2K", "4K", and the like) can be obtained. Using the pixels 645 arranged in a 8192×4320 matrix, the imaging device 610 that can take an image with "super high definition" (also referred to as "8K resolution", "8K4K", "8K", and the like) can be obtained. Using a larger number of pixels 645, the imaging device 610 that can take an image with 16K or 32K resolution can be obtained.

The first circuit 660 and the second circuit 670 are connected to the plurality of pixels 645 and have a function of supplying signals for driving the plurality of pixels 645. The first circuit 660 may have a function of processing an analog signal output from the pixel 645. The third circuit 680 may have a function of controlling the operation timing of the peripheral circuit. For example, the third circuit 680 may have a function of generating a clock signal. Furthermore, the third circuit 680 may have a function of converting the frequency of a clock signal supplied from the outside.

Moreover, the third circuit 680 may have a function of supplying a reference potential signal (e.g., a ramp wave signal).

Figure 38:
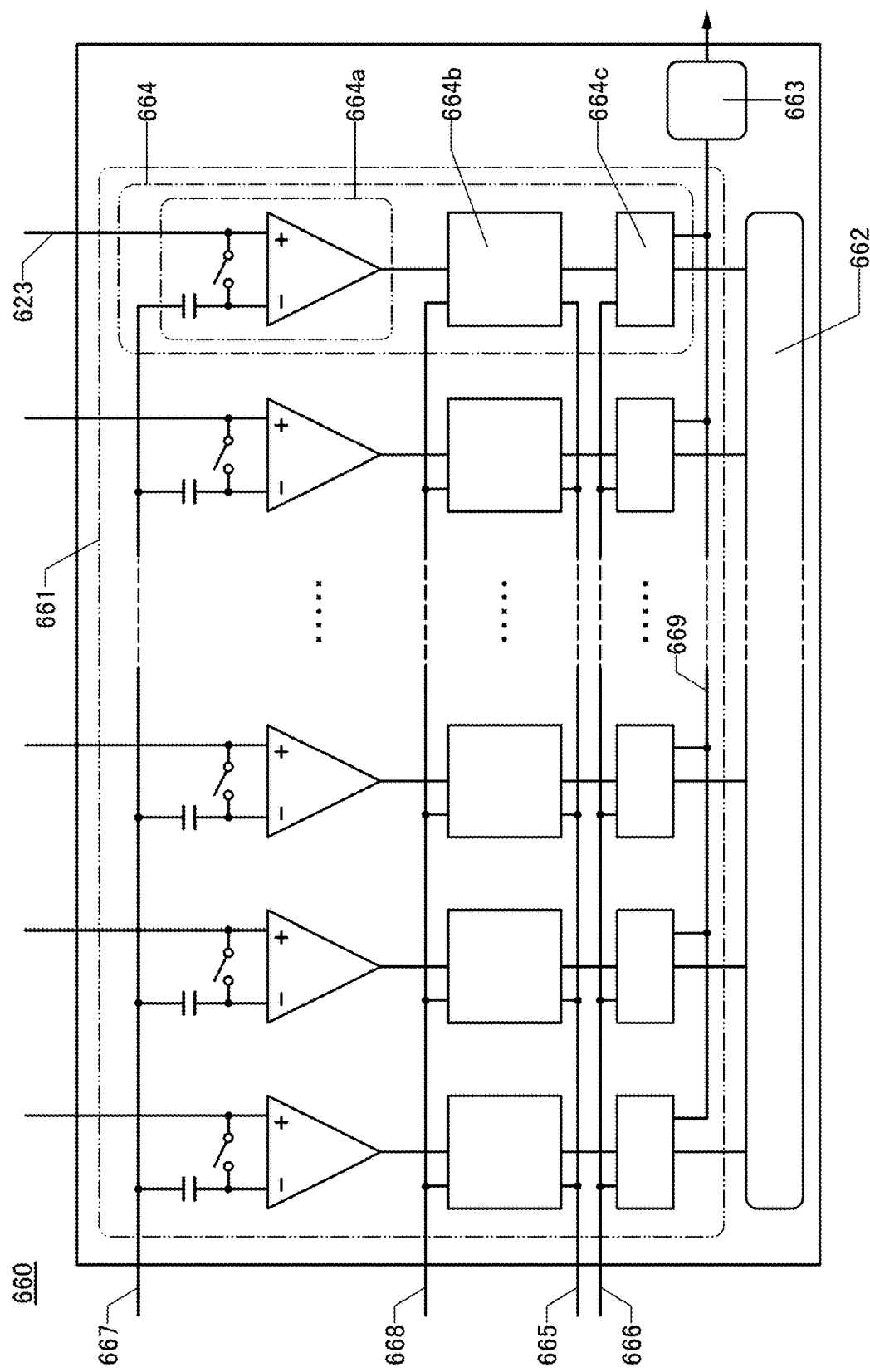
FIG. 38 illustrates a configuration example of a peripheral circuit.

FIG. 38 is a configuration example of the first circuit 660. The first circuit 660 illustrated in FIG. 38 includes a signal processing circuit 661, a column driver circuit 662, and an output circuit 663. The signal processing circuit 661 includes a circuit 664 provided in each column. The circuit 664 includes a circuit 664a that can remove noise by a correlated double sampling (CDS) method (also referred to as a "CDS circuit"), a counter circuit 664b, and a latch circuit 664c. The circuit 664 has a function of analog-digital conversion. The signal processing circuit 661 can function as a column-parallel (column type) analog-digital conversion device.

The circuit 664a includes a comparator, a switch, and a capacitor. Two input terminals of the comparator are connected to each other via the switch. As the switch, a transistor, a microelectromechanical systems (MEMS) element, or the like may be used. One terminal of the comparator is connected to a wiring 667 via the capacitor. The other terminal of the comparator is connected to a wiring 623 that is provided in each column. Note that the other terminal of the comparator and the wiring 623 may be connected to each other via a capacitor.

The circuit 664a has a function of comparing the potential of an analog signal (imaging data) input from the wiring 623 with that of a reference potential signal (e.g., a ramp wave signal) input from the wiring 667 and outputting an H potential or an L potential. A clock signal from a wiring 668 and the H potential or the L potential output from the circuit 664a are input to the counter circuit 664b. The counter circuit 664b measures the length of a period in which the H potential or the L potential is input and outputs the measurement result to the latch circuit 664c as an N-bit digital signal. A set signal or a reset signal is input from a wiring 665 to the counter circuit 664b. The latch circuit 664c has a function of holding the digital signal. A set signal or a reset signal is input from a wiring 666 to the latch circuit 664c.

The column driver circuit 662 is also referred to as a column selection circuit, a horizontal driver circuit, or the like. The column driver circuit 662 generates a selection signal for selecting a column from which the imaging data held in the latch circuit 664c is to be read. The column driver circuit 662 can be formed using a shift register or the like. Columns are sequentially selected by the column driver circuit 662, and the imaging data output from the latch circuit 664c in the selected column is input to the output circuit 663 via a wiring 669. The wiring 669 can function as a horizontal transfer line.

The imaging data input to the output circuit 663 is processed in the output circuit 663, and is output to the outside of the imaging device 610. The output circuit 663 can be formed using a buffer circuit, for example. The output circuit 663 may have a function of controlling the timing at which a signal is output to the outside of the imaging device 610.

The second circuit 670 has a function of generating and outputting a selection signal for selecting the pixel 645 from which a signal is read. Note that the second circuit 670 may also be referred to as a row selection circuit or a vertical driver circuit. In this manner, imaging data that is an analog signal can be converted to an N-bit digital signal to be output to the outside.

The peripheral circuit includes at least one of a logic circuit, a switch, a buffer, an amplifier circuit, and a converter circuit. A semiconductor device such as an IC chip may be used as part or the whole of the peripheral circuit. Furthermore, the semiconductor device of one embodiment of the present invention may be provided in part of the peripheral circuit.

Note that in the peripheral circuit, at least one of the first circuit 660 to the fourth circuit 690 may be omitted. For example, when one of the first circuit 660 and the fourth circuit 690 additionally has a function of the other of the first circuit 660 and the fourth circuit 690, the other of the first circuit 660 and the fourth circuit 690 may be omitted. For another example, when one of the second circuit 670 and the third circuit 680 additionally has a function of the other of the second circuit 670 and the third circuit 680, the other of the second circuit 670 and the third circuit 680 may be omitted. As another example, a function of another peripheral circuit may be added to one of the first to fourth circuits 660 to 690 to omit that peripheral circuit.

Figure 39A:
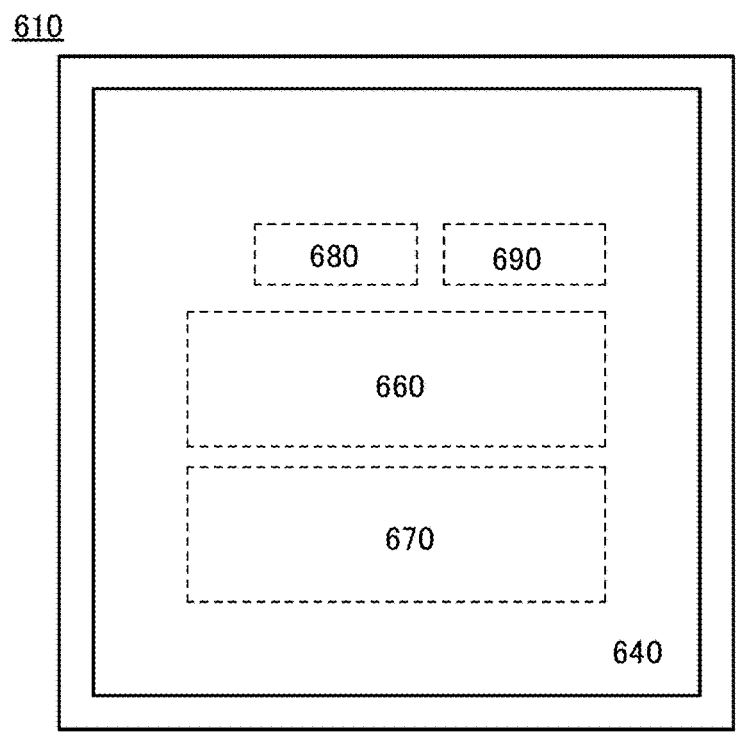
FIGS. 39A and 39B illustrate structure examples of an imaging device.
Figure 39B:
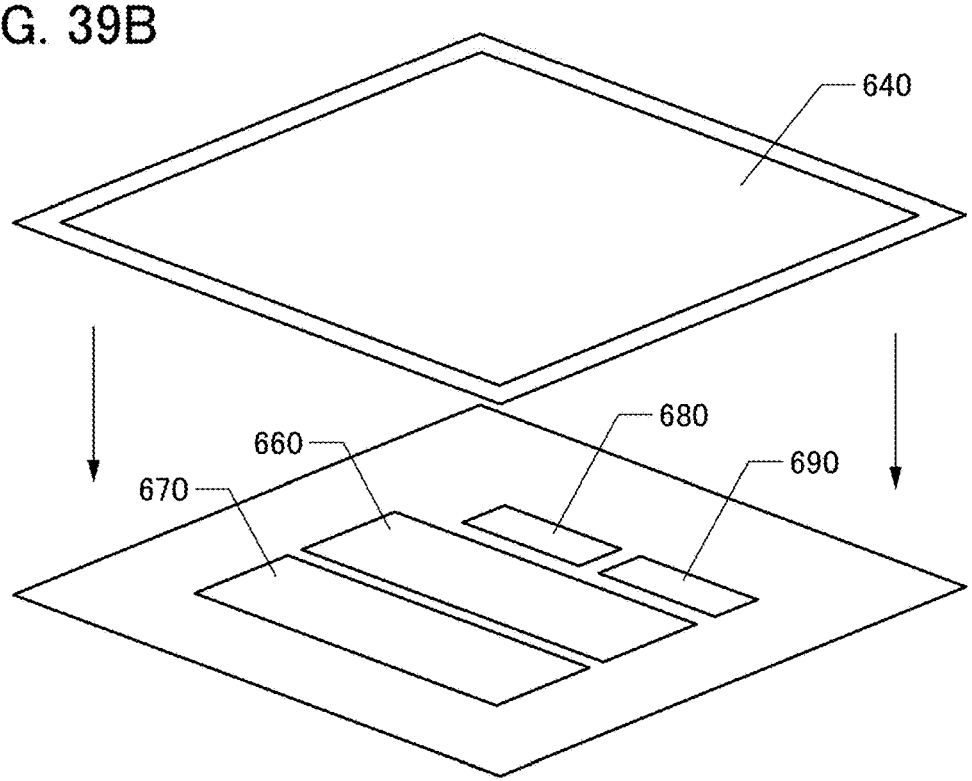

As illustrated in FIGS. 39A and 39B, the pixel portion 640 may be provided over the first circuit 660 to the fourth circuit 690 to overlap with the first circuit 660 to the fourth circuit 690. FIG. 39A is a top view of the imaging device 610 in which the pixel portion 640 is provided over the first circuit 660 to the fourth circuit 690 to overlap with the first circuit 660 to the fourth circuit 690. FIG. 39B is a perspective view illustrating the structure of the imaging device 610 illustrated in FIG. 39A.

The provision of the pixel portion 640 over the first circuit 660 to the fourth circuit 690 to overlap with the first circuit 660 to the fourth circuit 690 can increase the area occupied by the pixel portion 640 in the imaging device 610. Accordingly, the light sensitivity, the dynamic range, the resolution, the quality of a captured image, or the integration degree of the imaging device 610 can be improved.

[Pixel (Imaging Element)]

Figure 40A:
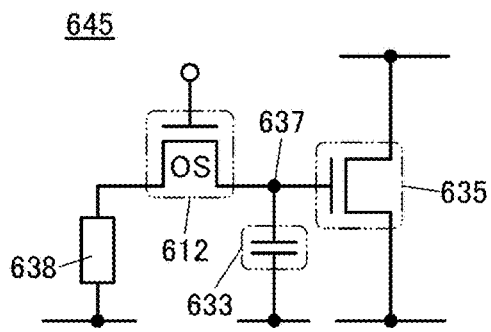
FIGS. 40A to 40C are each a circuit diagram illustrating an example of an imaging device.

Next, an example of a circuit that can be used for the pixel 645 is described. The pixel 645 illustrated in FIG. 40A includes a photoelectric conversion element 638, a transistor 612, a transistor 635, and a capacitor 633. One of a source and a drain of the transistor 612 is electrically connected to the photoelectric conversion element 638. The other of the source and the drain of the transistor 612 is electrically connected to a gate of the transistor 635 via a node 637 (charge accumulation portion).

The transistor 100 and/or the transistor 200 or the like described in the above embodiments may be used as the transistor 612 and/or the transistor 635. For example, the transistor 200 may be used as the transistor 612. For example, the transistor 100 may be used as the transistor 612.

Figure 40B:
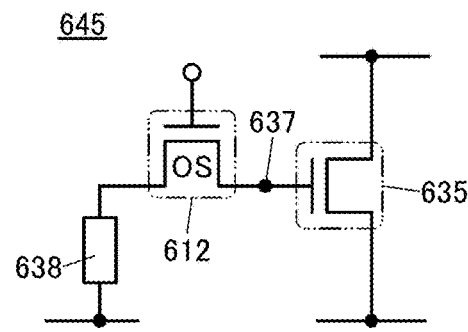

An OS transistor is preferably used as the transistor 612. Since the off-state current of the OS transistor is extremely low, the capacitor 633 can be small. Alternatively, the capacitor 633 can be omitted as in the pixel 645 illustrated in FIG. 40B. Furthermore, when the transistor 612 is an OS transistor, the potential of the node 637 is less likely to be changed. Thus, an imaging device that is less likely to be affected by noise can be provided. As the transistor 612, any of the transistors disclosed in the above embodiments, or the like, can be used. Note that the transistor 635 may be an OS transistor.

A diode element formed using a silicon substrate with a PN junction or a PIN junction can be used as the photoelectric conversion element 638. Alternatively, a PIN diode element formed using an amorphous silicon film, a microcrystalline silicon film, or the like may be used. Alternatively, a diode-connected transistor may be used. Still alternatively, a variable resistor or the like utilizing a photoelectric effect may be formed using silicon, germanium, selenium, or the like.

The photoelectric conversion element may be formed using a material capable of generating charge by absorbing a radiation. Examples of the material capable of generating charge by absorbing a radiation include lead iodide, mercury iodide, gallium arsenide, CdTe, and CdZn.

Figure 40C:
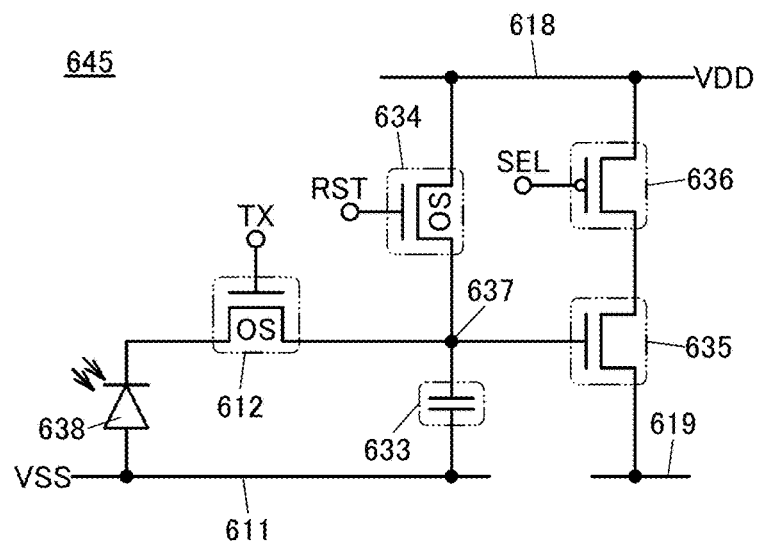

In the pixel 645 illustrated in FIG. 40C, a photodiode is used as the photoelectric conversion element 638. The pixel 645 illustrated in FIG. 40C includes the photoelectric conversion element 638, the transistor 612, a transistor 634, the transistor 635, a transistor 636, and the capacitor 633. The one of the source and the drain of the transistor 612 is electrically connected to a cathode of the photoelectric conversion element 638. The other of the source and the drain of the transistor 612 is electrically connected to the node 637. An anode of the photoelectric conversion element 638 is electrically connected to a wiring 611. One of a source and a drain of the transistor 634 is electrically connected to the node 637. The other of the source and the drain of the transistor 634 is electrically connected to a wiring 618. The gate of the transistor 635 is electrically connected to the node 637. One of a source and a drain of the transistor 635 is electrically connected to a wiring 619. The other of the source and the drain of the transistor 635 is electrically connected to one of a source and a drain of the transistor 636. The other of the source and the drain of the transistor 636 is electrically connected to the wiring 618. One electrode of the capacitor 633 is electrically connected to the node 637. The other electrode of the capacitor 633 is electrically connected to the wiring 611.

The transistor 612 can function as a transfer transistor. A gate of the transistor 612 is supplied with a transfer signal TX. The transistor 634 can function as a reset transistor. A gate of the transistor 634 is supplied with a reset signal RST. The transistor 635 can function as an amplifier transistor. The transistor 636 can function as a selection transistor. A gate of the transistor 636 is supplied with a selection signal SEL. Moreover, $V_{DD}$ is supplied to the wiring 618 and $V_{SS}$ is supplied to the wiring 611.

Next, operations of the pixel 645 illustrated in FIG. 40C are described. First, the transistor 634 is turned on so that $V_{DD}$ is supplied to the node 637 (reset operation). Then, the transistor 634 is turned off so that $V_{DD}$ is retained at the node 637. Next, the transistor 612 is turned on so that the potential of the node 637 is changed in accordance with the amount of light received by the photoelectric conversion element 638 (accumulation operation). After that, the transistor 612 is turned off so that the potential of the node 637 is retained. Next, the transistor 636 is turned on so that a potential corresponding to the potential of the node 637 is output to the wiring 619 (selection operation). Measuring the potential of the wiring 619 can determine the amount of light received by the photoelectric conversion element 638.

An OS transistor is preferably used as each of the transistors 612 and 634. Since the off-state current of the OS transistor is extremely low as described above, the capacitor 633 can be small or omitted. Furthermore, when the transistors 612 and 634 are OS transistors, the potential of the node 637 is less likely to be changed. Thus, an imaging device that is less likely to be affected by noise can be provided.

Figure 41:
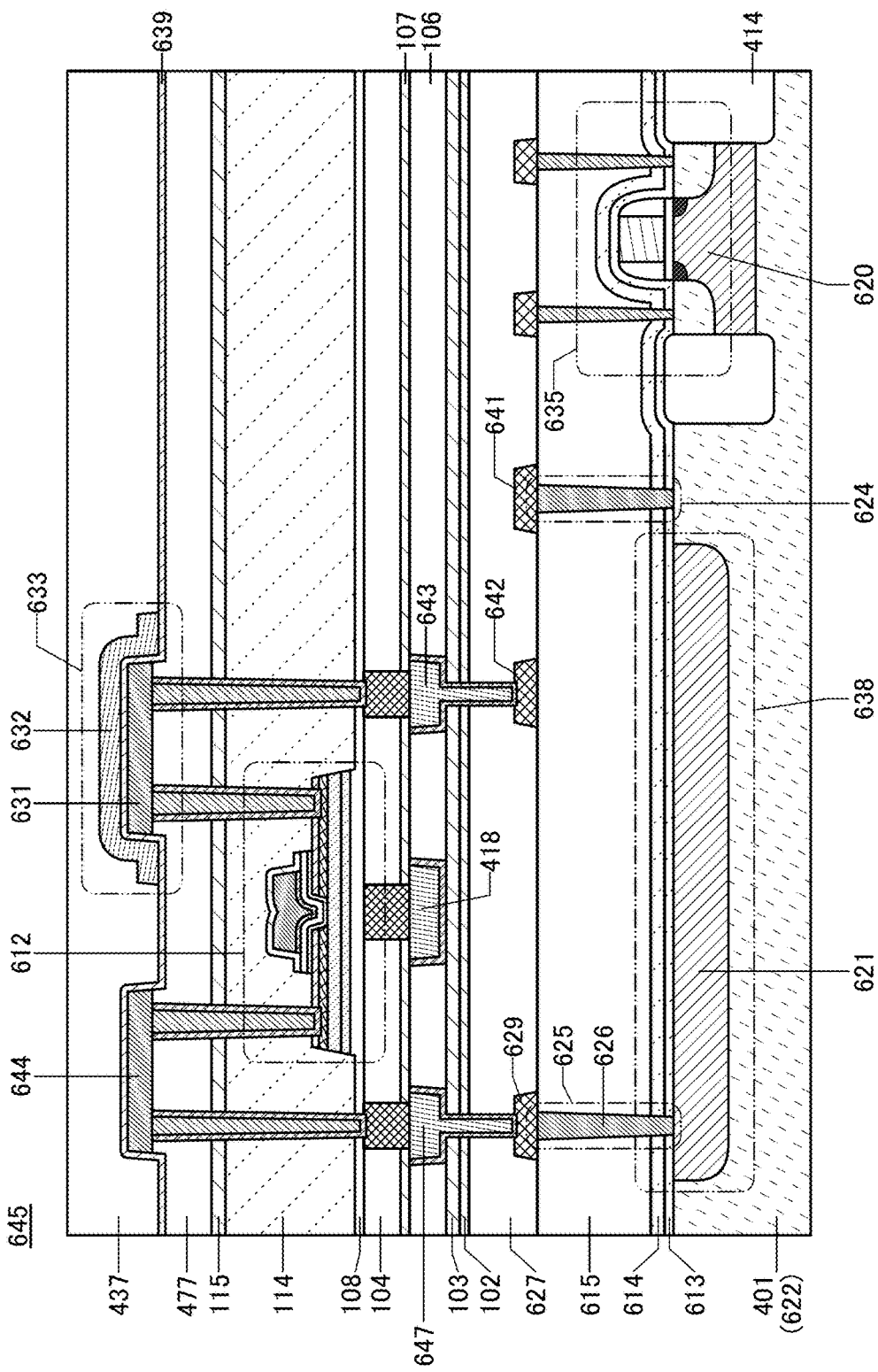
FIG. 41 illustrates a structure example of an imaging device.

FIG. 41 illustrates a structure example of the pixel 645. FIG. 41 is a cross-sectional view of the pixel 645. In the pixel 645 illustrated in FIG. 41, an n-type semiconductor is used for the substrate 401. A p-type semiconductor 621 of the photoelectric conversion element 638 is provided in the substrate 401. A portion of the substrate 401 functions as an n-type semiconductor 622 of the photoelectric conversion element 638.

The transistor 635 is provided on the substrate 401. The transistor 635 can function as an n-channel transistor. A well 620 of a p-type semiconductor is provided in a portion of the substrate 401. The well 620 can be provided by a method similar to that for forming the p-type semiconductor 621. The well 620 and the p-type semiconductor 621 can be formed at the same time. Note that the transistor 282 described above can be used as the transistor 635, for example.

An insulating layer 613, an insulating layer 614, and an insulating layer 615 are formed over the photoelectric conversion element 638 and the transistor 635. The insulating layers 613 to 615 can be formed using a material and a method that are similar to those of the other insulating layers described above.

An opening 624 is formed in the insulating layers 613 to 615 so as to overlap with the n-type semiconductor 622, and an opening 625 is formed in the insulating layers 613 to 615 to overlap with the p-type semiconductor 621. Contact plugs 626 are formed in the openings 624 and 625. The contact plugs 626 can be provided in a manner similar to that of the above-described contact plug. The number of openings (624 and 625) to be formed or their arrangement are not particularly limited. Thus, an imaging device with high layout flexibility can be provided.

An electrode 641, an electrode 642, and an electrode 629 are formed over the insulating layer 615. The electrode 641 is electrically connected to the n-type semiconductor 622 via the contact plug 626 provided in the opening 624. The electrode 629 is electrically connected to the p-type semiconductor 621 via the contact plug 626 provided in the opening 625.

An insulating layer 627 is formed so as to cover the electrode 641, the electrode 642, and the electrode 629. The insulating layer 627 can be formed using a material and a method that are similar to those of the insulating layer 615. A surface of the insulating layer 627 may be subjected to CMP treatment. By the CMP treatment, roughness of the surface can be reduced, and coverage with an insulating layer or a conductive layer formed later can be increased. The electrode 641, the electrode 642, and the electrode 629 can be formed using a material and a method that are similar to those of the above-described electrode.

The insulating layers 102 and 103 are formed over the insulating layer 627, and an electrode 418, an electrode 647, and an electrode 643 are formed over the insulating layer 103. The electrode 418 corresponds to the wiring 118_1 described in the above embodiment. The electrode 643 is electrically connected to the electrode 642 through an opening provided in the insulating layers 627, 102, and 103. The electrode 647 is electrically connected to the electrode 629 through an opening provided in the insulating layers 627, 102, and 103.

The electrodes 418, 647, and 643 can be formed using a material and a method that are similar to those of the above-described electrode. For example, the electrodes 418, 647, and 643 can be formed using a material and a method that are similar to those of the wiring 118. The electrodes 418, 647, and 643 may be formed by a damascene method, a dual damascene method, or the like. Note that FIG. 41 illustrates an example where the electrodes 418, 647, and 643 are formed using a stack of conductive layers.

The insulating layers 107, 104, 108, 114, and 115 are sequentially stacked over the electrodes 418, 647, and 643 and the insulating layer 106. The transistor 612 is formed between the insulating layers 103 and 115. As the transistor 612, the transistor 100 or 200 or the like described in the above embodiments may be used. FIG. 41 illustrates an example where the transistor 100 is used as the transistor 612. Since the transistor 100 is described in the above embodiment, detailed description thereof is omitted in this embodiment.

An insulating layer 477 is formed over the insulating layer 115, and an electrode 644 and an electrode 631 are formed over the insulating layer 477. An insulating layer 639 is formed to cover the electrode 644 and the electrode 631. An electrode 632 is formed to cover the electrode 631 with the insulating layer 639 provided therebetween. A region where the electrode 631, the insulating layer 639, and the electrode 632 overlap with each other functions as the capacitor 633.

The electrode 631 is electrically connected to the other of the source and the drain of the transistor 612. The electrode 631 is electrically connected to the electrode 643. The electrode 644 is electrically connected to the one of the source and the drain of the transistor 612. The electrode 644 is electrically connected to the electrode 647. The insulating layer 437 is formed over the electrode 632.

Modification Example 1

Figure 42:
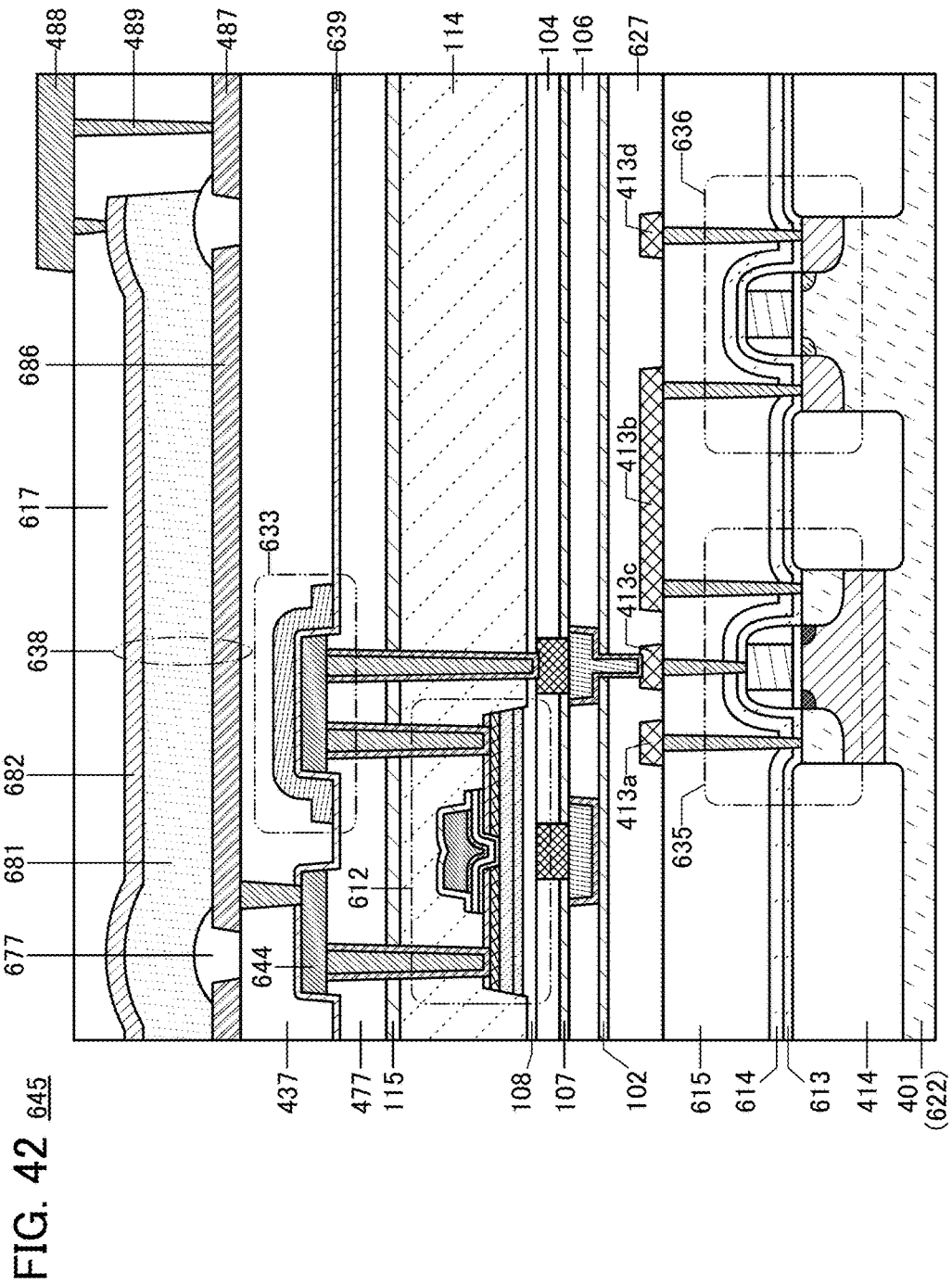
FIG. 42 illustrates a structure example of an imaging device.

FIG. 42 illustrates a structure example of the pixel 645 that is different from that in FIG. 41.

In the pixel 645 illustrated in FIG. 42, the transistor 635 and the transistor 636 are provided on the substrate 401. The transistor 635 can function as an n-channel transistor. The transistor 636 can function as a p-channel transistor. The transistor 635 and the transistor 636 are electrically isolated from each other by the element isolation layer 414. Note that the transistor 282 described above can be used as the transistor 635, for example. The transistor 281 described above can be used as the transistor 636, for example.

The electrode 413a, the electrode 413b, the electrode 413c, and an electrode 413d are formed over the insulating layer 615. The electrode 413a is electrically connected to one of the source and the drain of the transistor 635, and the electrode 413b is electrically connected to the other of the source and the drain of the transistor 635. The electrode 413c is electrically connected to the gate of the transistor 635. The electrode 413b is electrically connected to one of the source and the drain of the transistor 636, and the electrode 413d is electrically connected to the other of the source and the drain of the transistor 636. The electrodes 413a to 413d can be formed using a material and a method that are similar to those of the above-described electrode.

In the pixel 645 illustrated in FIG. 42, the photoelectric conversion element 638 is provided over the insulating layer 437. An insulating layer 617 is provided over the photoelectric conversion element 638, and an electrode 488 is provided over the insulating layer 617. The insulating layer 617 can be formed using a material and a method that are similar to those of the insulating layer 437. The insulating layer 103 is not formed.

The photoelectric conversion element 638 illustrated in FIG. 42 includes a photoelectric conversion layer 681 between an electrode 686 formed with a metal material or the like and a light-transmitting conductive layer 682. FIG. 42 illustrates the photoelectric conversion element 638 including a selenium-based material for the photoelectric conversion layer 681. The photoelectric conversion element 638 including a selenium-based material has high external quantum efficiency with respect to visible light. Moreover, the use of the photoelectric conversion element enables fabrication of a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient for visible light than amorphous selenium.

Although the photoelectric conversion layer 681 is illustrated as a single layer, gallium oxide, cerium oxide, or the like as a hole injection blocking layer may be provided on the light reception side of the selenium-based material, and nickel oxide, antimony sulfide, or the like as an electron injection blocking layer may be provided on the electrode 686 side.

Furthermore, the photoelectric conversion layer 681 may be a layer including a compound of copper, indium, and selenium (CIS). Alternatively, a layer including a compound of copper, indium, gallium, and selenium (CIGS) may be used. With CIS or CIGS, a photoelectric conversion element that can utilize an avalanche phenomenon as in the case of using a single layer of selenium can be formed.

Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by the combined use of the OS transistor having high drain withstand voltage and a photoelectric conversion element including the selenium-based material in the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films. Although the light-transmitting conductive layer 682 and a wiring 487 are electrically connected to each other through the electrode 488 and a contact plug 489 in the structure illustrated in FIG. 42, the light-transmitting conductive layer 682 and the wiring 487 may be in direct contact with each other.

The electrode 686, the wiring 487, and the like may each have a structure in which a plurality of conductive layers are stacked. For example, the electrode 686 can include a conductive layer 686a and a conductive layer 686b, and the wiring 487 can include a conductive layer 487a and a conductive layer 487b (not illustrated). For example, the conductive layer 686a and the conductive layer 487a may be made of a low-resistance metal or the like, and the conductive layer 686b and the conductive layer 487b may be made of a metal or the like that exhibits an excellent contact property with the photoelectric conversion layer 681. Such a structure improves the electrical properties of the photoelectric conversion element. Note that some kinds of metal may cause electrochemical corrosion by being in contact with the light-transmitting conductive layer 682. Even when such a metal is used in the conductive layer 487a, electrochemical corrosion can be prevented by the conductive layer 487b.

The conductive layer 686b and the conductive layer 487b can be formed using, for example, molybdenum, tungsten, or the like. The conductive layer 686a and the conductive layer 487a can be formed using, for example, aluminum, titanium, or a stack of titanium, aluminum, and titanium that are stacked in this order.

The insulating layer 617 may be a multilayer. Note that a partition wall 677 can be formed using an inorganic insulator, an insulating organic resin, or the like. The partition wall 677 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 638. In the photodiode, an n-type semiconductor layer, an i-type semiconductor layer, and a p-type semiconductor layer are sequentially stacked. The i-type semiconductor layer is preferably formed using amorphous silicon. The p-type semiconductor layer and the n-type semiconductor layer can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Note that a PN or PIN diode element is preferably provided such that the p-type semiconductor layer serves as a light-receiving surface, in which case the output current of the photoelectric conversion element 638 can be increased.

The photoelectric conversion element 638 formed using the selenium-based material, amorphous silicon, or the like can be formed through general semiconductor manufacturing processes such as a deposition process, a lithography process, and an etching process.

<Semiconductor Wafer and Chip>

Figure 43A:
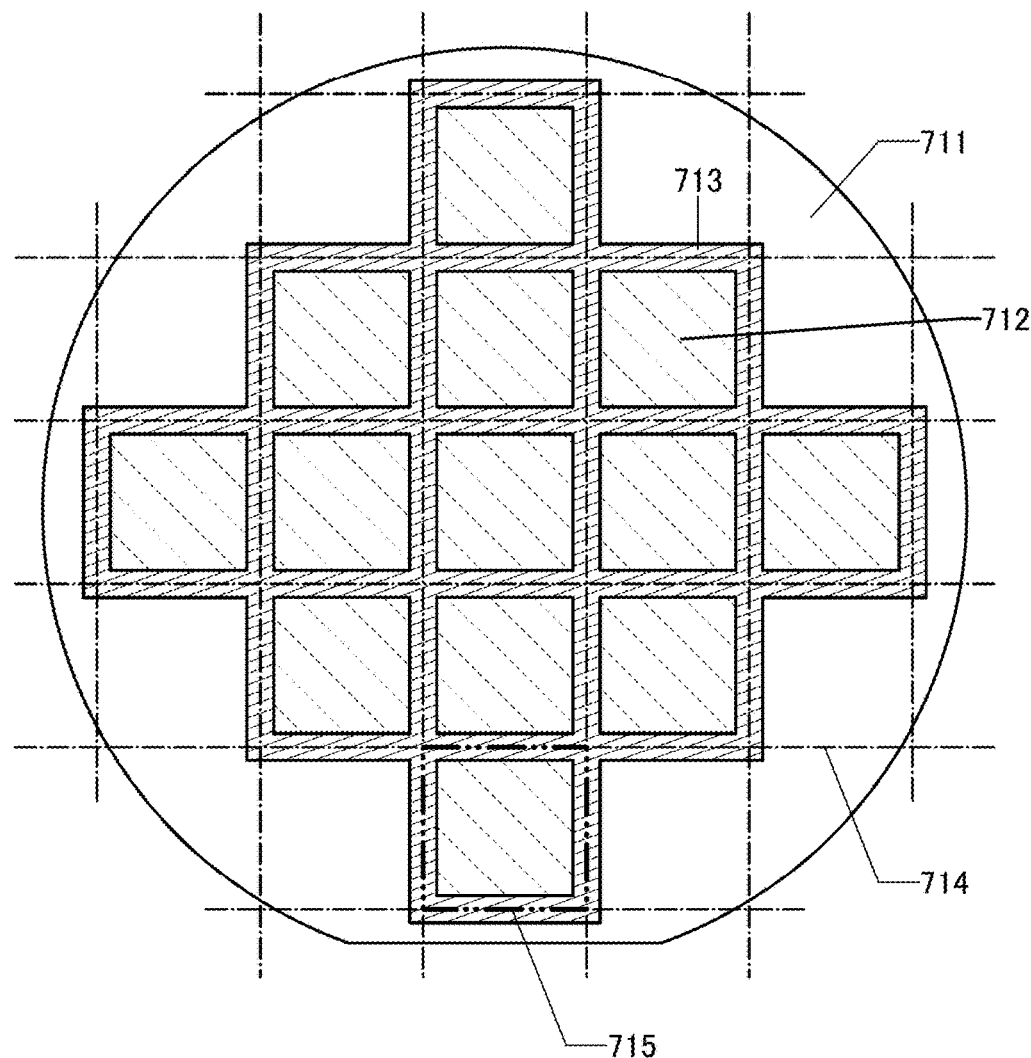
FIGS. 43A and 43B are top views of a semiconductor wafer of one embodiment of the present invention.

FIG. 43A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, an RF tag, or an imaging device, according to one embodiment of the present invention, or the like can be provided in the circuit region 712.

Figure 43B:
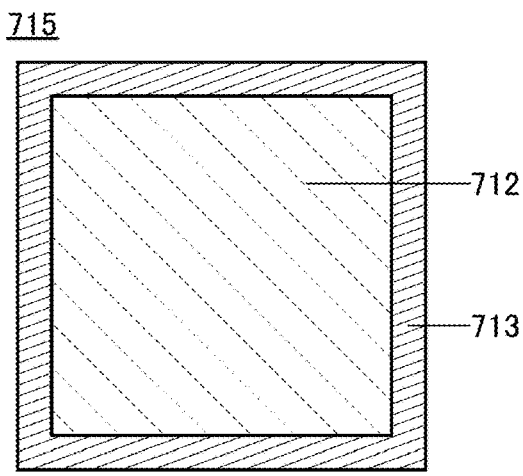

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 43B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield that is caused by the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

<Electronic Component>

Figure 44A:
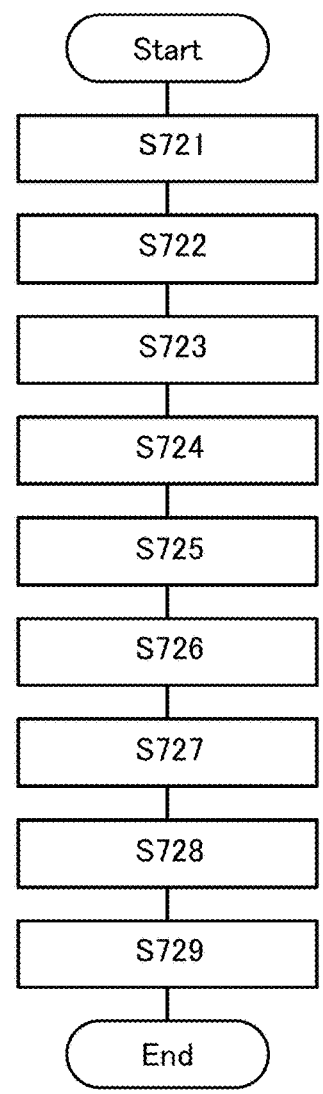
FIG. 44A is a flowchart showing a manufacturing process example of an electronic component.

In this embodiment, examples in which the chip 715 is used in an electronic component are described with reference to FIGS. 44A and 44B. Note that the electronic component is also referred to as a semiconductor package or an IC package. The electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process is described with reference to a flow chart in FIG. 44A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 44B:
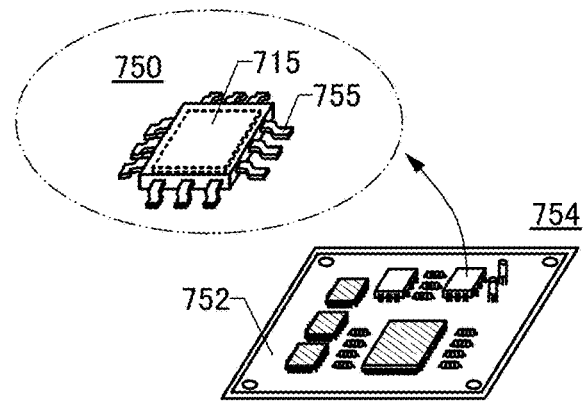
FIG. 44B is a schematic perspective view of the electronic component.

FIG. 44B is a perspective schematic diagram of a completed electronic component. FIG. 44B is a perspective schematic diagram illustrating a quad flat package (QFP) as an example of the electronic component. An electronic component 750 in FIG. 44B includes a lead 755 and the chip 715. The electronic component 750 may include more than one chip 715.

The electronic component 750 in FIG. 44B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

<Display Device>

Figure 45A:
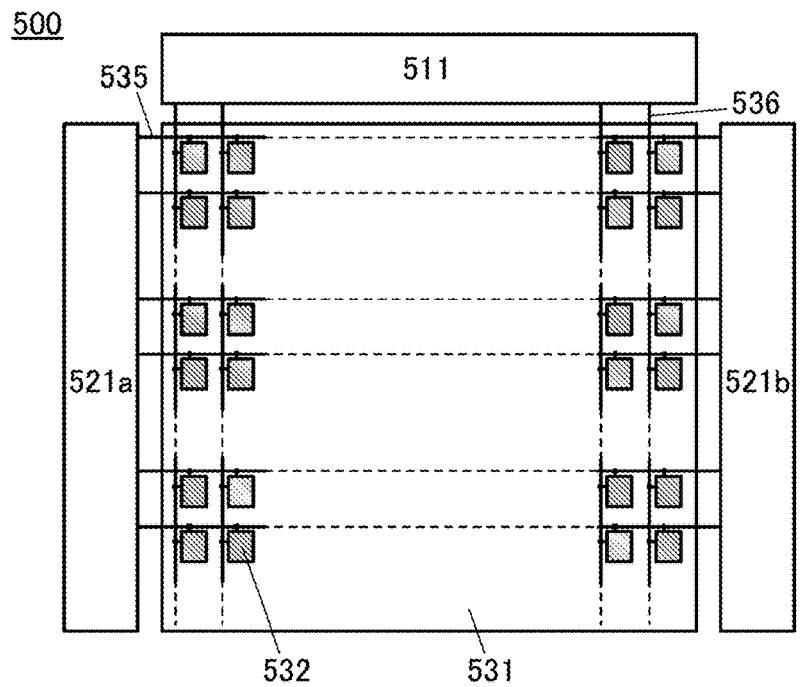
FIGS. 45A to 45C illustrate examples of a display device.

Next, an example of a display device including any of the above-described transistors and/or semiconductor devices is described. FIG. 45A is a block diagram illustrating a structure example of a display device 500.

The display device 500 in FIG. 45A includes driver circuits 511, 521a, and 521b, and a display region 531. Note that the driver circuits 511, 521a, and 521b are collectively referred to as a driver circuit or a peripheral driver circuit in some cases.

The driver circuits 521a and 521b can function as, for example, scan line driver circuits. The driver circuit 511 can function as, for example, a signal line driver circuit. Note that one of the driver circuits 521a and 521b may be omitted. Alternatively, some sort of circuit facing the driver circuit 511 with the display region 531 provided therebetween may be provided.

The display device 500 illustrated as an example in FIG. 45A includes p wirings 535 that are arranged substantially parallel to each other and whose potentials are controlled by the driver circuit 521a and/or the driver circuit 521b, and q wirings 536 that are arranged substantially parallel to each other and whose potentials are controlled by the driver circuit 511 (p and q are each an integer of 1 or more). The display region 531 includes a plurality of pixels 532 arranged in a matrix. The pixel 532 includes a pixel circuit 534 and a display element.

When every three pixels 532 function as one pixel, full-color display can be provided. The three pixels 532 control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels that control red light, green light, and blue light so that the four pixels 532 collectively serve as one pixel. The addition of the pixel 532 that controls white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a 1920×1080 matrix, the display device 500 that can display an image with "full high definition" (also referred to as "2K resolution", "2K1K", "2K", and the like) can be obtained. Using the pixels arranged in a 3840×2160 matrix, the display device 500 that can display an image with "ultra-high definition" (also referred to as "4K resolution", "4K2K", "4K", and the like) can be obtained. Using the pixels arranged in a 7680×4320 matrix, the display device 500 that can display an image with "super high definition" (also referred to as "8K resolution", "8K4K", "8K", and the like) can be obtained. Using a larger number of pixels, the display device 500 that can display an image with 16K or 32K resolution can be obtained.

A wiring 535_g on the g-th row (g is a natural number larger than or equal to 1 and smaller than or equal to p) is electrically connected to q pixels 532 on the g-th row among the plurality of pixels 532 arranged in p rows and q columns (p and q are each a natural number larger than or equal to 1) in the display region 531. A wiring 536_h on the h-th column (h is a natural number larger than or equal to 1 and smaller than or equal to q) is electrically connected to p pixels 532 on the h-th column among the plurality of pixels 532 arranged in p rows and q columns.

[Display Element]

The display device 500 can employ various modes and include various display elements. Examples of the display element include a display element including a display medium whose contrast, luminance, reflectance, transmittance, or the like is changed by electrical or magnetic effect, such as an electroluminescence (EL) element (e.g., an organic EL element, an inorganic EL element, or an EL element including organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices using EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. The display device may be a plasma display panel (PDP). The display device may be a retina scanning type projection device.

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. Providing graphene or graphite in such a manner enables easy formation of a nitride semiconductor film thereover, such as an n-type GaN semiconductor layer including crystals. Furthermore, a p-type GaN semiconductor layer including crystals, or the like, can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

FIGS. 45B and 45C and FIGS. 46A and 46B illustrate circuit structure examples that can be used for the pixel 532.

[Example of Pixel Circuit for Light-Emitting Display Device]

Figure 45B:
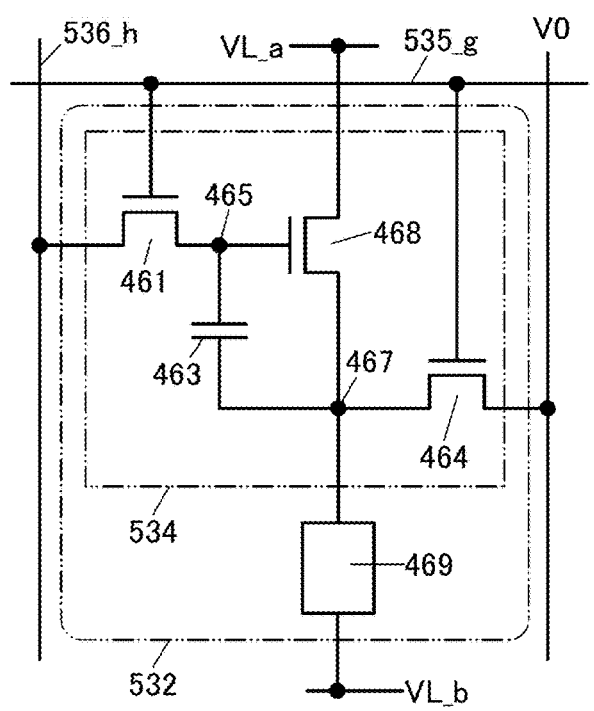

The pixel circuit 534 in FIG. 45B includes transistors 461, 468, and 464, and a capacitor 463. The pixel circuit 534 in FIG. 45B is electrically connected to a light-emitting element 469 that can function as a display element.

The transistors 461, 468, and 464 can be OS transistors. It is particularly preferable to use an OS transistor as the transistor 461.

One of a source electrode and a drain electrode of the transistor 461 is electrically connected to the wiring 536_$h$. A gate electrode of the transistor 461 is electrically connected to the wiring 535_$g$. The wiring 536_$h$ supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function of a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_$g$.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential $V_{DD}$ is supplied to one of the potential supply line VL_a and the potential supply line VL_b, and a low power supply potential $V_{SS}$ is supplied to the other, for example.

In the display device 500 including the pixel circuits 534 in FIG. 45B, the pixels 532 are sequentially selected row by row by the driver circuit 521$a$ and/or the driver circuit 521$b$, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image can be displayed.

Figure 46A:
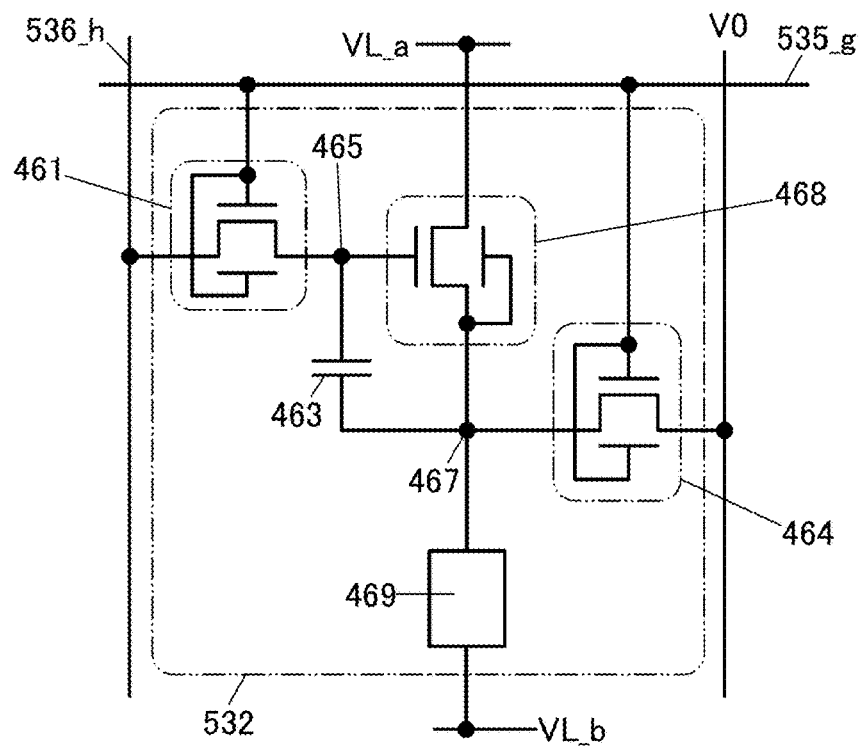
FIGS. 46A and 46B illustrate examples of a display device.

As shown in FIG. 46A, the transistors 461, 464, and 468 may be transistors with back gates. In each of the transistors 461 and 464 in FIG. 46A, the gate is electrically connected to the back gate. Thus, the gate and the back gate always have the same potential. The back gate of the transistor 468 is electrically connected to the node 467. Therefore, the back gate always has the same potential as the node 467.

As at least one of the transistors 461, 468, and 464, the transistor 100 or 200 described above can be used.

[Example of Pixel Circuit for Liquid Crystal Display Device]

Figure 45C:
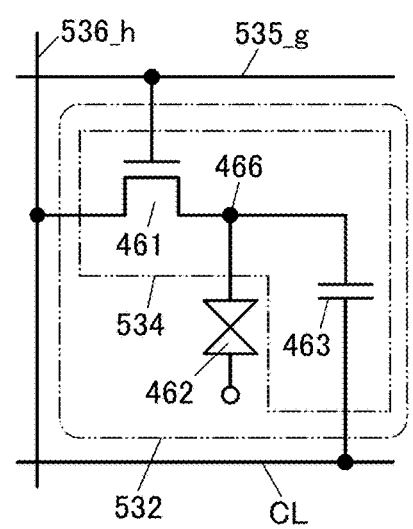

The pixel circuit 534 in FIG. 45C includes the transistor 461 and the capacitor 463. The pixel circuit 534 in FIG. 45C is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL. Furthermore, the potential applied to the one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like, depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. Note that the specific resistivity in this specification is measured at 20° C.

In the pixel circuit 534 on the g-th row and the h-th column, one of the source electrode and the drain electrode of the transistor 461 is electrically connected to the wiring 536_h, and the other of the source electrode and the drain electrode of the transistor 461 is electrically connected to the node 466. The gate electrode of the transistor 461 is electrically connected to the wiring 535_g. The wiring 536_h supplies a video signal. The transistor 461 has a function of controlling writing of a video signal to the node 466.

One of a pair of electrodes of the capacitor 463 is electrically connected to a wiring to which a particular potential is supplied (hereinafter referred to as a capacitor line CL), and the other is electrically connected to the node 466. The potential of the capacitor line CL is set in accordance with the specifications of the pixel circuit 534 as appropriate. The capacitor 463 has a function of a storage capacitor for storing data written to the node 466.

For example, in the display device 500 including the pixel circuit 534 in FIG. 45C, the pixel circuits 534 are sequentially selected row by row by the driver circuit 521a and/or the driver circuit 521b, so that the transistors 461 are turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 46B:
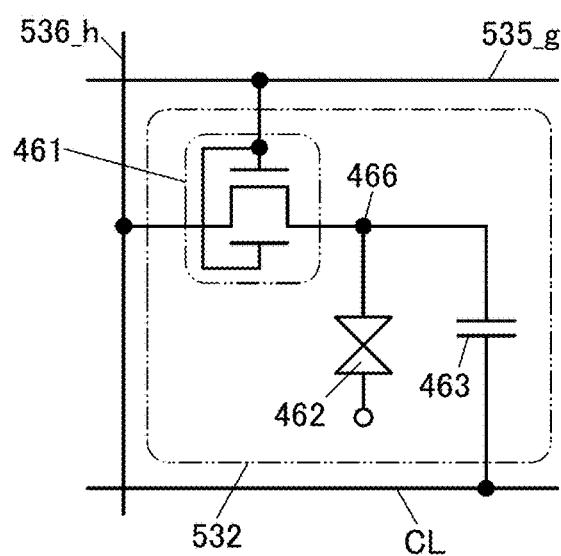

As shown in FIG. 46B, the transistor 461 may be a transistor with a back gate. In the transistor 461 in FIG. 46B, the gate is electrically connected to the back gate. Thus, the gate and the back gate always have the same potential.

[Structure Example of Peripheral Circuit]

Figure 47A:
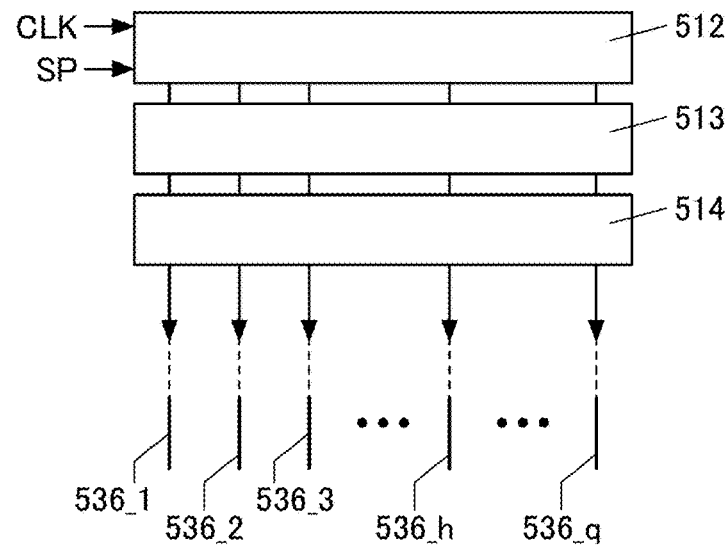
FIGS. 47A and 47B each illustrate a configuration example of a driver circuit.
Figure 47B:
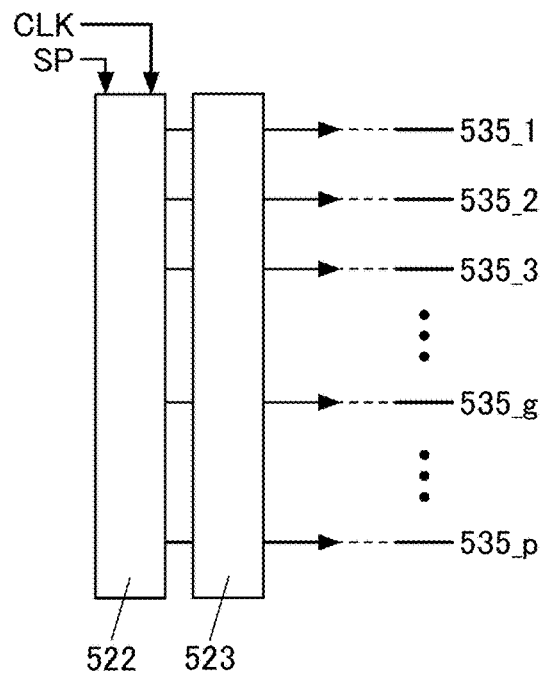

FIG. 47A shows a structure example of the driver circuit 511. The driver circuit 511 includes a shift register 512, a latch circuit 513, and a buffer 514. FIG. 47B shows a structure example of the driver circuit 521a. The driver circuit 521a includes a shift register 522 and a buffer 523. The structure of the driver circuit 521b can be similar to that of the driver circuit 521a.

A start pulse SP, a clock signal CLK, and the like are input to the shift registers 512 and 522.

[Structure Example of Display Device]

With use of any of the transistors described in the above embodiments, some or all of driver circuits that include shift registers can be formed over a substrate where a pixel portion is formed, whereby a system-on-panel can be obtained.

Figure 48A:
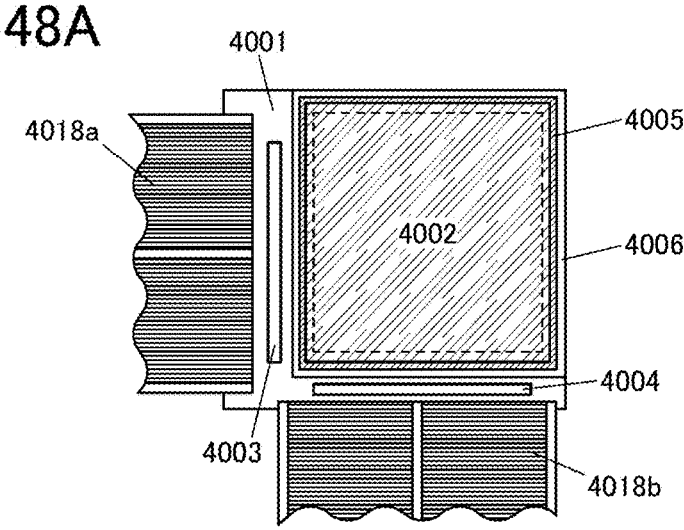
FIGS. 48A to 48C illustrate examples of a display device.

A structure example of a display device including a liquid crystal element and a structure example of a display device including an EL element are described in this embodiment. In FIG. 48A, a sealant 4005 is provided so as to surround a pixel portion 4002 provided over a first substrate 4001, and the pixel portion 4002 is sealed with a second substrate 4006. In FIG. 48A, a signal line driver circuit 4003 and a scan line driver circuit 4004 each are formed using a single-crystal semiconductor or a polycrystalline semiconductor over a substrate prepared separately, and mounted in a region different from the region surrounded by the sealant 4005 over the first substrate 4001. Furthermore, various signals and potentials are supplied to the signal line driver circuit 4003, the scan line driver circuit 4004, and the pixel portion 4002 from flexible printed circuits (FPCs) 4018a and 4018b.

Figure 48B:
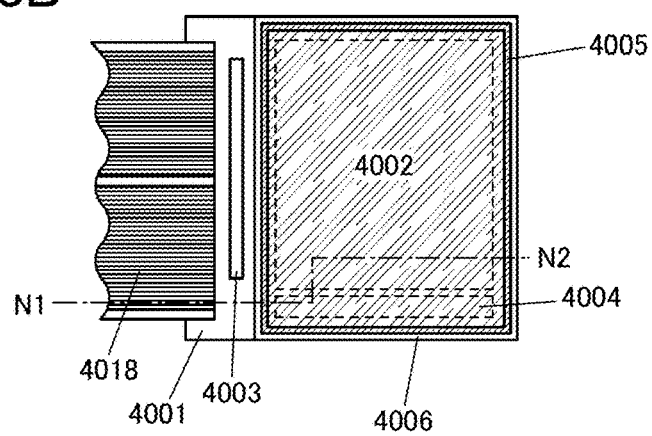
Figure 48C:
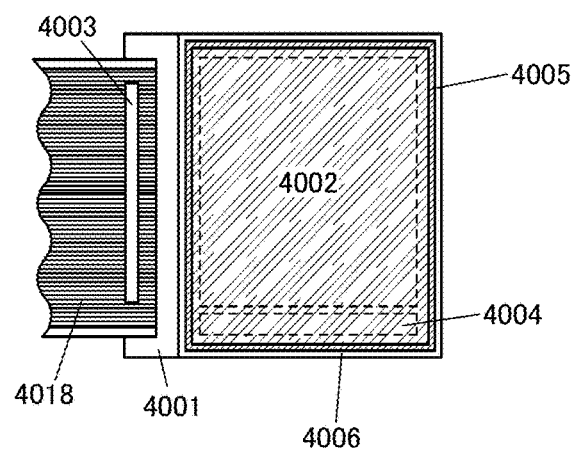

In FIGS. 48B and 48C, the sealant 4005 is provided so as to surround the pixel portion 4002 and the scan line driver circuit 4004 that are provided over the first substrate 4001. Furthermore, the second substrate 4006 is provided over the pixel portion 4002 and the scan line driver circuit 4004. Thus, the pixel portion 4002 and the scan line driver circuit 4004 are sealed together with display elements with the use of the first substrate 4001, the sealant 4005, and the second substrate 4006. In FIGS. 48B and 48C, the signal line driver circuit 4003 formed using a single crystal semiconductor or a polycrystalline semiconductor over a substrate separately prepared is mounted in a region different from the region surrounded by the sealant 4005 over the first substrate 4001. In FIGS. 48B and 48C, various signals and potentials are supplied to the signal line driver circuit 4003, the scan line driver circuit 4004, and the pixel portion 4002 from an FPC 4018.

Although FIGS. 48B and 48C each illustrate an example in which the signal line driver circuit 4003 is formed separately and mounted on the first substrate 4001, this structure is not necessarily employed. The scan line driver circuit may be separately formed and then mounted, or only part of the signal line driver circuit or part of the scan line driver circuit may be separately formed and then mounted.

Note that a connection method of a separately formed driver circuit is not particularly limited, and wire bonding, a chip on glass (COG), a tape carrier package (TCP), a chip on film (COF), or the like can be used. FIG. 48A illustrates an example in which the signal line driver circuit 4003 and the scan line driver circuit 4004 are mounted by COG. FIG. 48B illustrates an example in which the signal line driver circuit 4003 is mounted by COG. FIG. 48C illustrates an example in which the signal line driver circuit 4003 is mounted by TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors that are described in the above embodiments can be used.

FIGS. 49A and 49B correspond to cross-sectional views taken along chain line N1-N2 in FIG. 48B. As shown in FIGS. 49A and 49B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4110 to 4112.

The electrode 4015 is formed using the same conductive layer as a first electrode layer 4030, and the wiring 4014 is formed using the same conductive layer as source and drain electrodes of transistors 4010 and 4011.

Each of the pixel portion 4002 and the scan line driver circuit 4004 provided over the first substrate 4001 includes a plurality of transistors. In FIGS. 49A and 49B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 49A, and a bank 4510 is further provided over the insulating layer 4112 in FIG. 49B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

Any of the transistors described in the above embodiments can be used as the transistors 4010 and 4011. As the transistors 4010 and 4011, OS transistors are preferably used. A change in the electrical characteristics of OS transistors is suppressed and thus the OS transistors are electrically stable. Accordingly, the display devices of this embodiment illustrated in FIGS. 49A and 49B can be highly reliable display devices.

In the OS transistor, the current in an off state (the off-state current) can be small. Accordingly, an electrical signal such as an image signal can be held for a longer period, and a writing interval can be set longer in an on state. Accordingly, the frequency of refresh operation can be reduced, which leads to an effect of suppressing power consumption.

In the OS transistor, relatively high field-effect mobility can be obtained, whereby high-speed operation is possible. Consequently, when the above transistor is used in a driver circuit portion or a pixel portion of a display device, high-quality images can be obtained. Since the driver circuit portion and the pixel portion can be formed over one substrate with use of the above transistor, the number of components of the display device can be reduced.

The display devices illustrated in FIGS. 49A and 49B each include a capacitor 4020. The capacitor 4020 includes an electrode formed through the same steps as the gate electrode of the transistor 4010 and an electrode formed through the same steps as the back gate electrode of the transistor 4010. The electrodes overlap with each other with the insulating layer 4103 provided therebetween.

In general, the capacitance of a capacitor provided in a pixel portion of a display device is set in consideration of leakage current or the like of transistors provided in a pixel portion so that charges can be held for a predetermined period. The capacitance of the capacitor can be set considering off-state current of the transistor, or the like.

For example, when an OS transistor is used in a pixel portion of a liquid crystal display device, the capacitance of the capacitor can be one-third or less, or one-fifth or less, of the capacitance of liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 49A. In FIG. 49A, a liquid crystal element 4013 that is the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is provided therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selectively etching an insulating layer and is provided in order to control the distance (cell gap) between the first electrode layer 4030 and the second electrode layer 4031. Alternatively, a spherical spacer may be used.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron-transport property and an excellent hole-transport property), and the like.

The EL layer can be formed by an evaporation method (including a vacuum evaporation method), a transfer method, a printing method, an inkjet method, a coating method, or the like.

Inorganic EL elements are classified into a dispersion-type inorganic EL element and a thin-film inorganic EL element according to their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, it is acceptable as long as at least one of a pair of electrodes is transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 49B illustrates an example of a light-emitting display device (also referred to as an "EL display device") using a light-emitting element as a display element. A light-emitting element 4513 as the display element is electrically connected to the transistor 4010 provided in the pixel portion 4002. The structure of the light-emitting element 4513 is the layered structure including the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space that is enclosed by the first substrate 4001, the second substrate 4006, and the sealant 4005, a filler 4514 is provided for sealing. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic-based resin, a polyimide, an epoxy-based resin, a silicone-based resin, polyvinyl butyral (PVB), ethylene vinyl acetate (EVA), or the like can be used. A drying agent may be contained in the filler 4514.

A glass material such as a glass frit, or a resin that is curable at room temperature, such as a two-component-mixture-type resin, a light curable resin, and a thermosetting resin can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; or a nitride thereof.

A conductive composition containing a conductive high molecular compound (also called conductive polymer) can be used for the first electrode layer 4030 and the second electrode layer 4031. As the conductive high molecular compound, a so-called π-electron conjugated conductive high molecular compound can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protection circuit for protecting the driver circuit is preferably provided. The protection circuit is preferably formed using a nonlinear element.

With use of the shift registers described in the above embodiment, a highly reliable display device can be provided. With use of any of the transistors described in the above embodiments, a highly reliable display device can be provided. With use of any of the transistors described in the above embodiments, a display device that has a high resolution, a large size, and high display quality can be provided. Furthermore, a display device with low power consumption can be provided.

<Display Module>

Figure 50:
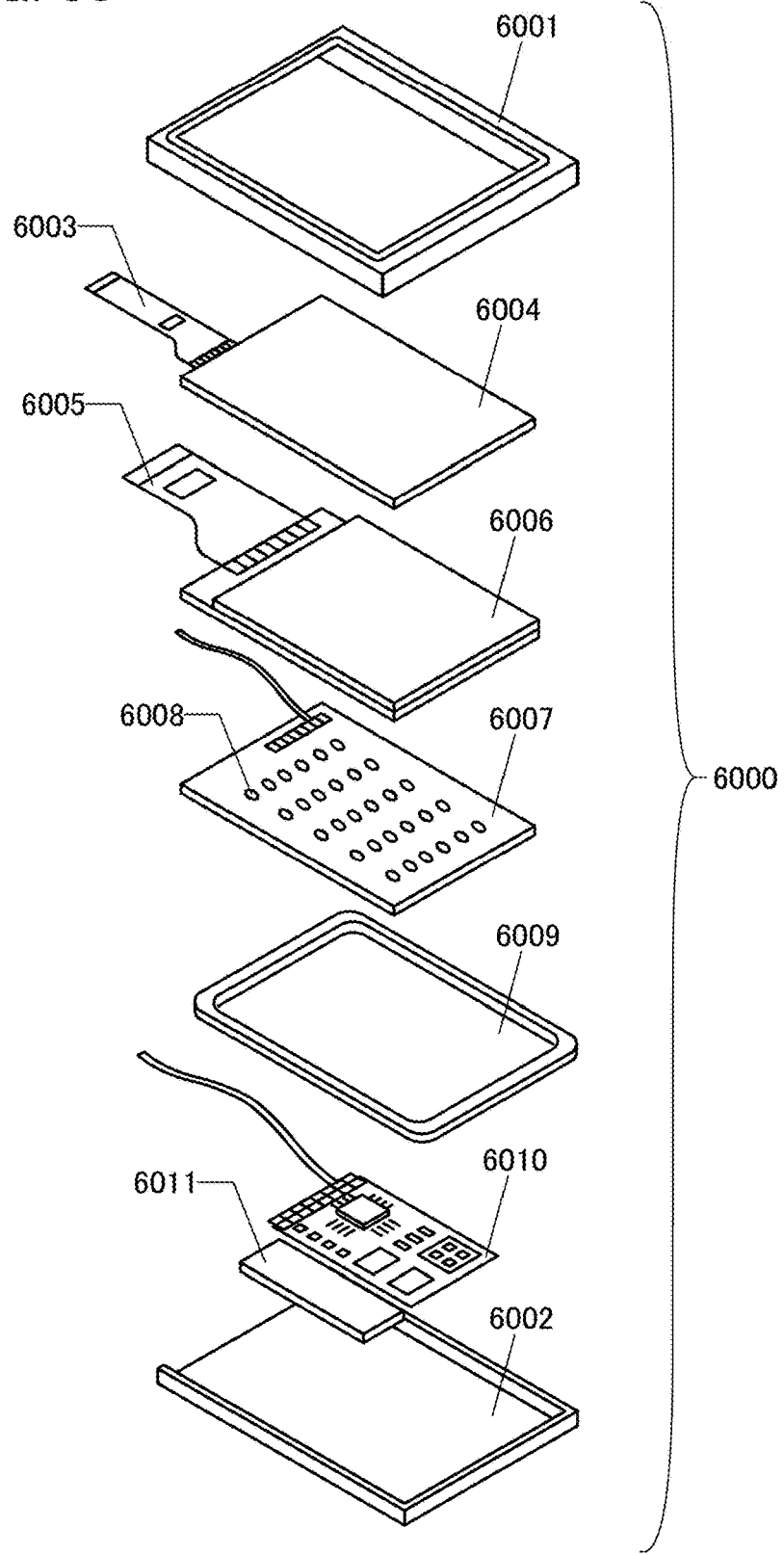
FIG. 50 illustrates an example of a display module.

A display module is described as an example of a semiconductor device using any of the above-described transistors. In a display module 6000 in FIG. 50, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 is provided with a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in an appropriate combination with any of the structures described in the other embodiments and the like.

Embodiment 3

Figure 51:
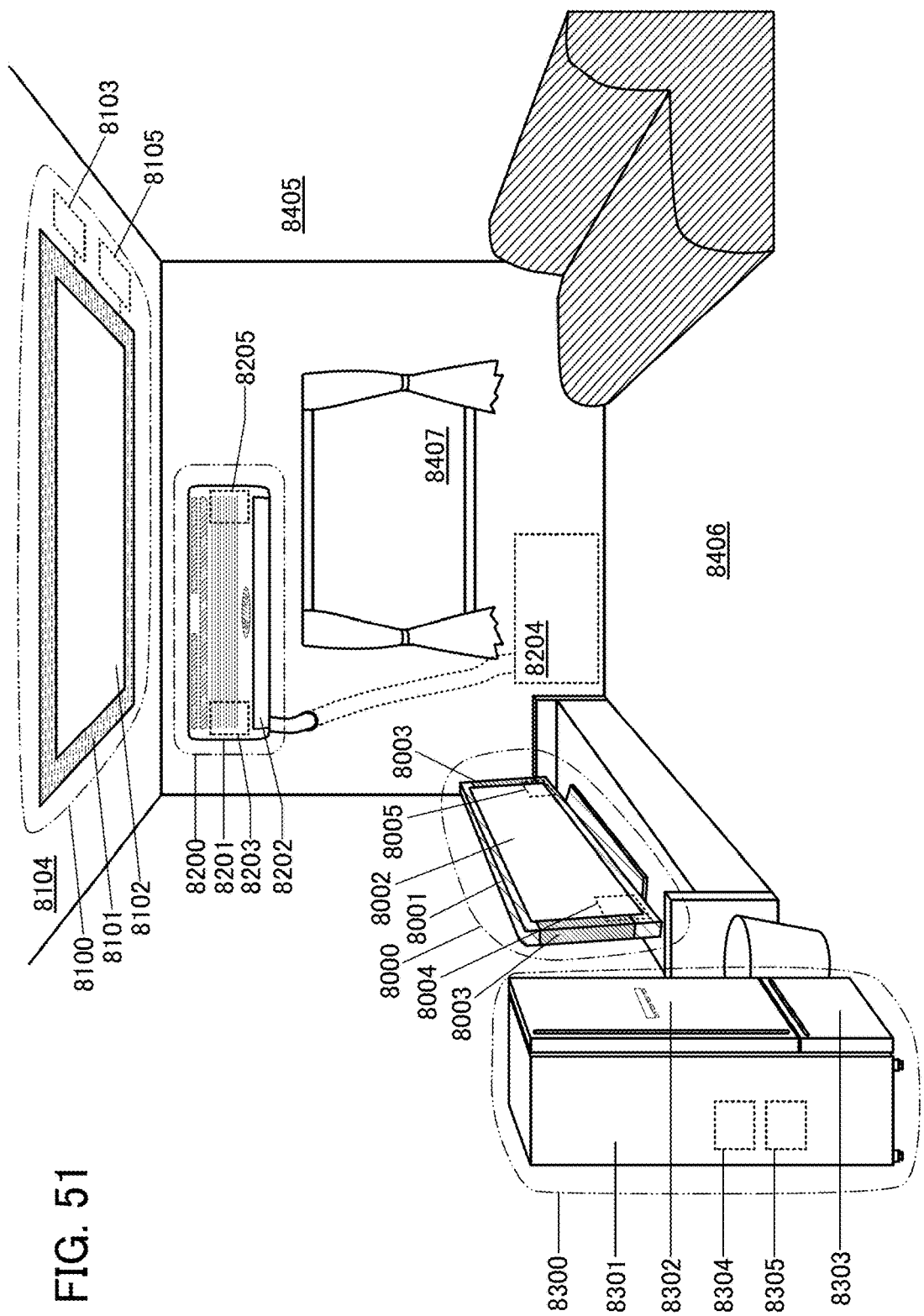
FIG. 51 illustrates electronic devices.

A semiconductor device of one embodiment of the present invention can be used for a variety of electronic devices. FIG. 51 illustrates specific examples of electronic devices including the semiconductor device of one embodiment of the present invention.

Examples of electronic devices each utilizing the semiconductor device of one embodiment of the present invention are as follows: display devices of televisions, monitors, and the like, lighting devices, desktop personal computers and laptop personal computers, word processors, image reproduction devices that reproduce still images and moving images stored in recording media such as digital versatile discs (DVDs), portable CD players, portable radios, tape recorders, headphone stereos, stereos, table clocks, wall clocks, cordless phone handsets, transceivers, mobile phones, car phones, portable game machines, tablet terminals, large-sized game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as a chain saw, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given.

In addition, moving objects driven by electric motors using electric power from the power storage devices are also included in the category of electronic devices. Examples of the moving objects are electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

FIG. 51 illustrates examples of electronic devices. In FIG. 51, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, and a power storage device 8005. The semiconductor device 8004 of one embodiment of the present invention is provided in the housing 8001. The semiconductor device 8004 can hold control data, a control program, or the like. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a digital micromirror device (DMD), a plasma display panel (PDP), or a field emission display (FED) can be used for the display portion 8002.

Note that the display device includes, in its category, all of information display devices for personal computers, advertisement displays, and the like besides TV broadcast reception.

In FIG. 51, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 51 illustrates the case where the semiconductor device 8103 is provided in a ceiling 8104 on which the housing 8101 and the light source 8102 are installed, the semiconductor device 8103 may be provided in the housing 8101. The semiconductor device 8103 can hold data such as emission luminance of the light source 8102, a control program, or the like. The lighting device 8100 can receive electric power from a commercial power supply. Alternatively, the lighting device 8100 can use electric power stored in the power storage device.

Note that although the installation lighting device 8100 provided in the ceiling 8104 is illustrated in FIG. 51 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using electric power can be used. Specifically, an incandescent lamp, a discharge lamp such as a fluorescent lamp, and light-emitting elements such as an LED and an organic EL element are given as examples of the artificial light source.

In FIG. 51, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, and a power storage device 8205. Although FIG. 51 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can hold control data of the air conditioner, a control program, or the like. The air conditioner can receive electric power from a commercial power supply. Alternatively, the air conditioner can use electric power stored in the power storage device 8205.

Note that although the split-type air conditioner including the indoor unit and the outdoor unit is illustrated in FIG. 51 as an example, the semiconductor device of one embodiment of the present invention can be used in an air conditioner in which the functions of an indoor unit and an outdoor unit are integrated in one housing.

In FIG. 51, an electric refrigerator-freezer 8300 is an example of an electronic device including a semiconductor device 8304 of one embodiment of the present invention. Specifically, the electric refrigerator-freezer 8300 includes a housing 8301, a door for a refrigerator 8302, a door for a freezer 8303, the semiconductor device 8304, a power storage device 8305, and the like. In FIG. 51, the power storage device 8305 is provided in the housing 8301. The semiconductor device 8304 can hold control data, a control program, or the like of the electric refrigerator-freezer 8300. The electric refrigerator-freezer 8300 can receive electric power from a commercial power supply. Alternatively, the electric refrigerator-freezer 8300 can use electric power stored in the power storage device 8305.

Figure 52A:
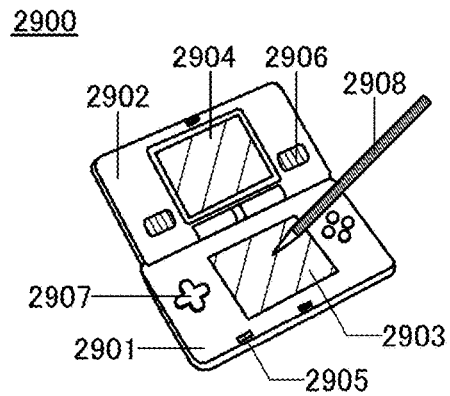
FIGS. 52A to 52G each illustrate an electronic device.

A portable game machine 2900 illustrated in FIG. 52A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 52A has the two display portions 2903 and 2904, the number of display portions is not limited to this. The display portion 2903 is provided with a touch screen as an input device, which can be handled with a stylus 2908 or the like.

Figure 52B:
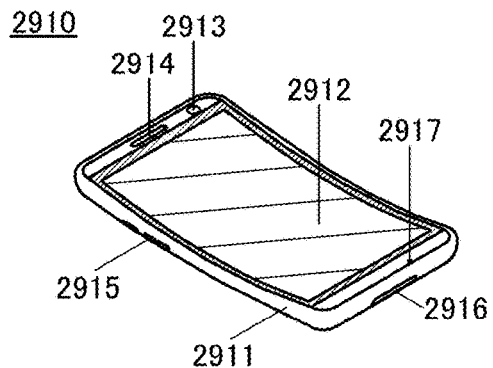

An information terminal 2910 illustrated in FIG. 52B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912.

In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 52C:
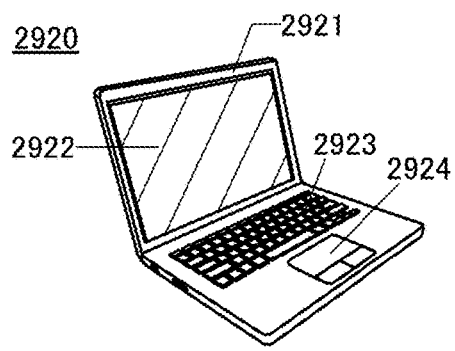

A notebook personal computer 2920 illustrated in FIG. 52C includes a housing 2921, a display portion 2922, a keyboard 2923, a pointing device 2924, and the like. In the housing 2921 of the notebook personal computer 2920, an antenna, a battery, and the like are provided.

Figure 52D:
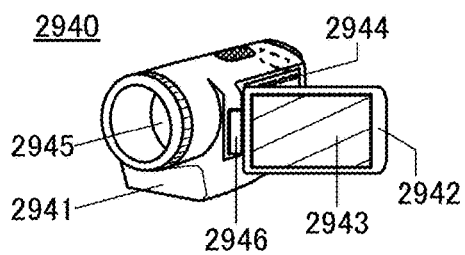

A video camera 2940 illustrated in FIG. 52D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 52E:
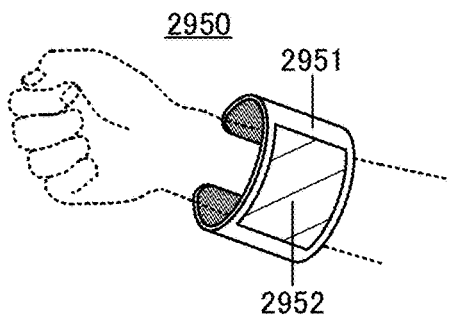

FIG. 52E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 52F:
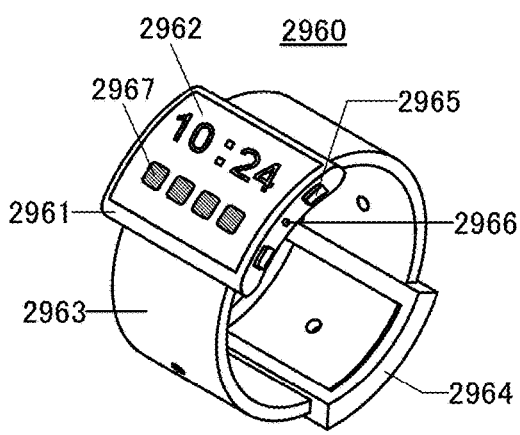

FIG. 52F illustrates an example of a watch-type information terminal. An information terminal 2960 includes a housing 2961, a display portion 2962, a band 2963, a buckle 2964, an operation switch 2965, an input output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input output terminal 2966, and data can be directly transmitted to and received from another information terminal via a connector. In addition, charging via the input output terminal 2966 is possible. Note that the charging operation may be performed by wireless power feeding without using the input output terminal 2966.

Figure 52G:
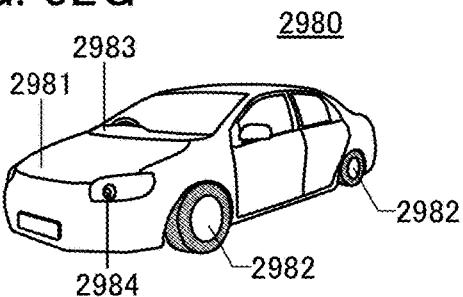

FIG. 52G is an external view illustrating an example of a car. A car 2980 includes a car body 2981, wheels 2982, a dashboard 2983, lights 2984, and the like. The car 2980 also includes an antenna, a battery, and the like.

A memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments and the like.

Embodiment 4

In this embodiment, the structure of an oxide semiconductor is described. Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is an oxide semiconductor having a plurality of c-axis aligned crystal parts (also referred to as pellets).

Figure 55A:
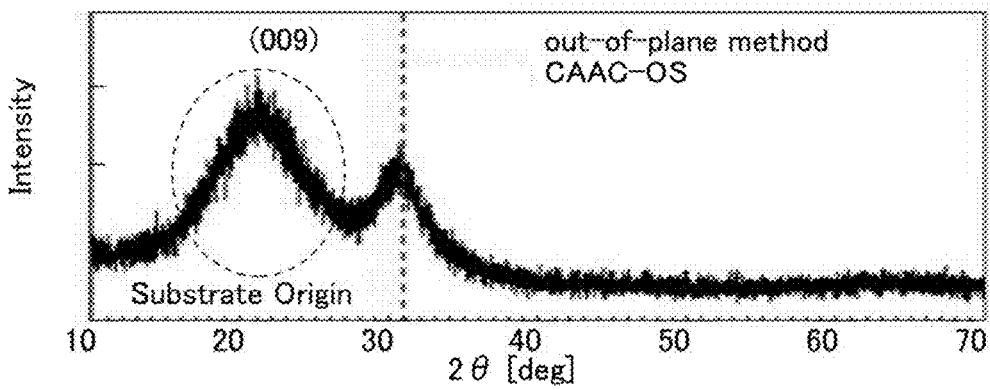
FIGS. 55A to 55E show XRD structural analysis results of a CAAC-OS and a single crystal oxide semiconductor and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified as the space group R-3m is analyzed by an out-of-plane method, a peak appears at a diffraction angle (2θ) of around 31° as shown in FIG. 55A. This peak is derived from the (009) plane of the InGaZnO$_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 55B:
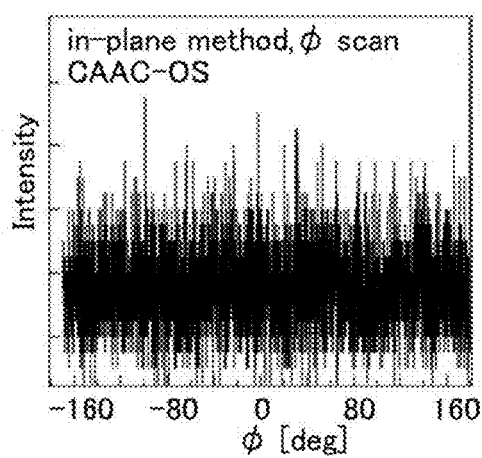
Figure 55C:
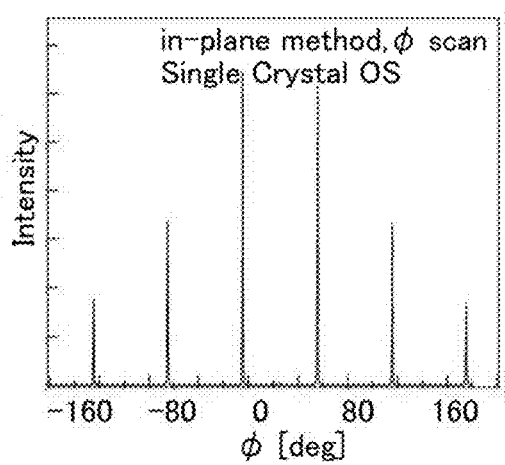

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed as shown in FIG. 55B. In contrast, in the case where single crystal InGaZnO$_4$ is subjected to φ scan with 2θ fixed at around 56°, six peaks that are derived from crystal planes equivalent to the (110) plane are observed as shown in FIG. 55C. Accordingly, the structural analysis using XRD shows that the directions of a-axes and b-axes are irregularly oriented in the CAAC-OS.

Figure 55D:
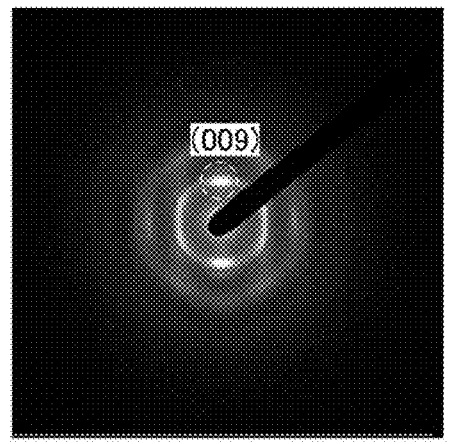
Figure 55E:
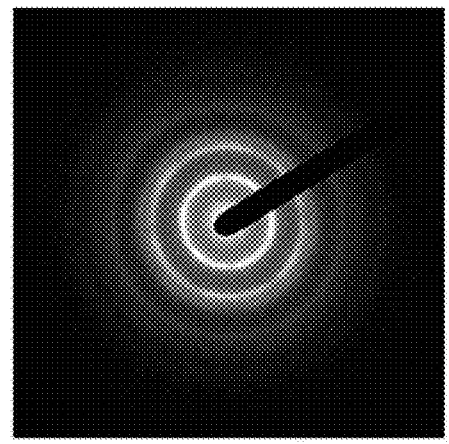

Next, a CAAC-OS analyzed by electron diffraction is described. For example, when an electron beam with a probe diameter of 300 nm is incident on a CAAC-OS including an InGaZnO$_4$ crystal in the direction parallel to the formation surface of the CAAC-OS, such a diffraction pattern (also referred to as a selected-area transmission electron diffraction pattern) as is shown in FIG. 55D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 55E shows a diffraction pattern obtained in such a manner that an electron beam with a probe diameter of 300 nm is incident on the same sample in the direction perpendicular to the sample surface. As shown in FIG. 55E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 55E is considered to be derived from the (010) plane, the (100) plane, and the like of the InGaZnO$_4$ crystal. The second ring in FIG. 55E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 56A:
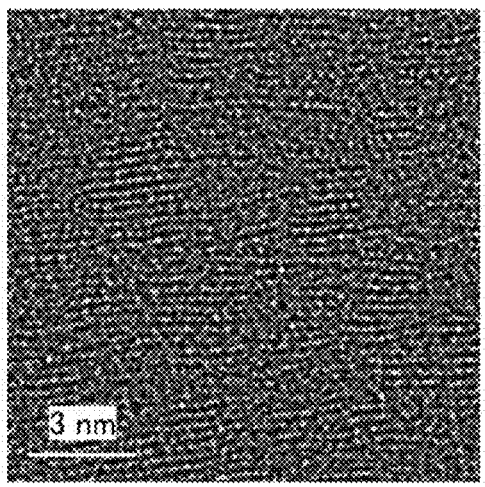
FIGS. 56A to 56E show a cross-sectional TEM image and plan-view TEM images of a CAAC-OS and images obtained through analysis thereof.

FIG. 56A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 56A shows pellets in which metal atoms are arranged in a layered manner. FIG. 56A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 56B:
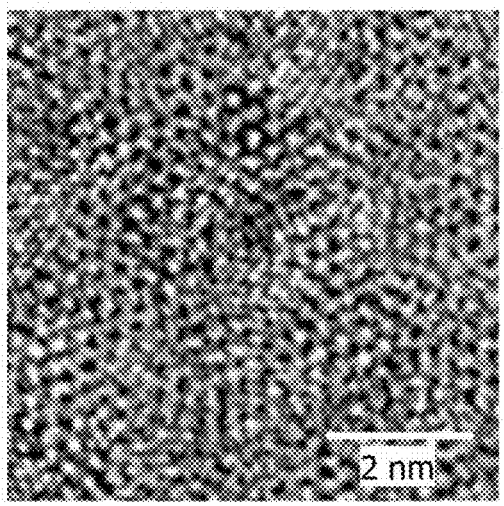
Figure 56C:
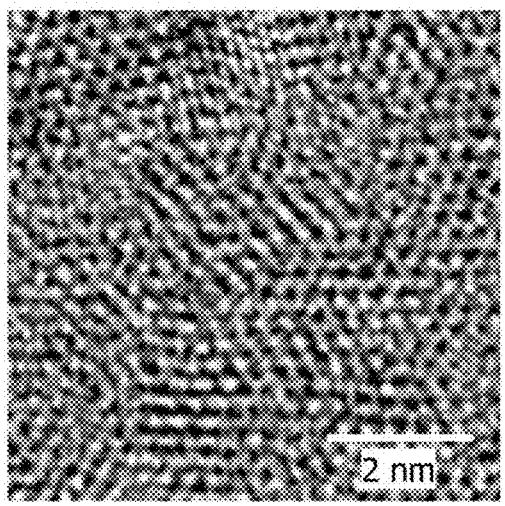
Figure 56D:
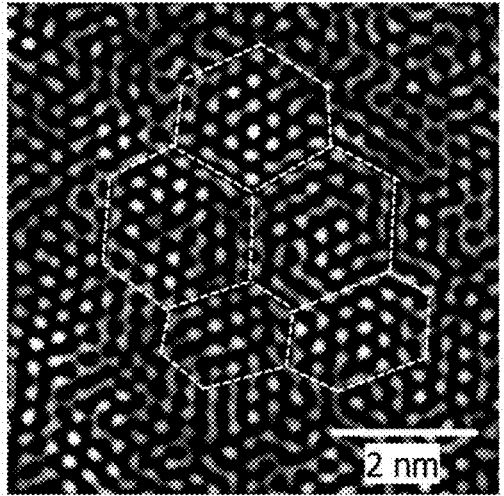
Figure 56E:
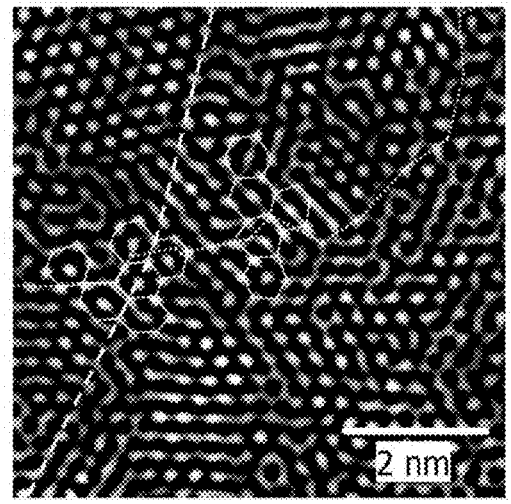

FIGS. 56B and 56C show Cs-corrected high-resolution TEM images of a plane of the CAAC-OS observed from the direction substantially perpendicular to the sample surface. FIGS. 56D and 56E are images obtained through image processing of FIGS. 56B and 56C. The method of image processing is as follows. The image in FIG. 56B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 56D, a portion where a lattice arrangement is broken is shown by dashed lines. A region surrounded by a dashed line is one pellet. The portion denoted by the dashed line is a junction of pellets. The dashed line draws a hexagon, which means that the pellet has a hexagonal shape. Note that the shape of the pellet is not always a regular hexagon but is a non-regular hexagon in many cases.

In FIG. 56E, a dotted line denotes a portion where the direction of a lattice arrangement changes between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 57A:
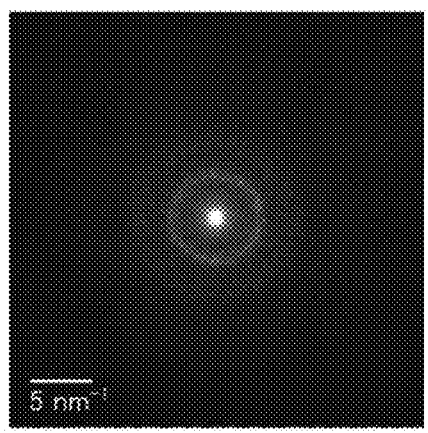
FIGS. 57A to 57D show electron diffraction patterns and a cross-sectional TEM image of an nc-OS.
Figure 57B:
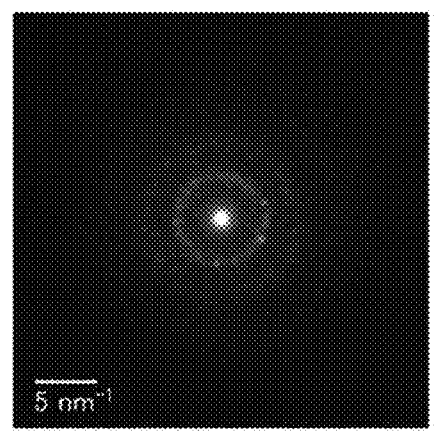

For example, when an electron beam with a probe diameter of 50 nm is incident on a 34-nm-thick region of thinned nc-OS including an $InGaZnO_4$ crystal in the direction parallel to the formation surface, a ring-shaped diffraction pattern (a nanobeam electron diffraction pattern) shown in FIG. 57A is observed. FIG. 57B shows a diffraction pattern (a nanobeam electron diffraction pattern) obtained when an electron beam with a probe diameter of 1 nm is incident on the same sample. As shown in FIG. 57B, a plurality of spots are observed in a ring-like region. In other words, ordering in an nc-OS is not observed with an electron beam with a probe diameter of 50 nm but is observed with an electron beam with a probe diameter of 1 nm.

Figure 57C:
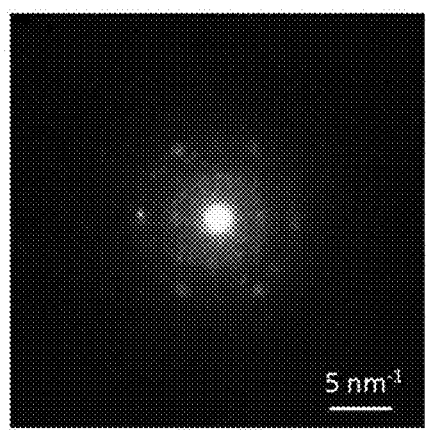

Furthermore, an electron diffraction pattern in which spots are arranged in an approximately regular hexagonal shape is observed in some cases as shown in FIG. 57C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 57D:
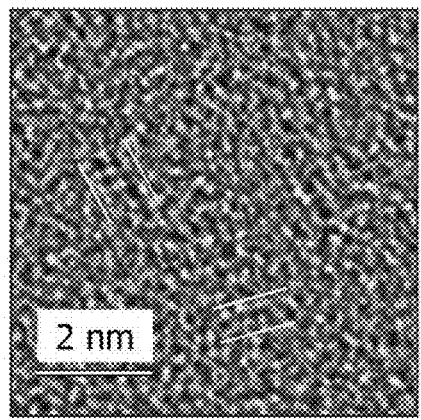

FIG. 57D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 57D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

FIGS. 58A and 58B are high-resolution cross-sectional TEM images of an a-like OS. FIG. 58A is the high-resolution cross-sectional TEM image of the a-like OS at the start of the electron irradiation. FIG. 58B is the high-resolution cross-sectional TEM image of the a-like OS after the electron ($e^-$) irradiation at $4.3 \times 10^8$ $e^-/nm^2$. FIGS. 58A and 58B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 59:
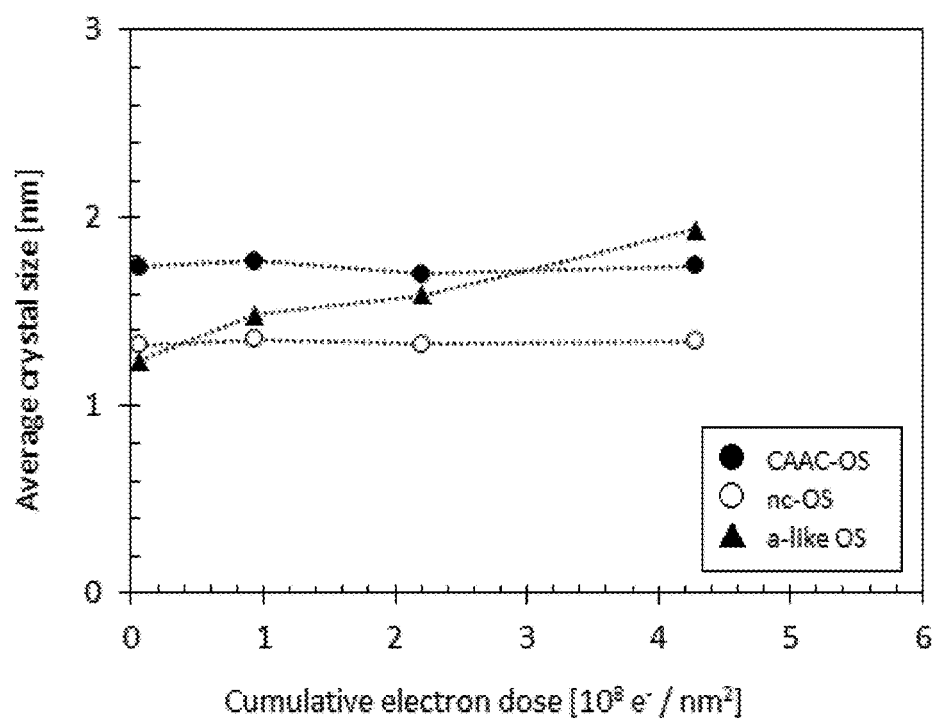
FIG. 59 is a graph showing changes in crystal parts of an In—Ga—Zn oxide induced by electron irradiation.

FIG. 59 shows a change in the average size of crystal parts (at 22 points to 30 points) in each sample. Note that the crystal part size corresponds to the length of a lattice fringe. FIG. 59 indicates that the crystal part size in the a-like OS increases with an increase in the cumulative electron dose in obtaining TEM images, for example. As shown in FIG. 59, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 59, the crystal part sizes in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7 \times 10^5$ $e^-/(nm^2 \cdot s)$; and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<Carrier Density of Oxide Semiconductor>

Next, the carrier density of an oxide semiconductor layer is described below.

Examples of a factor that affects the carrier density of an oxide semiconductor include oxygen vacancies (Vo) and impurities in the oxide semiconductor.

As the amount of oxygen vacancies in the oxide semiconductor increases, the density of defect states increases when hydrogen is bonded to the oxygen vacancies (this state is also referred to as VoH). The density of defect states also increases with an increase in the amount of impurities in the oxide semiconductor. Hence, the carrier density of the oxide semiconductor can be adjusted by controlling the density of defect states in the oxide semiconductor.

An OS transistor is described. The carrier density of the oxide semiconductor is preferably reduced in order to suppress the negative shift of the threshold voltage of the transistor or reduce the off-state current of the OS transistor. In order to reduce the carrier density of the oxide semiconductor, the impurity concentration in the oxide semiconductor is reduced so that the density of defect states can be reduced. In this specification and the like, the state in which the impurity concentration is low and the density of defect states is low is referred to as "highly purified intrinsic" or "substantially highly purified intrinsic". The carrier density of a highly purified intrinsic oxide semiconductor is lower than $8\times10^{15}$ cm$^{-3}$, preferably lower than $1\times10^{11}$ cm$^{-3}$, further preferably lower than $1\times10^{10}$ cm$^{-3}$ and is higher than or equal to $1\times10^{-9}$ cm$^{-3}$.

In contrast, the carrier density of the oxide semiconductor is preferably increased in order to increase the on-state current of the transistor or improve the field-effect mobility of the transistor. In order to increase the carrier density of the oxide semiconductor, it is preferred that the impurity concentration or the density of defect states in the oxide semiconductor be slightly increased, or the bandgap of the oxide semiconductor be narrowed. For example, an oxide semiconductor that has a slightly high impurity concentration or a slightly high density of defect states in the range where a favorable on/off ratio is obtained in the $I_d$-$V_g$ characteristics of a transistor can be regarded as substantially intrinsic. Furthermore, an oxide semiconductor that has a high electron affinity and a narrow bandgap and thus has an increased density of thermally excited electrons (carriers) can be regarded as substantially intrinsic. Note that a transistor using an oxide semiconductor with higher electron affinity has a lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still further preferably higher than or equal to $1\times10^{11}$ cm$^{-3}$ and lower than or equal to $1\times10^{15}$ cm$^{-3}$.

Figure 60:
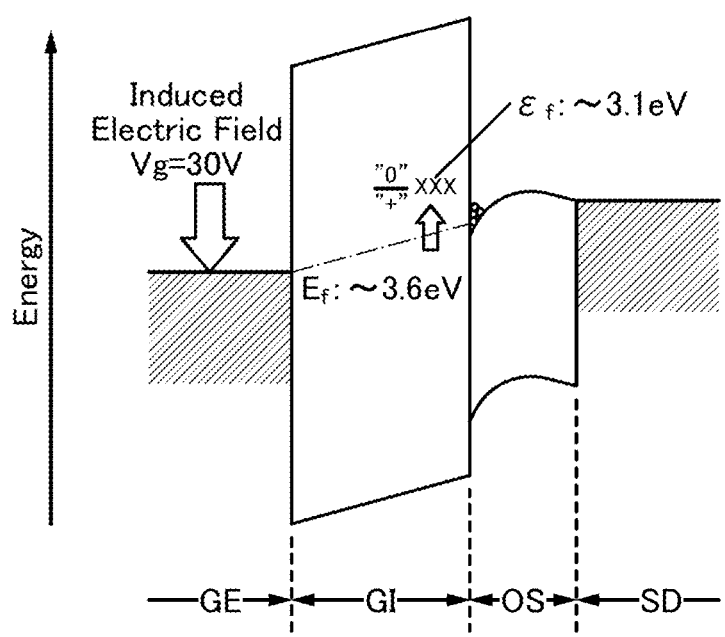
FIG. 60 is an energy band diagram of a transistor including an oxide semiconductor in a semiconductor layer in which a channel is formed.

The use of the substantially intrinsic oxide semiconductor may improve the reliability of a transistor. Here, the reason for the improvement in the reliability of an OS transistor is described with reference to FIG. 60. FIG. 60 is an energy band diagram of the OS transistor.

In FIG. 60, GE stands for a gate electrode, GI stands for a gate insulating film, OS stands for an oxide semiconductor, and SD stands for a source electrode or a drain electrode. In other words, FIG. 60 shows an example of energy bands of the gate electrode, the gate insulating film, the oxide semiconductor, and the source/drain electrode in contact with the oxide semiconductor.

In FIG. 60, a silicon oxide film is used as the gate insulating film, and an In—Ga—Zn oxide is used for the oxide semiconductor. The transition level ($\in_f$) of a defect that might be formed in the silicon oxide film is assumed to be formed at a position approximately 3.1 eV away from the conduction band minimum of the gate insulating film. Furthermore, the Fermi level ($E_f$) of the silicon oxide film at the interface between the oxide semiconductor and the silicon oxide film when the gate voltage ($V_g$) is 30 V is assumed to be formed at a position approximately 3.6 eV away from the conduction band minimum of the gate insulating film. Note that the Fermi level of the silicon oxide film varies depending on the gate voltage. For example, the Fermi level ($E_f$) of the silicon oxide film at the interface between the oxide semiconductor and the silicon oxide film is lowered as the gate voltage is increased. In FIG. 60, hollow circles indicate electrons (carriers), and symbols "X" indicate defect states in the silicon oxide film.

As shown in FIG. 60, when thermal excitation of carriers occurs during the application of a gate voltage, the carriers are trapped by the defect states (X in the diagram) and the charge state of the defect states is changed from positive ("+") to neutral ("0"). Specifically, in the case where the value obtained by adding the thermal excitation energy to the Fermi level ($E_f$) of the silicon oxide film becomes greater than transition level ($\in_f$) of the defect, the charge state of the defect states in the silicon oxide film is changed from positive to neutral, and the threshold voltage of the transistor is positively shifted.

When an oxide semiconductor with a different electron affinity is used, the Fermi level of the interface between the gate insulating film and the oxide semiconductor might be changed. When an oxide semiconductor with a greater electron affinity is used, the conduction band minimum of the gate insulating film is relatively high at the interface between the gate insulating film and the oxide semiconductor or in the vicinity of the interface. In that case, the defect states (X in FIG. 60) that can be formed in the gate insulating film are also located in a relatively high position; thus, the energy difference between the Fermi level of the gate insulating film and the Fermi level of the oxide semiconductor film is increased. This results in less charge trapped in the gate insulating film. For example, a change in the charge states of the defect states that can be formed in the silicon oxide film is smaller; thus, a change in the threshold voltage of the transistor due to gate bias temperature (GBT) stress can be smaller.

This embodiment can be implemented in appropriate combination with any of the structures described in the other embodiments and the like.

Embodiment 5

In this embodiment, a deposition apparatus (sputtering apparatus) including a deposition chamber in which a sputtering target can be placed is described below. The deposition apparatus described in this embodiment can be used as a parallel-plate-type sputtering apparatus, a facing-targets sputtering apparatus, or the like.

Deposition using a facing-targets sputtering apparatus causes less damage to a formation surface and thus facilitates the formation of a film with high crystallinity. For this reason, a facing-targets sputtering apparatus is preferably used for the deposition of a CAAC-OS or the like in some cases.

Note that a deposition method using a parallel-plate-type sputtering apparatus can also be referred to as parallel electrode sputtering (PESP), and a deposition method using a facing-targets sputtering apparatus can also be referred to as vapor deposition sputtering (VDSP).

First, a structure of a deposition apparatus that hardly allows the entry of impurities into a film during deposition or the like is described with reference to FIG. 61 and FIGS. 62A to 62C.

Figure 61:
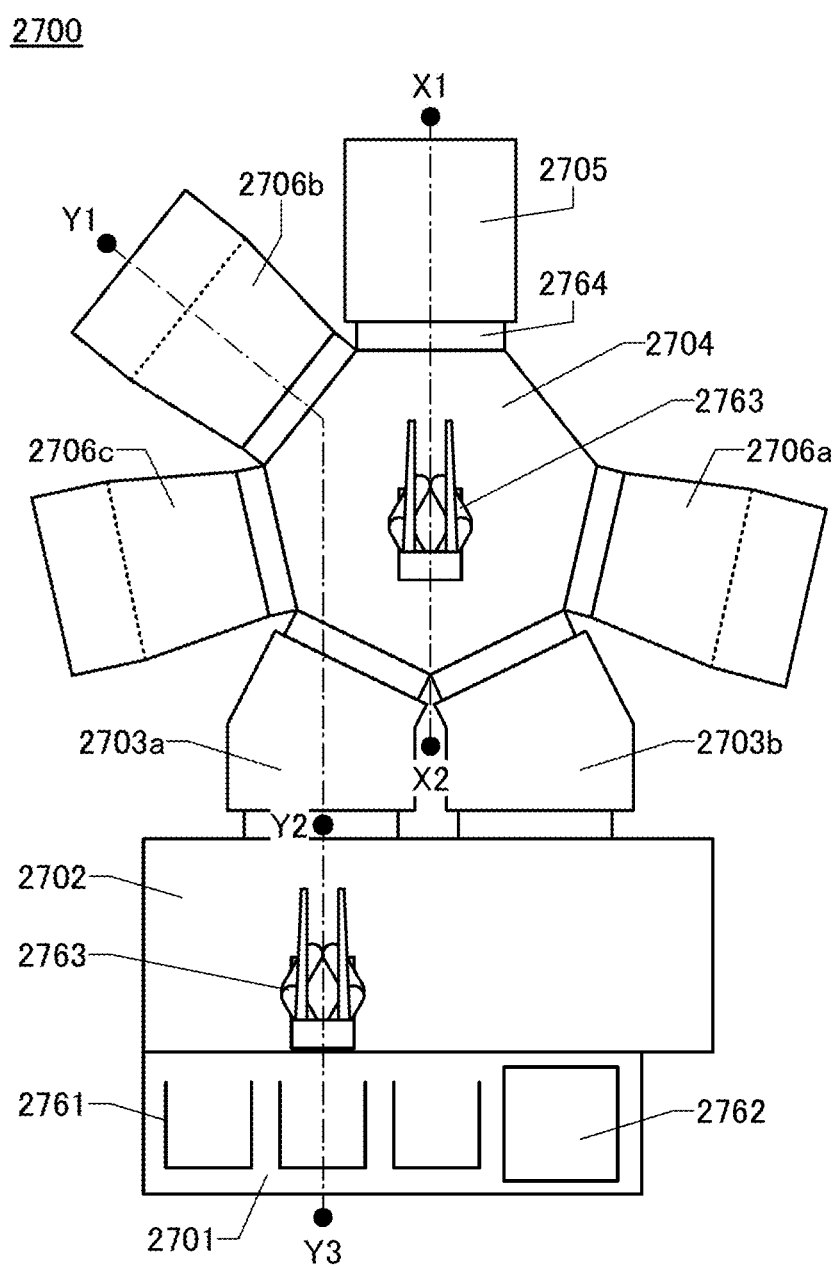
FIG. 61 illustrates an example of a deposition apparatus.

FIG. 61 is a schematic top view of a single wafer multi-chamber deposition apparatus 2700. The single wafer multi-chamber deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of which a target is placed for deposition. Note that for the deposition chambers 2706a, 2706b, and 2706c, the structure of a deposition chamber that is described later can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate transfer chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, and the like can be freely determined. Note that the number of transfer chambers, the number of deposition chambers, the number of load lock chambers, the number of unload lock chambers, and the number of substrate heating chambers are not limited to the above, and the number of each of the chambers can be set as appropriate depending on the space for installation or the process conditions.

Figure 62A:
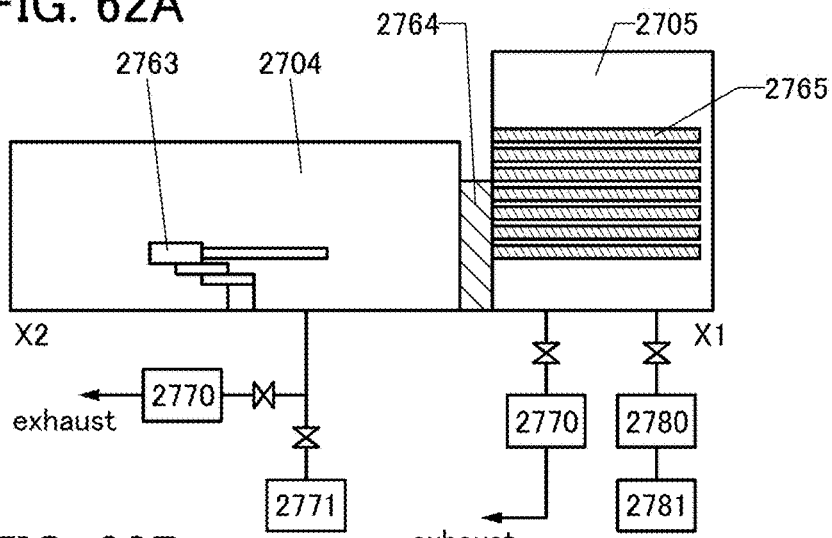
FIGS. 62A to 62C illustrate an example of a deposition apparatus.
Figure 62B:
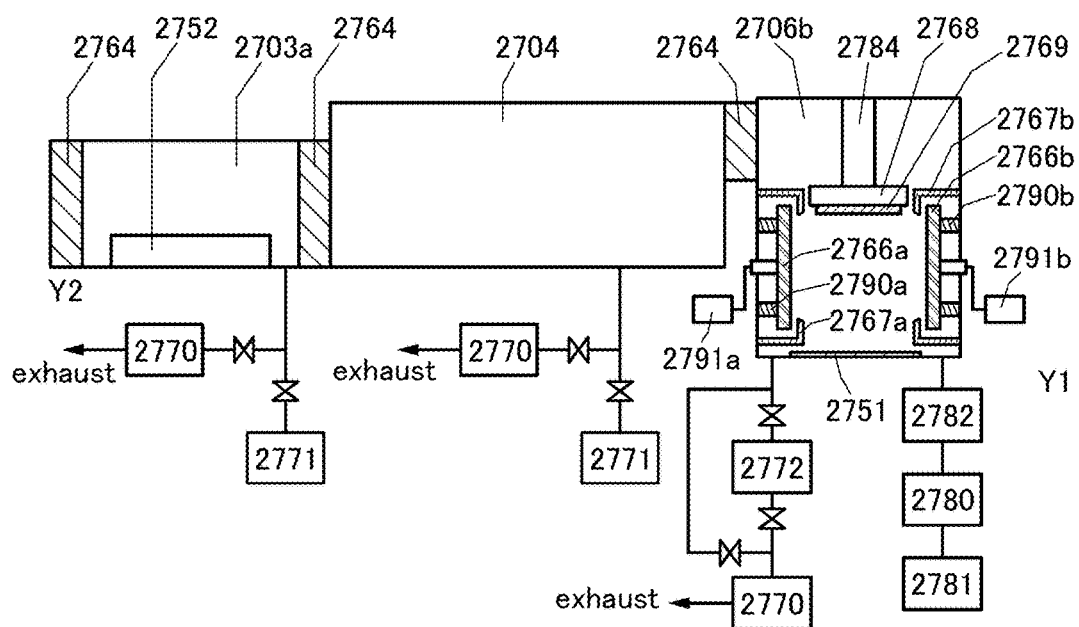
Figure 62C:
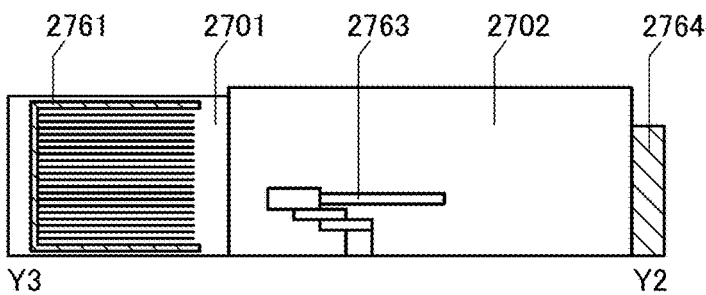

Next, FIG. 62A, FIG. 62B, and FIG. 62C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 61.

FIG. 62A illustrates a cross section of the substrate heating chamber 2705 and the transfer chamber 2704, and the substrate heating chamber 2705 includes a plurality of heating stages 2765 that can hold a substrate. Note that the substrate heating chamber 2705 is connected to a vacuum pump 2770 through a valve. As the vacuum pump 2770, a dry pump and a mechanical booster pump can be used, for example.

As a heating mechanism that can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. LRTA is a method for heating an object by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are illustrated for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 from the atmospheric pressure to low or medium vacuum (approximately 0.1 Pa to several hundred pascals) and then the valves are switched and exhaust is performed using the cryopump 2771 from the medium vacuum to high or ultra-high vacuum (approximately 0.1 Pa to $1 \times 10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in a cryopump. When molecules (or atoms) are entrapped too much in a cryopump, the exhaust capability of the cryopump is lowered; therefore, regeneration is performed regularly.

FIG. 62B illustrates a cross section of the deposition chamber 2706b, the transfer chamber 2704, and the load lock chamber 2703a.

Figure 63A:
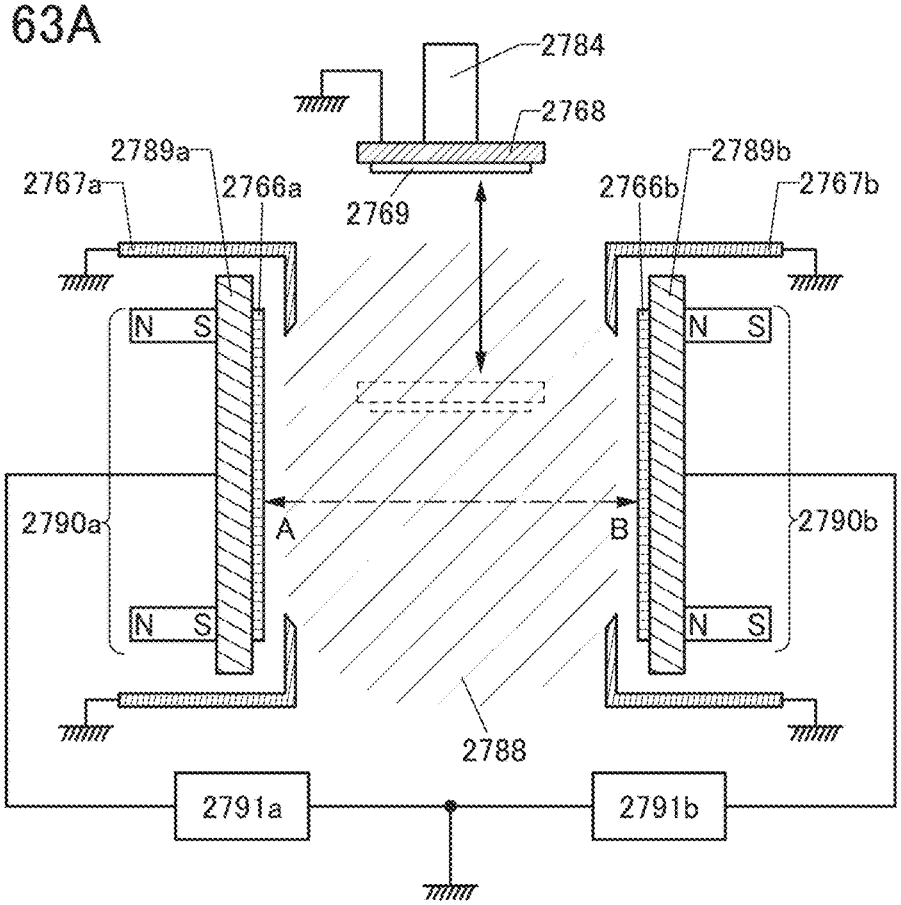
FIGS. 63A to 63C illustrate an example of a deposition apparatus.

Here, the details of the deposition chamber (sputtering chamber) are described with reference to FIG. 62B and FIGS. 63A to 63C. FIG. 63A illustrates the inside of the deposition chamber 2706b. The deposition chamber 2706b includes a target 2766a, a target 2766b, a target shield 2767a, a target shield 2767b, a magnet unit 2790a, a magnet unit 2790b, a substrate holder 2768, a power source 2791a, and a power source 2791b. The target 2766a is provided on a backing plate 2789a (not illustrated in FIG. 62B). The target 2766b is provided on a backing plate 2789b (not illustrated in FIG. 62B). The power source 2791a is electrically connected to the target 2766a, and the power source 2791b is electrically connected to the target 2766b. The magnet unit 2790a is provided on a back side of the target 2766a with the backing plate 2789a positioned therebetween. The magnet unit 2790b is provided on a back side of the target 2766b with the backing plate 2789b positioned therebetween. The target shield 2767a is provided so as to surround an end portion of the target 2766a and the target shield 2767b is provided so as to surround an end portion of target 2766b.

As the power sources 2791a and 2791b, an RF power source, a DC power source, an AC power source, or the like can be used. The power sources 2791a and 2791b may be different kinds of power sources.

Figure 63B:
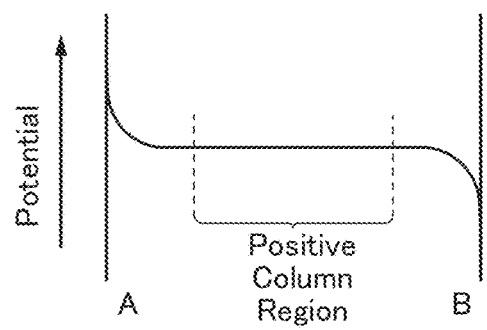
Figure 63C:
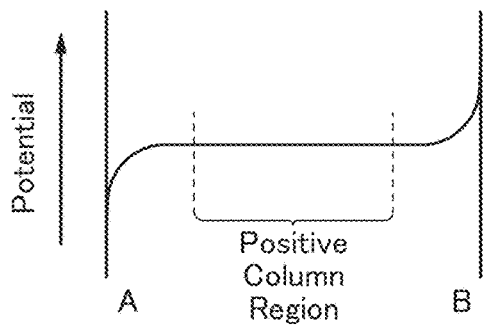

FIGS. 63B and 63C each show potential distribution of the plasma 2788 along dashed-dotted line A-B in FIG. 63A. FIG. 63B shows the potential distribution when a high potential is applied to the backing plate 2789a and a low potential is applied to the backing plate 2789b. In that case, a cation is accelerated toward the target 2766b. FIG. 63C shows the potential distribution when a low potential is applied to the backing plate 2789a and a high potential is applied to the backing plate 2789b. In that case, a cation is accelerated toward the target 2766a. To deposit the oxide semiconductor of one embodiment of the present invention, the state in FIG. 63B and the state in FIG. 63C are alternated.

Note that a substrate 2769 is supported by the substrate holder 2768. The substrate holder 2768 is preferably connected to GND. The substrate holder 2768 may be in a floating state. The substrate holder 2768 is fixed to the deposition chamber 2706b by a movable member 2784. Owing to the movable member 2784, the substrate holder 2768 can move to a region between the targets 2766a and 2766b (a region between targets).

Providing the substrate holder 2768 supporting the substrate 2769 in the region between targets can reduce damage due to plasma in some cases, for example. It is particularly preferable that the substrate holder 2768 and the substrate 2769 be placed in a positive column of the plasma 2788. The positive column of the plasma 2788 is, in each of FIGS. 63B and 63C, a region around the midpoint of A and B where the gradient of the potential distribution is small. When the substrate 2769 is placed in the positive column of the plasma 2788, the substrate 2769 is not exposed to a high electric field portion in the plasma 2788; thus, damage to the plasma 2788 can be reduced.

The substrate holder 2768 and the substrate 2769 may be placed outside the plasma 2788. In that case, the surface of the substrate 2769 is not exposed to a high electric field region of the plasma 2788; thus, damage due to the plasma 2788 can be reduced. Note that the utilization efficiencies of the targets 2766a and 2766b are decreased as the distance between the plasma 2788 and the substrate 2769 is increased.

The substrate holder 2768 may include a substrate holding mechanism that holds the substrate 2769, a heater that heats the substrate 2769 from the back side, or the like.

The target shield 2767a can suppress deposition of particles sputtered from the target 2766a on a region where deposition is not needed. Moreover, the target shield 2767b can suppress deposition of particles sputtered from the target 2766b on a region where deposition is not needed. The target shields 2767a and 2767b are preferably processed to prevent accumulated sputtered particles from being separated. For example, blasting treatment that increases surface roughness may be performed, or roughness may be formed on the surfaces of the target shields 2767a and 2767b.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas that is introduced to the deposition chamber 2706b can be heated to a temperature higher than or equal to 40° C. and lower than or equal to 400° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are illustrated for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism that can adsorb a molecule (or an atom) having a relatively high melting point, such as water. The turbo molecular pump 2772 is capable of stably removing a large-sized molecule (or atom), needs low frequency of maintenance, and thus enables high productivity; on the other hand, it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b that are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b, which are described above, preferably have a small amount of external leakage or internal leakage.

For example, in each of the transfer chamber 2704, the substrate heating chamber 2705, and the deposition chamber 2706b, which are described above, the leakage rate is less than or equal to $3\times10^{-6}$ Pa·m$^3$/s, preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket achieves higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface roughness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range from 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen, which is a main component of the oxide, is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range from 1 minute to 300 minutes, preferably from 5 minutes to 120 minutes. After that, the inside of the deposition chamber is evacuated in the time range from 5 minutes to 300 minutes, preferably from 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of a deposition chamber so that impurities in the deposition chamber and an adsorbed substance on the inner wall of the deposition chamber are confined in the film. As the dummy substrate, a substrate that releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 62B and the atmosphere-side substrate transfer chamber 2702 and the atmosphere-side substrate supply chamber 2701 illustrated in FIG. 62C are described. Note that FIG. 62C illustrates a cross section of the atmosphere-side substrate transfer chamber 2702 and the atmosphere-side substrate supply chamber 2701.

For the transfer chamber 2704 illustrated in FIG. 62B, the description of the transfer chamber 2704 illustrated in FIG. 62A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 61 can have a structure similar to that of the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might expand gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and an excellent heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide from which zinc is unlikely to be volatilized can be obtained.

The above-described deposition apparatus enables deposition of an oxide semiconductor whose hydrogen concentration measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

Furthermore, an oxide semiconductor whose nitrogen concentration measured by SIMS is lower than $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$ can be deposited.

Moreover, an oxide semiconductor whose carbon concentration measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ can be deposited.

Furthermore, an oxide semiconductor can be deposited of which the released amount of each of the following gas molecules (atoms) measured by TDS is less than or equal to $1 \times 10^{19}$/cm$^3$, preferably less than or equal to $1 \times 10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact therewith can be suppressed.

This embodiment can be implemented in an appropriate combination with any of the structures described in the other embodiments and the like.

This application is based on Japanese Patent Application serial no. 2016-061869 filed with Japan Patent Office on Mar. 25, 2016, the entire contents of which are hereby incorporated by reference.

What is claimed is:
1. A transistor comprising:
a wiring;
a first electrode comprising a region overlapping with the wiring;
a second electrode;
a third electrode;
a fourth electrode;
a first semiconductor layer;
a second semiconductor layer comprising a region overlapping with the first semiconductor layer, the second semiconductor layer comprising a first region, a second region, and a third region, wherein the third region is sandwiched between the first region and the second region;
a third semiconductor layer;
a first layer comprising a region overlapping with the second electrode in the region overlapping with the first region;
a second layer comprising a region overlapping with the third electrode in the region overlapping with the second region;
a first insulating layer comprising a region overlapping with the wiring;

a second insulating layer comprising a region overlapping with the first electrode and a region overlapping with the first insulating layer; and a third insulating layer, wherein the first semiconductor layer comprises a region overlapping with the second insulating layer, wherein the second electrode comprises a region overlapping with the first region, wherein the third electrode comprises a region overlapping with the second region, wherein the third semiconductor layer comprises a region overlapping with the first layer, a region overlapping with the second layer, and a region overlapping with the third region, and wherein the fourth electrode comprises a region overlapping with the third region with the third insulating layer located between the fourth electrode and the third region.

2. The transistor according to claim 1, wherein the first semiconductor layer, the second semiconductor layer, and the third semiconductor layer each comprise an oxide semiconductor.

3. The transistor according to claim 1, wherein the first layer and the second layer each comprise an oxide semiconductor.

4. The transistor according to claim 1, wherein the first electrode, the second electrode, the third electrode, and the fourth electrode are configured to function as a back gate, a source electrode, a drain electrode, and a gate electrode, respectively; and the third insulating layer is configured to function as a gate insulating layer.

5. The transistor according to claim 1, wherein a channel is formed in the third region.

6. The transistor according to claim 1, wherein at least one of the first insulating layer and the second insulating layer comprises excess oxygen.

7. The transistor according to claim 1, wherein the wiring is located below the first electrode.

8. The transistor according to claim 1, wherein the first layer is located between the second electrode and the third semiconductor layer, and the second layer is located between the third electrode and the third semiconductor layer.

9. An electronic device comprising:
the transistor according to claim 1; and
an antenna, a battery, an operation switch, a microphone, or a speaker.

10. A transistor comprising:
a second insulating layer;
a fourth insulating layer;
a fourth semiconductor layer comprising a region overlapping with the second insulating layer, the fourth semiconductor layer comprising a fourth region, a fifth region, and a sixth region, wherein the sixth region is located between the fourth region and the fifth region;
a fifth electrode penetrating the fourth semiconductor layer and the fourth insulating layer in a region overlapping with the fourth region, the fifth electrode comprising a region electrically connected to the fourth semiconductor layer;
a sixth electrode penetrating the fourth semiconductor layer and the fourth insulating layer in a region overlapping with the fifth region, the sixth electrode comprising a region electrically connected to the fourth semiconductor layer; and
a seventh electrode comprising a region overlapping with the sixth region with the fourth insulating layer located between the seventh electrode and the sixth region,
wherein the fourth insulating layer comprises a region overlapping with the fourth semiconductor layer.

11. The transistor according to claim 10, wherein the fourth semiconductor layer comprises an oxide semiconductor.

12. The transistor according to claim 10, wherein the fifth electrode, the sixth electrode, and the seventh electrode are configured to function as a source electrode, a drain electrode, and a gate electrode, respectively; and the fourth insulating layer is configured to function as a gate insulating layer.

13. The transistor according to claim 10, wherein a channel is formed in the sixth region.

14. The transistor according to claim 10, wherein the second insulating layer comprises excess oxygen.

15. An electronic device comprising:
the transistor according to claim 10; and
an antenna, a battery, an operation switch, a microphone, or a speaker.

16. A semiconductor device comprising:
the transistor according to claim 1; and
the transistor according to claim 10.

17. The semiconductor device according to claim 16, wherein a threshold voltage of the transistor according to claim 1 is lower than a threshold voltage of the transistor according to claim 10 when the potential of the first electrode is the same as the potential of the fourth electrode.

18. The semiconductor device according to claim 16, wherein an electron affinity of the fourth semiconductor layer is lower than an electron affinity of the second semiconductor layer.

19. An electronic device comprising:
the semiconductor device according to claim 16; and
an antenna, a battery, an operation switch, a microphone, or a speaker.

* * * * *